(12) United States Patent
Yamazaki et al.

(10) Patent No.: US 9,583,601 B2
(45) Date of Patent: Feb. 28, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yasutaka Nakazawa, Tochigi (JP); Masami Jintyou, Shimotsuga (JP); Junichi Koezuka, Tochigi (JP); Kenichi Okazaki, Tochigi (JP); Takuya Hirohashi, Atsugi (JP); Shunsuke Adachi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/002,826

(22) Filed: Jan. 21, 2016

(65) Prior Publication Data

US 2016/0141397 A1    May 19, 2016

Related U.S. Application Data

(62) Division of application No. 14/090,244, filed on Nov. 26, 2013, now Pat. No. 9,246,011.

(30) Foreign Application Priority Data

| Nov. 30, 2012 | (JP) | 2012-263814 |
| Dec. 14, 2012 | (JP) | 2012-273866 |
| Mar. 7, 2013 | (JP) | 2013-044876 |

(51) Int. Cl.
*H01L 29/786* (2006.01)
*H01L 29/66* (2006.01)
(Continued)

(52) U.S. Cl.
CPC .... *H01L 29/66969* (2013.01); *H01L 21/3213* (2013.01); *H01L 21/32051* (2013.01);
(Continued)

(58) Field of Classification Search
USPC .............................. 438/104, 160; 257/43, 71
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Tokumaru.R et al., "Recognition of Existence of n-type IGZO Layer in CAAC-IGZO Film under Source and Drain Electrode Made of Tungsten", SID Digest '13 : SID International Symposium Digest of Technical Papers, 2013, pp. 1022-1025.

(Continued)

*Primary Examiner* — Dung Le
(74) *Attorney, Agent, or Firm* — Robinson Intellectual Property Law Office; Eric J. Robinson

(57) ABSTRACT

A method for manufacturing a semiconductor device including a transistor with stable electrical characteristics or high reliability is provided. A gate insulating film is formed over a gate electrode; an oxide semiconductor layer is formed over the gate insulating film; an oxide layer is formed over the oxide semiconductor layer to form a stacked-layer oxide film including the oxide semiconductor layer and the oxide layer; the stacked-layer oxide film is processed into a predetermined shape; a conductive film containing Ti is (Continued)

formed over the stacked-layer oxide film; the conductive film is etched to form source and drain electrodes; and regions in the oxide layer in contact with the source and drain electrodes are heat treated so as to have a low resistivity.

20 Claims, 48 Drawing Sheets

(51) Int. Cl.
    *H01L 21/3205*     (2006.01)
    *H01L 21/3213*     (2006.01)
    *H01L 21/473*     (2006.01)
    *H01L 21/4757*     (2006.01)

(52) U.S. Cl.
    CPC ........ *H01L 21/473* (2013.01); *H01L 21/4757* (2013.01); *H01L 29/7869* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,207,014 B2 | 6/2012 | Sasaki et al. |
| 8,274,078 B2 | 9/2012 | Itagaki et al. |
| 8,378,351 B2 | 2/2013 | Fukumoto et al. |
| 8,488,077 B2 | 7/2013 | Yamazaki et al. |
| 8,492,756 B2 | 7/2013 | Sakata et al. |
| 8,492,759 B2 * | 7/2013 | Akimoto ............. H01L 29/7869 |
| | | | 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0105164 A1 * | 4/2010 | Ito ..................... H01L 27/1214 |
| | | | 438/104 |
| 2010/0109002 A1 | 5/2010 | Itagaki et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2013/0023087 A1 | 1/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| JP | 2000-150900 A | 5/2000 |
|---|---|---|
| JP | 2002-076356 A | 3/2002 |
| JP | 2002-289859 A | 10/2002 |
| JP | 2003-086010 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-222767 A | 11/2011 |
| JP | 2012-160679 A | 8/2012 |
| WO | WO-2004/114391 | 12/2004 |
| WO | WO-2008/133345 | 11/2008 |

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D at al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

(56) References Cited

OTHER PUBLICATIONS

Park,J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H at al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1873-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proccedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] At Temperatures Over 1000 °C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K at al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

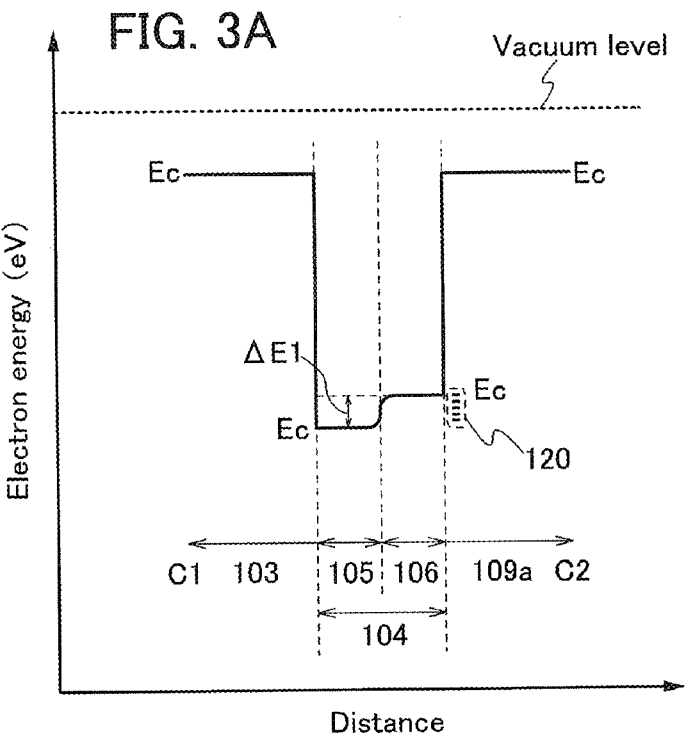
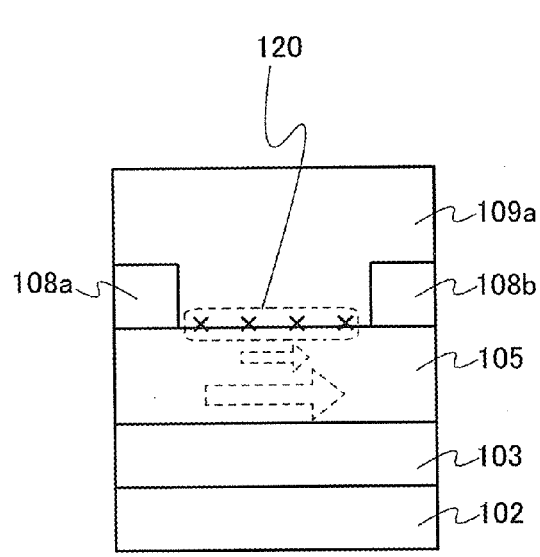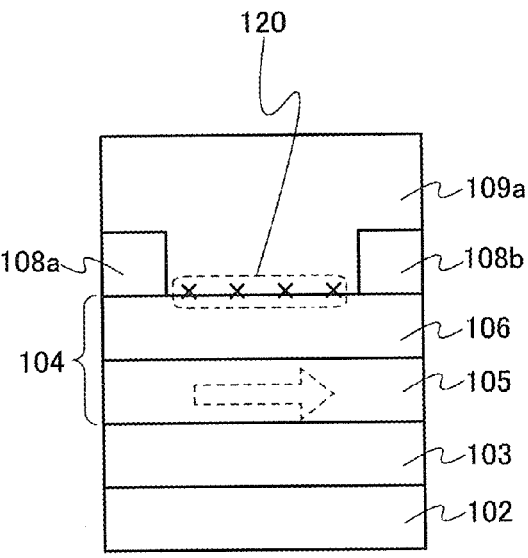

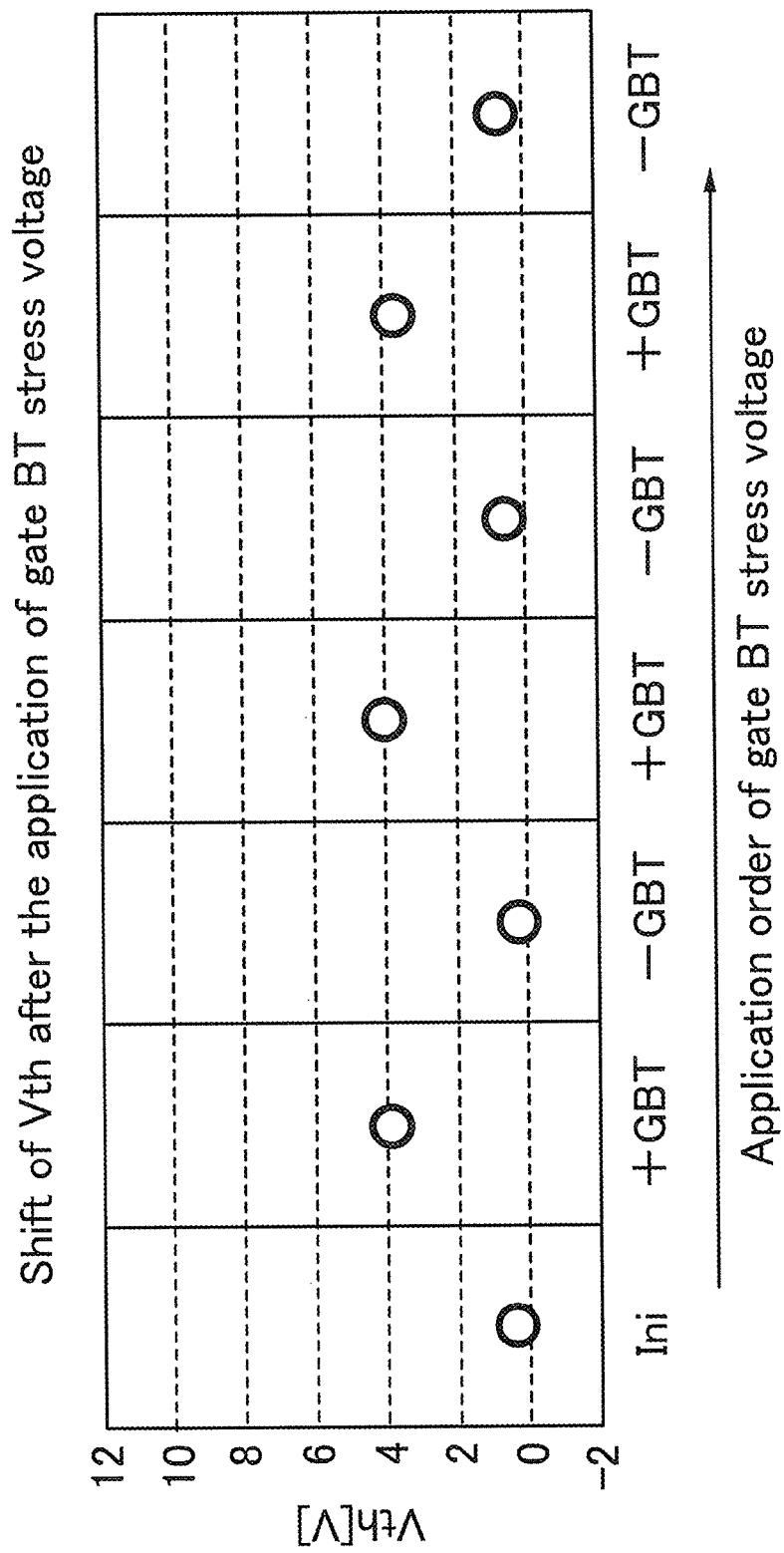

When not touched

Input voltage waveform

Output current waveform

When touched

Input voltage waveform

Output current waveform

Writing period

Detection period

IGZO(111)\Conductive layer

IGZO(132)\Conductive layer

IGZO(132)\Conductive layer

IGZO(111)\Conductive layer

L/W = 6 μm/50 μm

L/W = 3 μm/50 μm

METHOD FOR MANUFACTURING SEMICONDUCTOR DEVICE

This application is a Divisional of U.S. application Ser. No. 14/090,244 filed Nov. 26, 2013, now U.S. Pat. No. 9,246,011. This application also claims priority to Japanese Application Serial Nos. 2012-263814 filed Nov. 30, 2012; 2012-273866 filed Dec. 14, 2012 and 2013-044876 filed Mar. 7, 2013.

BACKGROUND OF THE INVENTION

1. Field of the Invention

The present invention relates to an object, a process (including a method and a manufacturing method), a machine, a manufacture, or a composition of matter. In particular, the present invention relates to, for example, a semiconductor device, a display device, a light-emitting device, a driving method thereof, or a manufacturing method thereof. The present invention particularly relates to a semiconductor device, a display device, a light-emitting device, or the like each including an oxide semiconductor.

In this specification, a semiconductor device generally means a device which can function by utilizing electronic characteristics of a semiconductor, and an electrooptic device, a semiconductor circuit, and electric equipment are all included in the category of semiconductor devices.

2. Description of the Related Art

Semiconductor elements, for example, transistors formed using a semiconductor thin film which is formed over a substrate having an insulating surface such as a glass substrate (such transistors are also referred to as thin film transistors or TFTs for the abbreviation) and diodes, are applied to a wide range of semiconductor devices such as integrated circuits (ICs) and image display devices (simply also referred to as display devices). A silicon film is widely known as a semiconductor thin film applicable to such a semiconductor element.

For example, however, a transistor including amorphous silicon has low field-effect mobility, though it can be formed over a larger glass substrate and therefore can be manufactured at low cost. In contrast, a transistor including polycrystalline silicon has high field-effect mobility, but requires a crystallization process such as laser annealing and a large number of manufacturing steps and is not always suitable for a larger glass substrate.

Meanwhile, oxide semiconductors have attracted attention in recent years as novel semiconductor materials. Examples of oxide semiconductors include zinc oxide (ZnO), an In—Ga—Zn oxide, and the like. Techniques are under development to manufacture a transistor including a semiconductor thin film formed using such an oxide semiconductor as a material for a channel formation region (see Patent Document 1).

The use of an oxide semiconductor for a channel formation region makes it possible to manufacture a transistor which has both high field-effect mobility comparable to that obtained with polysilicon or microcrystalline silicon and uniform element characteristics comparable to those obtained with amorphous silicon. Since the transistor has high field-effect mobility, in the case where this is used, for example, in a display device, the transistor can have sufficient on-state current even when having a small area. Thus, an increase in aperture ratio of a pixel and/or a reduction of power consumption of a display device due to the increase can be achieved. An oxide semiconductor film can be formed using a sputtering method and is thus suitable for manufacturing a semiconductor device over a large-area substrate. Manufacturing a semiconductor device over a large-area substrate can reduce the manufacturing cost of the semiconductor device. There is another advantage that capital investment can be reduced because part of production equipment for a transistor including an amorphous silicon film can be retrofitted and utilized.

However, it is known that oxygen is released from an oxide semiconductor in a manufacturing process, so that an oxygen vacancy is formed (see Patent Document 2).

REFERENCE

Patent Document

[Patent Document 1] Japanese Published Patent Application No. 2007-123861
[Patent Document 2] Japanese Published Patent Application No. 2011-222767

SUMMARY OF THE INVENTION

In the case where a transistor is formed using an oxide semiconductor for a channel formation region, an oxygen vacancy (also referred to as Vo in this specification) which is formed in the oxide semiconductor affects the transistor characteristics as a problem. Further, a carrier might be generated due to oxygen vacancies in the oxide semiconductor. Therefore, a large number of oxygen vacancies in the oxide semiconductor sometimes leads to generation of an electron serving as a carrier; accordingly, the channel formation region is changed to an n-type (e.g., n) and therefore the resistance is reduced. This induces degraded electrical characteristics of the transistor, such as normally-on characteristics, an increase of a leakage current, and a shift of a threshold voltage by application of stress. Thus, fewer oxygen vacancies in the channel formation region of the oxide semiconductor are preferable.

Thus, it is an object of one embodiment of the present invention to provide a semiconductor device including a transistor having a reduced number of oxygen vacancies in a channel formation region of an oxide semiconductor, stable electrical characteristics, or high reliability.

In particular, an object of one embodiment of the present invention is to provide a semiconductor device including a transistor in which a change in gate voltage-drain current characteristics by application of a drain voltage is reduced or suppressed.

Another object of one embodiment of the present invention is to provide a semiconductor device including a miniaturized transistor with a short channel length (e.g., the channel length of less than or equal to 3 μm).

Another object of one embodiment of the present invention is to provide a semiconductor device with low power consumption.

Another object of one embodiment of the present invention is to provide a method for manufacturing a semiconductor device by which one of the above-described objects is achieved.

In particular, it is another object of one embodiment of the present invention to provide a method for manufacturing a semiconductor device with high productivity or a high yield.

Alternatively, it is another object of one embodiment of the present invention to provide a semiconductor device which is less likely to be normally on. It is another object of one embodiment of the present invention to provide a semiconductor device in which leakage current is less likely to be increased. It is another object of one embodiment of the present invention to provide a semiconductor device in which a threshold voltage is less likely to be changed. It is another object of one embodiment of the present invention to provide a semiconductor device which is less likely to be affected by short-channel effect. It is another object of one embodiment of the present invention to provide a semiconductor device in which a source region and a drain region are less likely to be short-circuited. It is another object of one embodiment of the present invention to provide a semiconductor device which is less likely to be affected by a variation in channel length.

One embodiment of the present invention can achieve at least one of the objects set forth above. Note that in one embodiment of the present invention, there is no need to achieve all the objects. Other objects will be apparent from and can be derived from the description of the specification, the drawings, the claims, and the like.

Thus, embodiments of the present invention are a semiconductor device including a transistor in which a region of an oxide semiconductor where there are a few oxygen vacancies is partly used as a channel formation region, and a method for manufacturing the semiconductor device.

That is, one embodiment of the present invention is a semiconductor device including a gate electrode, a gate insulating film overlapping with the gate electrode, a stacked-layer oxide film overlapping with the gate electrode with the gate insulating film provided therebetween, and a source electrode and a drain electrode in contact with the stacked-layer oxide film. Portions of the stacked-layer oxide film which are in contact with the source electrode and the drain electrode have lowest resistance, and a portion of the stacked-layer oxide film has higher resistance as the portion is distanced from the source electrode or the drain electrode.

Another embodiment of the present invention is a semiconductor device including a gate electrode, a gate insulating film overlapping with the gate electrode, a stacked-layer oxide film overlapping with the gate electrode with the gate insulating film provided therebetween, and a source electrode and a drain electrode in contact with the stacked-layer oxide film. The stacked-layer oxide film has a depression portion between the source electrode and the drain electrode and has low-resistance regions in portions in contact with the source electrode and the drain electrode and part of side surfaces of the depression portion.

Another embodiment of the present invention is a semiconductor device including a gate electrode, a gate insulating film over the gate electrode, a stacked-layer oxide film over the gate insulating film, a source electrode and a drain electrode in contact with the stacked-layer oxide film, and n$^+$ regions provided in portions of the stacked-layer oxide film which are in contact with the source electrode and the drain electrode. The n$^+$ regions are extended in a region of the stacked-layer oxide film which is between the source electrode and the drain electrode.

Another embodiment of the present invention is a semiconductor device including a gate electrode, a gate insulating film over the gate electrode, a stacked-layer oxide film over the gate insulating film, a source electrode and a drain electrode in contact with the stacked-layer oxide film, and n$^+$ regions provided in portions of the stacked-layer oxide film which are in contact with the source electrode and the drain electrode. The stacked-layer oxide film has a depression portion between the source electrode and the drain electrode, and the n$^+$ regions are in contact with part of side surfaces of the depression portion.

Another embodiment of the present invention is a method for manufacturing a semiconductor device including the steps of forming a gate insulating film over a gate electrode; forming an oxide semiconductor layer over the gate insulating film which is over the gate electrode; forming an oxide layer over the oxide semiconductor layer by a sputtering method to form an stacked-layer oxide film including the oxide semiconductor layer and the oxide layer; processing the stacked-layer oxide film into a predetermined shape; forming a conductive film containing Ti as a main component in contact with the stacked-layer oxide film which is processed into a predetermined shape; etching the conductive film to form a source electrode and a drain electrode, and a depression portion on a back channel side; and changing portions of the stacked-layer oxide film which are in contact with the source electrode and the drain electrode each to an n-type by heat treatment.

The oxide semiconductor layer and the oxide layer are each an oxide containing In (indium), M (Al, Ga, Y, La, Ce, or Nd), and Zn (zinc), and the oxide layer has a proportion of M higher than that of the oxide semiconductor layer.

According to one embodiment of the present invention, a semiconductor device including a transistor having stable electrical characteristics or high reliability can be provided.

In particular, according to one embodiment of the present invention, it is possible to provide a semiconductor device including a transistor in which a change in gate voltage-drain current characteristics by application of a drain voltage is reduced or suppressed.

According to one embodiment of the present invention, it is possible to provide a semiconductor device including a miniaturized transistor with a short channel length (e.g., the channel length of less than or equal to 3 µm).

According to one embodiment of the present invention, it is possible to provide a semiconductor device with low power consumption.

According to one embodiment of the present invention, it is possible to provide a method for manufacturing a semiconductor device by which one of the above-described objects is achieved.

According to one embodiment of the present invention, it is possible to provide a method for manufacturing a semiconductor device with high productivity or a high yield.

BRIEF DESCRIPTION OF THE DRAWINGS

In the accompanying drawings:

FIGS. 3A to 3C are diagrams showing a band structure of a transistor;

FIG. 7 shows a change of electrical characteristics of a transistor including an oxide semiconductor layer;

DETAILED DESCRIPTION OF THE INVENTION

Figure 1A:
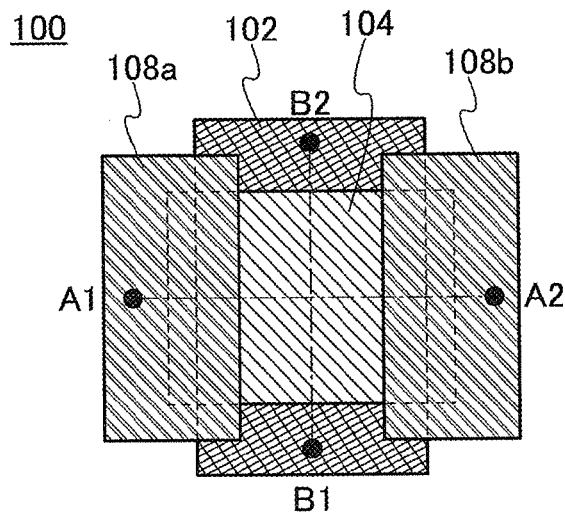
FIGS. 1A to 1C are a top view and cross-sectional views illustrating one embodiment of a transistor.

Embodiments of the present invention will be described in detail below with reference to the drawings.

However, the present invention is not limited to the descriptions of the embodiments, and it is easily understood by those skilled in the art that the modes can be modified in various ways. Therefore, the present invention should not be interpreted as being limited to the descriptions of embodiment below.

Note that in drawings used in this specification, the thicknesses of films, layers, and substrates and the sizes of components (e.g., the sizes of regions) are in some cases exaggerated for simplicity. Therefore, the sizes of the components are not limited to the sizes in the drawings and relative sizes between the components.

Note that the ordinal numbers such as "first" and "second" in this specification and the like are used for convenience and do not denote the order of steps, the stacking order of layers, or the like. In addition, the ordinal numbers in this specification and the like do not denote particular names which specify the present invention.

Note that in structures of the present invention described in this specification and the like, the same portions or portions having similar functions are denoted by common reference numerals in different drawings, and descriptions thereof are not repeated. Further, the same hatching pattern is applied to portions having similar functions, and the portions are not especially denoted by reference numerals in some cases.

Note that a resist mask or the like might be reduced unintentionally by treatment such as etching in an actual manufacturing process; however, the reduction is not illustrated in drawings in some cases for easy understanding.

Note that the term such as "over" or "below" in this specification and the like does not necessarily mean that a component is placed "directly on" or "directly under" another component. For example, the expression "a gate electrode over a gate insulating layer" can mean the case where there is an additional component between the gate insulating layer and the gate electrode.

Note that a voltage refers to a potential difference between a certain potential and a reference potential (e.g., a ground potential (GND) or a source potential) in many cases. Accordingly, a voltage can also be called a potential.

In addition, in this specification and the like, the term "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Further, there is a case in which no physical connection is made in an actual circuit and a wiring is just extended.

Examples of an "object having any electric function" are a switching element such as a transistor, a resistor, an inductor, a capacitor, and an element with a variety of functions as well as an electrode and a wiring.

The descriptions in this embodiment can be combined with each other as appropriate.

[1. Deterioration Mechanism of Transistor Including Oxide Semiconductor Layer]

In order to improve reliability of a transistor including an oxide semiconductor (OS) layer, it is important to clarify a factor that affects the reliability. Here, in order to improve the reliability of the transistor including an oxide semiconductor layer, the deterioration mechanism model described below was made.

Note that an oxygen vacancy (Vo) of the oxide semiconductor layer forms a deep level density of state (DOS) in the oxide semiconductor layer. In order to reduce the deep level DOS, it is important to make a state in which the oxide semiconductor layer contains oxygen in excess of the stoichiometric composition and to supply oxygen from outside to the oxide semiconductor layer to repair the oxygen vacancy.

When a positive gate BT (+GBT: positive gate bias temperature) test is performed on the transistor including the oxide semiconductor layer, the threshold voltage ($V_{th}$) shifts in the positive direction as compared to the initial $V_g$–$I_d$ characteristics. In addition, when a negative gate BT (−GBT: negative gate bias temperature) test is performed on the transistor on which a positive gate BT test has been performed, the $V_g$–$I_d$ characteristics shift in the negative direction. In this manner, the threshold voltage of the transistor becomes alternately positive and negative, which is associated with alternation of a positive gate BT test and a negative gate BT test (see FIG. 7).

FIG. 7 suggests that the change in $V_g$–$I_d$ characteristics of the transistor including the oxide semiconductor layer relates not to a fixed charge but to a level (trap level).

[1.1. Deterioration Mechanism in Each Deterioration Mode]

How the deterioration modes of the transistor including the oxide semiconductor layer are caused will be described below.

Next, the shift of the threshold voltage in the positive direction when a positive gate BT test is performed will be described.

When a positive gate BT test is performed, electrons induced by a positive gate voltage are trapped by a DOS. The electrons trapped at the time of the positive gate BT test, i.e. negative charges have a long relaxation time and thus behave like fixed charges. Due to the negative charges, even after the gate voltage (bias) is off, a state equal to a state in which a negative voltage is effectively applied occurs. Therefore, when the electrical characteristics of the transistor are measured after the positive gate BT test, the threshold voltage of the transistor characteristics ($V_g$–$I_d$ characteristics) shifts in the positive direction.

Next, the shift of the threshold voltage in the negative direction when a negative gate BT test is performed is described.

When a negative gate voltage ($V_g$) is applied to the transistor and the transistor is irradiated with light in a negative gate BT test, holes, that is, positive charges are trapped by a DOS. Since a difference between the conduction band minimum energy (Ec) and energy of the DOS is large and a difference between the valence band maximum energy (Ev) and energy of the DOS is large, it takes a long time before holes are induced. In addition, holes in the oxide semiconductor layer have a large effective mass, and holes are hardly injected even from a drain electrode. The positive charges have a long relaxation time and thus behave like a fixed charge. Due to the positive charges, even after the gate voltage (bias) is off, a state equal to a state in which a positive voltage is effectively applied occurs. Therefore, when the electrical characteristics of the transistor after the negative gate BT test are measured, the threshold voltage of the transistor characteristics ($V_g$–$I_d$ characteristics) shifts in the negative direction.

Figure 8:
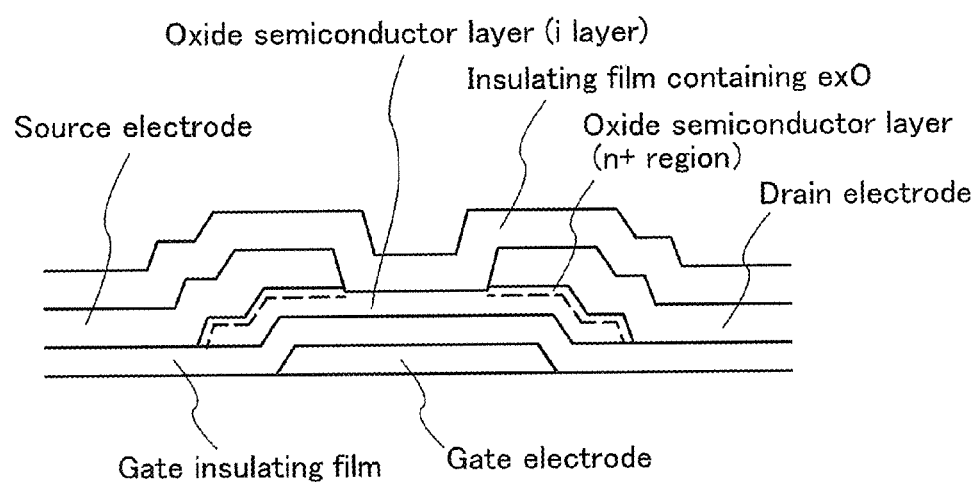
FIG. 8 is a cross-sectional view of a transistor including an oxide semiconductor layer.

Next, an n-type region in which an oxide semiconductor layer is in contact with a source electrode and a drain electrode is described with reference to FIG. 8. FIG. 8 is a cross-sectional view of a transistor including an oxide semiconductor layer. The transistor includes a gate electrode, a gate insulating film formed over the gate electrode, an oxide semiconductor layer formed over the gate insulating film, a source electrode and a drain electrode formed over the oxide semiconductor layer, and an insulating film (exO containing insulating film) formed over the oxide semiconductor layer, the source electrode, and the drain electrode.

After the formation of the oxide semiconductor layer, the source electrode and the drain electrode are formed in contact with the oxide semiconductor layer. For example, in the case where the source electrode and the drain electrode are formed by a sputtering method, plasma damage to the oxide semiconductor layer at the film formation or collision of atoms or molecules of a material used for the source electrode and the drain electrode with the oxide semiconductor layer at the film formation changes part of the oxide semiconductor layer to an n-type, so that an n-type region ($n^+$ region) is formed.

In addition, the n-type region is also formed by heat treatment after the formation of the source electrode and the drain electrode. For example, by the heat treatment, hydrogen enters the position of an oxygen vacancy in the oxide semiconductor layer (VoH is formed), or in the case where In is contained in the oxide semiconductor layer, In contained in the oxide semiconductor layer is reduced, so that an n-type region is formed.

On the other hand, in a region of the oxide semiconductor layer in which the source electrode and the drain electrode are not formed, that is, a region where a channel is formed, an insulating film containing excess oxygen (exO containing insulating film) is formed in contact with the oxide semiconductor layer. Therefore, by performing heat treatment after the formation of the insulating film containing excess oxygen, oxygen vacancies in the oxide semiconductor layer are compensated with the excess oxygen (exO) and reduced, whereby the oxide semiconductor layer becomes i-type (i layer).

Note that when the oxide semiconductor layer is an In—Ga—Zn oxide, oxygen that is bonded to indium whose bond energy with oxygen is low is easily released (i.e. In-Vo is easily formed). The formation of an n-type region is probably related to In-VoH. In addition, an oxygen vacancy is thought to exist like In-Vo-In.

In order to reduce defect states in the oxide semiconductor layer, it is important to reduce oxygen vacancies (Vo). Specifically, oxygen vacancies can be reduced by preventing entry of Si into the oxide semiconductor layer or by being compensated with excess oxygen. Further, it is preferable to reduce hydrogen in the oxide semiconductor layer because an n-type region is formed when hydrogen is trapped in an oxygen vacancy.

[2. Transistor Including Oxide Semiconductor]

A transistor including an oxide semiconductor and having stable electrical characteristics, in which oxygen vacancies are reduced, will be described below.

[2.1. Structure of Transistor]

Figure 1B:
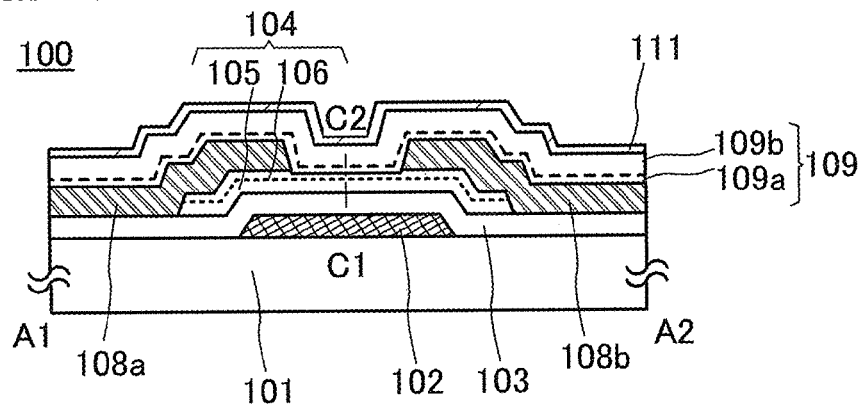
Figure 1C:
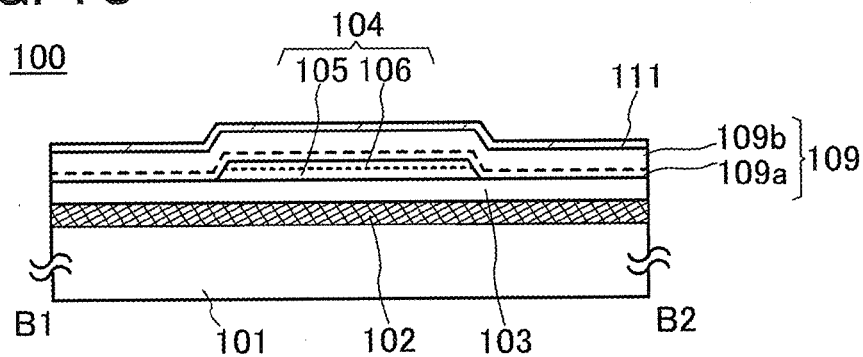

FIGS. 1A to 1C are a top view and cross-sectional views of a transistor 100 of a semiconductor device. FIG. 1A is a top view of the transistor 100. FIG. 1B is a cross-sectional view taken along the dashed-dotted line A1-A2 in FIG. 1A. FIG. 1C is a cross-sectional view taken along the dashed-dotted line B1-B2 in FIG. 1A. Note that in FIG. 1A, some of components of the transistor 100 (e.g., a substrate 101, a gate insulating film 103, and an interlayer insulating film 109) are omitted for simplicity.

The transistor 100 illustrated in FIGS. 1B and 1C includes a gate electrode 102 provided over the substrate 101. The transistor 100 includes the gate insulating film 103 formed over the substrate 101 and the gate electrode 102, a stacked-layer oxide film 104 overlapping with the gate electrode 102 with the gate insulating film 103 provided therebetween, and a source electrode 108a and a drain electrode 108b in contact with the stacked-layer oxide film 104. The interlayer insulating film 109 is formed over the gate insulating film 103, the stacked-layer oxide film 104, and the source electrode 108a and the drain electrode 108b. The interlayer insulating film 109 has a stacked-layer structure of an oxide insulating film 109a and an oxide insulating film 109b. An interlayer insulating film 111 is provided over the interlayer insulating film 109.

In the transistor 100 of one embodiment of the present invention, the stacked-layer oxide film 104 includes an oxide semiconductor layer 105 and an oxide layer 106. The oxide semiconductor layer 105 mainly serves as a channel. The interlayer insulating film 109 is formed so as to be in contact with the stacked-layer oxide film 104. That is, the oxide layer 106 is provided between the oxide semiconductor layer 105 and the interlayer insulating film 109.

Examples of a material that can be used for the oxide semiconductor layer 105 are an In—Ga oxide, an In—Zn oxide, and an In-M-Zn oxide (M is Al, Ga, Y, La, Ce, or Nd).

Note that when the oxide semiconductor layer 105 is an In-M-Zn oxide, in the atomic ratio between In and M, the proportion of In be less than 50 atomic % and the proportion of M be greater than or equal to 50 atomic %, and it is further preferable that, in the atomic ratio between In and M, the proportion of In be less than 25 atomic % and the proportion of M be greater than or equal to 75 atomic %.

The energy gap of the oxide semiconductor layer 105 is 2 eV or more, preferably 2.5 eV or more, further preferably 3 eV or more. In this manner, the off-state current of the transistor 100 can be reduced by using an oxide semiconductor having a wide energy gap.

The thickness of the oxide semiconductor layer 105 is greater than or equal to 3 nm and less than or equal to 200 nm, preferably greater than or equal to 3 nm and less than or equal to 100 nm, further preferably greater than or equal to 3 nm and less than or equal to 50 nm.

The oxide layer 106 is typically an In—Ga oxide, an In—Zn oxide, or an In-M-Zn oxide, and the conduction band minimum energy of the oxide layer 106 is closer to a vacuum level than that of the oxide semiconductor layer 105, typically the difference between the conduction band minimum energy of the oxide layer 106 containing In or Ga and the conduction band minimum energy of the oxide semiconductor layer 105 is 0.05 eV or more, 0.07 eV or more, 0.1 eV or more, or 0.15 eV or more and 2 eV or less, 1 eV or less, 0.5 eV or less, or 0.4 eV or less.

When the oxide layer 106 is an In-M-Zn oxide, in the atomic ratio between In and M, the proportion of In be greater than or equal to 25 atomic % and the proportion of M be less than 75 atomic %, and it is further preferable that, in the atomic ratio between In and M, the proportion of In be greater than or equal to 34 atomic % and the proportion of M be less than 66 atomic %.

In the case where the oxide semiconductor layer 105 and the oxide layer 106 are each an In-M-Zn oxide, the atomic ratio of M contained in the oxide layer 106 is higher than that in the oxide semiconductor layer 105. The atomic ratio of M contained in the oxide layer 106 is typically 1.5 times or more, preferably twice or more, further preferably three times or more as large as that in the oxide semiconductor layer 105.

In the case where the oxide semiconductor layer 105 and the oxide layer 106 are each an In-M-Zn oxide, and the oxide layer 106 has an atomic ratio of In to M and Zn which is $x_1:y_1:z_1$ and the oxide semiconductor layer 105 has an atomic ratio of In to M and Zn which is $x_2:y_2:z_2$, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three times or more as large as $y_2/x_2$. At this time, when $y_2$ is greater than or equal to $x_2$ in the stacked-layer oxide film, a transistor including the stacked-layer oxide film can have stable electrical characteristics. However, when $y_2$ is 3 times or more as great as $x_2$, the field-effect mobility of the transistor including the stacked-layer oxide film is reduced; accordingly, $y_2$ is preferably less than 3 times $x_2$.

For example, for the oxide semiconductor layer 105, an In—Ga—Zn oxide in which an atomic ratio of In to Ga and Zn is 1:1:1 or 3:1:2 can be used, and for the oxide layer 106, an In—Ga—Zn oxide in which an atomic ratio of In to Ga and Zn is 1:3:2, 1:6:4, or 1:9:6 can be used. Note that the atomic ratio of each of the oxide semiconductor layer 105 and the oxide layer 106 varies within a range of ±20% of the above atomic ratio as an error.

However, the composition is not limited to those described above, and a material having the appropriate composition may be used depending on required semiconductor characteristics and electrical characteristics of the transistor (e.g., field-effect mobility and threshold voltage). Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 105 be set to appropriate values.

Note that the oxide layer 106 also functions as a film which relieves damage to the oxide semiconductor layer 105 at the time of forming the interlayer insulating film 109 later.

The thickness of the oxide layer 106 is greater than or equal to 3 nm and less than or equal to 100 nm, preferably greater than or equal to 3 nm and less than or equal to 50 nm.

When silicon or carbon which is one of elements belonging to Group 14 is contained in the oxide semiconductor layer 105, the number of oxygen vacancies is increased, and the oxide semiconductor layer 105 is changed to an n-type. Thus, the concentration of silicon and carbon in part or entire of the oxide semiconductor layer 105 or in a region of the oxide semiconductor layer 105 which is close to the interface with the oxide layer 106 is less than or equal to $2\times10^{18}$ atoms/cm$^3$, preferably less than or equal to $2\times10^{17}$ atoms/cm$^3$.

Further, when an alkali metal or an alkaline earth metal is bonded to an oxide semiconductor, carriers are in some cases generated in the oxide semiconductor layer 105, which cause an increase in the off-state current of the transistor. Therefore, the concentration of alkali metals or alkaline earth metals in the oxide semiconductor layer 105 is preferably lower than or equal to $1\times10^{18}$ atoms/cm$^3$, further preferably lower than or equal to $2\times10^{16}$ atoms/cm$^3$.

Furthermore, in the transistor 100 of one embodiment of the present invention, the interlayer insulating film 109 is formed so as to be in contact with the stacked-layer oxide film 104. The interlayer insulating film 109 has a stacked-layer structure of the oxide insulating film 109a and the oxide insulating film 109b thereover.

The oxide insulating film 109a is an oxide insulating film through which oxygen is permeated. Note that the oxide insulating film 109a also functions as a film which relieves damage to the stacked-layer oxide film 104 at the time of forming the oxide insulating film 109b later.

As the oxide insulating film 109a, a silicon oxide film, a silicon oxynitride film, or the like having a thickness greater than or equal to 5 nm and less than or equal to 150 nm, preferably greater than or equal to 5 nm and less than or equal to 50 nm can be used. Note that in this specification, a "silicon oxynitride film" refers to a film that includes more oxygen than nitrogen, and a "silicon nitride oxide film" refers to a film that includes more nitrogen than oxygen.

Further, it is preferable that the number of defects in the oxide insulating film 109a be small and typically the spin density of a signal due to a dangling bond of silicon, which appears when g is 2.001, be lower than or equal to $3\times10^{17}$ spins/cm$^3$ by ESR measurement. This is because if the density of defects in the oxide insulating film 109a is high, oxygen is bonded to the defects and the amount of oxygen that is permeated through the oxide insulating film 109a is decreased.

Further, it is preferable that the number of defects at the interface between the oxide insulating film 109a and the stacked-layer oxide film 104 be small and typically the spin density of a signal due to a defect in the stacked-layer oxide film 104, which appears when g is 1.93, be lower than or equal to $1\times10^{17}$ spins/cm$^3$, further preferably lower than or equal to the lower limit of detection by ESR measurement.

Note that in the oxide insulating film 109a, all oxygen entering the oxide insulating film 109a from the outside does not move to the outside of the oxide insulating film 109a and some oxygen remains in the oxide insulating film 109a. Further, movement of oxygen occurs in the oxide insulating film 109a in some cases in such a manner that oxygen enters the oxide insulating film 109a and oxygen contained in the oxide insulating film 109a is moved to the outside of the oxide insulating film 109a.

When the oxide insulating film through which oxygen is permeated is formed as the oxide insulating film 109a, oxygen released from the oxide insulating film 109b provided over the oxide insulating film 109a can be moved to the stacked-layer oxide film 104 through the oxide insulating film 109a.

The oxide insulating film 109b is formed so as to be in contact with the oxide insulating film 109a. The oxide insulating film 109b is formed using an oxide insulating film that contains oxygen at a proportion higher than that of oxygen in the stoichiometric composition. Part of oxygen is released by heating from the oxide insulating film that contains oxygen at a proportion higher than that of oxygen in the stoichiometric composition. The oxide insulating film that contains oxygen at a proportion higher than that of oxygen in the stoichiometric composition is an oxide insulating film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis.

As the oxide insulating film 109b, a silicon oxide film, a silicon oxynitride film, or the like having a thickness greater than or equal to 30 nm and less than or equal to 500 nm, preferably greater than or equal to 50 nm and less than or equal to 400 nm can be used.

Further, it is preferable that the number of defects in the oxide insulating film 109b be small and typically the spin density of a signal due to a dangling bond of silicon, which appears when g is 2.001, be lower than or equal to $1.5\times10^{18}$ spins/cm$^3$, further preferably lower than or equal to $1\times10^{18}$ spins/cm$^3$ by ESR measurement. Note that the oxide insulating film 109b is provided more apart from the stacked-layer oxide film 104 than the oxide insulating film 109a is; thus, the oxide insulating film 109b may have higher defect density than the oxide insulating film 109a.

[2.2. Energy Band Structure]

Here, the energy band structure taken along dashed-dotted line C1-C2 in the vicinity of the stacked-layer oxide film 104 in FIG. 1B is described with reference to FIG. 3A, and the flow of carrier in the transistor 100 is described with reference to FIGS. 3B and 3C.

In the band structure shown in FIG. 3A, for example, an In—Ga—Zn oxide (an atomic ratio of In to Ga and Zn is 1:1:1) with an energy gap of 3.15 eV is used for the oxide semiconductor layer 105, and In—Ga—Zn oxide (an atomic ratio of In to Ga and Zn is 1:3:2) with an energy gap of 3.5 eV is used for the oxide layer 106.

As shown in FIG. 3A, in the stacked-layer oxide film 104, a mixed region exists in a region of the oxide semiconductor layer 105 which is close to the interface with the oxide layer 106, and the conduction band minimum energies vary continuously. In other words, in the vicinity of the interface between the oxide semiconductor layer 105 and the oxide layer 106, an impurity which forms a defect state such as a trapping center or a recombination center does not exist or hardly exists; thus, the energies vary gradually without a barrier. In this specification, such a junction is referred to as continuous junction. Such a band shape is caused by mutual transfer of oxygen between the oxide semiconductor layer 105 and the oxide layer 106. If impurities are mixed between the oxide semiconductor layer and the oxide layer which are stacked, in some cases, the continuity of the energy bands is lost and a defect state that traps a carrier is formed at the interface. Further, in the stacked-layer oxide film 104, the conduction band minimum energy of the oxide semiconductor layer 105 is the lowest; therefore, this region serves as a channel formation region.

In order to form such a continuous junction, the layers need to be stacked successively without being exposed to the air by using a multi-chamber deposition system (sputtering apparatus) provided with a load lock chamber. It is preferable that each chamber of the sputtering apparatus be evacuated to a high vacuum (to the degree of about $1\times10^{-4}$ Pa to $5\times10^{-7}$ Pa) by an adsorption vacuum pump such as a cryopump so that water and the like acting as impurities of the oxide semiconductor layer are removed as much as possible. Alternatively, a combination of a turbo molecular pump and a cold trap is preferably used to prevent back-flow of a gas, especially a gas containing carbon or hydrogen from an exhaust system into each chamber.

Further alternatively, it is preferable to introduce a small amount of an inert gas such as a rare gas into each chamber also in steps other than the film formation process so that backflow of a gas, especially a gas containing carbon or hydrogen from the exhaust system into the chambers can be prevented.

Not only high vacuum evaporation of the chamber but also high purification of a sputtering gas is necessary to obtain a highly purified intrinsic oxide semiconductor layer. As an oxygen gas or an argon gas used as the sputtering gas, a gas that is highly purified to have a dew point of −40° C. or lower, preferably −80° C. or lower, further preferably −100° C. or lower, still further preferably −120° C. or lower is used, so that entry of moisture or the like into the oxide semiconductor layer can be prevented as much as possible. Further, a refiner is provided close to the chamber so that impurities in the sputtering gas are reduced with the refiner and a pipe is less contaminated with impurities when they move from the refiner to the chamber. As a result, a highly purified sputtering gas can be introduced into the chamber.

Note that for each of the oxide semiconductor layer 105 and the oxide layer 106, a difference between the conduction band minimum energy and the vacuum energy (the difference is also referred to as an electron affinity) can be obtained by subtracting an energy gap from a difference between the valence band maximum energy and the vacuum energy (the difference is also referred to as an ionization potential). The energy gap can be measured with the use of a spectroscopic ellipsometer, and ionization potential can be measured using an ultraviolet photoelectron spectroscopy (UPS) apparatus.

Now, a state where electrons serving as carrier flow in the transistor is described with reference to FIGS. 3B and 3C. Note that in FIGS. 3B and 3C, the number of electrons flowing in the oxide semiconductor layer 105 is represented by a size of a dotted arrow.

In the vicinity of the interface between the oxide layer 106 and the oxide insulating film 109a, trap states 120 are formed by an impurity and defects. Thus, for example, in the case where a channel formation region of the transistor is formed with a single layer of the oxide semiconductor layer 105 as illustrated in FIG. 3B, in the oxide semiconductor layer 105, electrons mainly flow in a region on the gate insulating film 103 side, but some electrons flow in a region on the oxide insulating film 109a side. Thus, part of the electrons are trapped in the trap states 120.

On the other hand, since, in the transistor 100 of one embodiment of the present invention, the oxide layer 106 is provided between the oxide semiconductor layer 105 and the oxide insulating film 109a as illustrated in FIG. 3C, there is a distance between the oxide semiconductor layer 105 and the trap states 120. Thus, electrons are less likely to be trapped in the trap states 120. Note that when electrons are trapped in the trap states, the trapped electrons function as negative fixed charges. As a result, a threshold voltage of the transistor is changed. However, by the distance between the oxide semiconductor layer 105 and the trap states 120, the number of electrons trapped in the trap states 120 can be reduced, and accordingly change in the threshold voltage can be reduced.

Note that when the energy difference ΔE1 of the conduction band minimum in the vicinity of the interface between the oxide semiconductor layer 105 and the oxide layer 106 is small, electrons are trapped in the trap states 120 by passing over the energy difference ΔE1. Thus, the energy difference ΔE1 between the conduction band minimum of the oxide semiconductor layer 105 and the conduction band minimum of the oxide layer 106 is greater than or equal to 0.1 eV, preferably greater than or equal to 0.15 eV.

Further, the oxide insulating film 109b (see FIG. 1B) that contains oxygen at a proportion higher than that of oxygen in the stoichiometric composition is provided on the back channel side of the stacked-layer oxide film 104 (a surface of the stacked-layer oxide film 104 which is opposite to a surface facing the gate electrode 102) with the oxide insulating film 109a through which oxygen is permeated provided therebetween. Therefore, oxygen can be moved from the oxide insulating film 109b that contains oxygen at a proportion higher than that of oxygen in the stoichiometric composition to the oxide semiconductor layer 105 included in the stacked-layer oxide film 104, whereby oxygen vacancies in the oxide semiconductor layer 105 can be reduced.

From the above, oxygen vacancies in the stacked-layer oxide film 104 can be reduced by providing the stacked-layer oxide film 104 including the oxide semiconductor layer 105 and the oxide layer 106. Further, the oxygen vacancies can be reduced also by providing the oxide insulating film 109b that contains oxygen at a proportion higher than that of oxygen in the stoichiometric composition over the stacked-layer oxide film 104 with the oxide insulating film 109a through which oxygen is permeated provided therebetween. Furthermore, when the oxide layer 106 is provided between the oxide semiconductor layer 105 and the oxide insulating film 109a, the concentration of silicon or carbon in the oxide semiconductor layer 105 or the oxide layer 106, or in the vicinity of the interface between the oxide semiconductor layer 105 and the oxide layer 106 can be reduced.

Consequently, the absorption coefficient of the stacked-layer oxide film 104 which is calculated by a constant photocurrent method (CPM) is lower than $1\times10^{-3}$/cm, preferably lower than $1\times10^{-4}$/cm. The absorption coefficient has a positive correlation with an energy corresponding to the localized levels due to oxygen vacancies and entry of impurities (the energy calculated from the wavelength); thus, the density of localized levels in the stacked-layer oxide film 104 is extremely low.

Note that the absorption coefficient which is called an Urbach tail due to the band tail is removed from a curve of the absorption coefficient obtained by the CPM measurement, whereby the absorption coefficient due to the localized states can be calculated from the following formula. Note that the Urbach tail indicates a constant gradient region on a curve of the absorption coefficient obtained by the CPM measurement, and the gradient is called Urbach energy.

$$\int \frac{\alpha(E) - \alpha_u}{E} dE \qquad \text{[FORMULA 1]}$$

Here, $\alpha(E)$ indicates the absorption coefficient at each energy level and $\alpha_u$ indicates the absorption coefficient obtained by the Urbach tail.

Since the transistor 100 having such a structure includes very few defects in the channel formation region of the stacked-layer oxide film 104 including the oxide semiconductor layer 105, the electrical characteristics of the transistor can be improved. Further, in a BT stress test and a BT photostress test which are examples of a stress test, the threshold voltage does not shift or the amount of the shift in the negative direction or the positive direction is less than or equal to 1.0 V, preferably less than or equal to 0.5 V; thus, high reliability can be obtained.

[2.3. Components of Transistor]

The specific components of the transistor 100 are described below with reference to FIGS. 1A to 1C.

There is no particular limitation on a material and the like of the substrate 101 as long as the material has heat resistance enough to withstand at least heat treatment to be performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Further, alternatively any of these substrates further provided with a semiconductor element may be used as the substrate 101.

Still further alternatively, a flexible substrate may be used as the substrate 101, and the transistor 100 may be provided directly on the flexible substrate. A separation layer may be provided between the substrate 101 and the transistor 100. After part or the whole of the semiconductor device including the transistor is formed over the separation layer, the transistor and the like are separated from the substrate 101 along the separation layer and can be transferred to another substrate. By this separation and transfer method, the transistor 100 can be formed over a substrate having low heat resistance or a flexible substrate.

The gate electrode 102 can be formed using a metal material selected from aluminum, chromium, copper, tantalum, titanium, molybdenum, tungsten, neodymium, niobium, scandium, manganese, and zirconium; an alloy material containing any one of these metal materials as a component; an alloy material containing any of these metal materials in combination; a nitride material of any of these metal materials; or the like. Furthermore, the gate electrode 102 may have a single-layer structure or a stacked-layer structure of two or more layers. For example, a single-layer structure of an aluminum film containing silicon, a two-layer structure in which a molybdenum film is stacked over an aluminum film, a two-layer structure in which a molybdenum film is stacked over an aluminum film containing neodymium, a two-layer structure in which a titanium film is stacked over an aluminum film, a two-layer structure in which a molybdenum film is stacked over a copper film, a two-layer structure in which a copper film is stacked over a molybdenum-titanium alloy film, a two-layer structure in which titanium film is stacked over a titanium nitride film, a two-layer structure in which a tungsten film is stacked over a titanium nitride film, a two-layer structure in which a tungsten film is stacked over a tantalum nitride film, a three-layer structure in which a molybdenum film, an aluminum film, and a molybdenum film are stacked in this order, a three-layer structure in which a titanium film, an aluminum film, and a titanium film are stacked in this order, and the like can be given.

Alternatively, as the gate electrode 102, an oxide film such as an In—Zn—W oxide film, an In—Sn oxide film, an In—Zn oxide film, an In oxide film, a Zn oxide film, or a Sn oxide film can be used. A slight amount of Al, Ga, Sb, F, or the like may be added to the above oxide film. Further, a metal thin film having a thickness enough to transmit light (preferably, approximately 5 nm to 30 nm) can also be used. For example, an Ag film, a Mg film, or an Ag—Mg alloy film with a thickness of 5 nm may be used. Further, graphene may be used. It is also possible to have a stacked-layer structure of the above light-transmitting conductive material and the above metal material.

Further alternatively, an In—Ga—Zn oxynitride semiconductor film, an In—Sn oxynitride semiconductor film, an In—Ga oxynitride semiconductor film, an In—Zn oxynitride semiconductor film, a Sn oxynitride semiconductor film, an In oxynitride semiconductor film, a film of a metal nitride (such as InN or ZnN), or the like may be provided between the gate electrode 102 and the gate insulating film 103. These films each have a work function higher than or equal to 5 eV, preferably higher than or equal to 5.5 eV, which is higher than the electron affinity of an oxide semiconductor; thus, the threshold voltage of a transistor including an oxide semiconductor can shift in the positive direction. Accordingly, a switching element having what is called normally-off characteristics can be achieved. For example, in the case of using an In—Ga—Zn oxynitride semiconductor film, an In—Ga—Zn oxynitride semiconductor film having a higher nitrogen concentration than at least the oxide semiconductor layer 105, specifically, an In—Ga—Zn oxynitride semiconductor film having a nitrogen concentration of 7 atomic % or higher is used.

The gate insulating film 103 may be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn metal oxide film.

Here, the gate insulating film 103 may be formed using an oxide insulator from which oxygen is released by heating. With the use of a film from which oxygen is released by heating as the gate insulating film 103, interface states at the interface between the stacked-layer oxide film 104 and the gate insulating film 103 can be reduced; accordingly, a transistor with less deterioration in electrical characteristics can be obtained.

It is possible to prevent outward diffusion of oxygen from the stacked-layer oxide film 104 and entry of hydrogen, water, or the like into the stacked-layer oxide film 104 from the outside by providing an insulating film having a blocking effect against oxygen, hydrogen, water, and the like as the gate insulating film 103. As the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

Thus, it is particularly preferable that the gate insulating film 103 have a stacked-layer structure of two or more layers in which the film of the oxide insulator from which oxygen is released by heating is provided on the side close to the stacked-layer oxide film 104 and the insulating film having a blocking effect against oxygen, hydrogen, water, and the like is provided on the side close to the gate electrode 102.

Further, the gate insulating film 103 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 103 is greater than or equal to 5 nm and less than or equal to 400 nm, preferably greater than or equal to 10 nm and less than or equal to 300 nm, further preferably greater than or equal to 50 nm and less than or equal to 250 nm.

Further, it is possible to prevent outward diffusion of oxygen from the stacked-layer oxide film 104 and entry of hydrogen, water, or the like into the stacked-layer oxide film 104 from the outside by providing the interlayer insulating film 111 having a blocking effect against oxygen, hydrogen, water, and the like over the oxide insulating film 109b included in the interlayer insulating film 109.

Here, in formation of the transistor 100, a low-resistance metal material may be used for the source electrode 108a and the drain electrode 108b. In particular, when a display module with a large-area display is manufactured, a problem of signal delay due to resistance of a wiring becomes prominent. Accordingly, it is preferable that a metal material with a low electric resistance value be used for a material of a wiring and an electrode.

On the other hand, in the case of a structure in which the stacked-layer oxide film 104 is in contact with the source electrode 108a and the drain electrode 108b formed using a metal material having low electric resistance value, contact resistance might be high. One of the factors causing high contact resistance is probably Schottky junction that is formed at the interface between the stacked-layer oxide film 104 and each of the source electrode 108a and the drain electrode 108b. In addition, capacitor is formed in each of portions of the stacked-layer oxide film 104 which are in direct contact with the source electrode 108a and the drain electrode 108b, and frequency characteristics (also referred to as f characteristics) are lowered. Therefore, high-speed operation of the transistor 100 might be hindered.

Figure 6A:
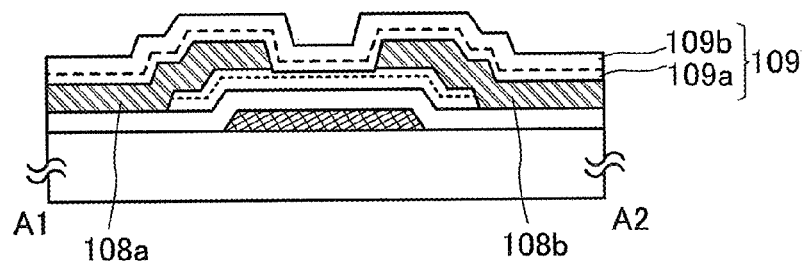
FIGS. 6A to 6C are cross-sectional views illustrating a method for manufacturing a transistor.
Figure 6B:
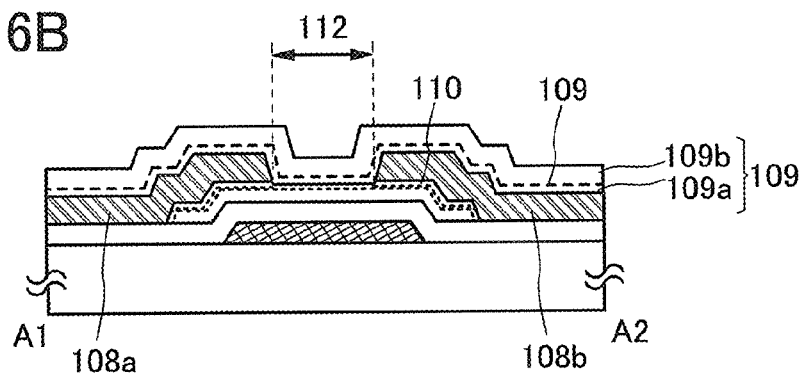
Figure 6C:
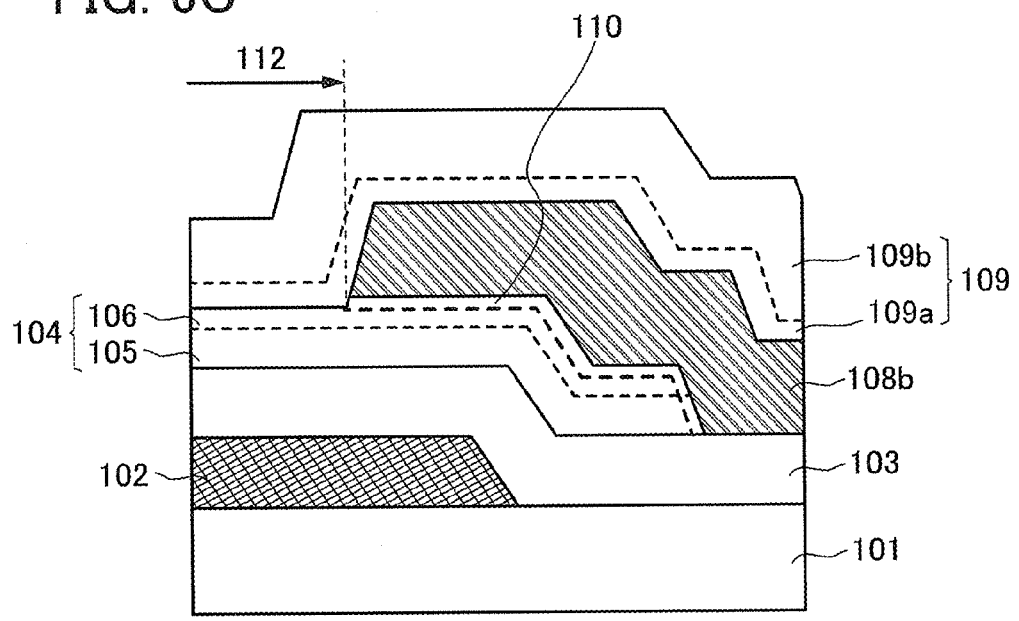

Thus, an $n^+$ region 110 is preferably provided in each of portions of the stacked-layer oxide film 104 which are in direct contact with the source electrode 108a and the drain electrode 108b, as illustrated in FIGS. 6B and 6C.

In order to form the $n^+$ regions 110, the source electrode 108a and the drain electrode 108b are formed using a conductive material which is easily bonded to oxygen, such as tungsten, titanium, aluminum, copper, molybdenum, chromium, or tantalum, or an alloy containing at least one of these materials as a component. With these materials, oxygen contained in the stacked-layer oxide film 104 in contact with the source electrode 108a and the drain electrode 108b is bonded to the conductive material contained in the source electrode 108a and the drain electrode 108b; thus, regions including oxygen vacancies are formed in the stacked-layer oxide film 104. Since these regions function as the $n^+$ regions 110, contact resistance between the stacked-layer oxide film 104 and each of the source electrode 108a and the drain electrode 108b can be reduced and formation of a capacitor can be prevented.

As described above, to form the $n^+$ regions 110 means to form regions including oxygen vacancies in the stacked-layer oxide film 104. Such $n^+$ regions 110 in the stacked-layer oxide film 104 are mainly formed at the time of the formation of a film including the conductive material which is used for the source electrode 108a and the drain electrode 108b and at the time of heat treatment performed on the stacked-layer oxide film 104.

The $n^+$ regions 110 in the stacked-layer oxide film 104 which are formed at the time of heat treatment after the formation of the source electrode 108a and the drain electrode 108b are formed in such a manner that oxygen in the stacked-layer oxide film 104 is extracted into the conductive material which is included in the source electrode 108a and the drain electrode 108b and then In is reduced, for example. Alternatively, the $n^+$ regions 110 are formed in the stacked-layer oxide film 104 by diffusion of the conductive material included in the source electrode 108a and the drain electrode 108b into the stacked-layer oxide film 104. Since in such cases the $n^+$ region 110 is formed in each of the portions of the stacked-layer oxide film 104 which are close to the source electrode 108a and the drain electrode 108b, change of a channel formation region to an n-type can be avoided.

However, for example, in the case where tungsten is used for the source electrode 108a and the drain electrode 108b, at a stage where a tungsten film is formed over the stacked-layer oxide film 104 by a sputtering method to form the source electrode 108a and the drain electrode 108b, the upper surface of the stacked-layer oxide film 104 over which the tungsten film is formed is entirely damaged. This is probably due to plasma damage at the formation of the tungsten film or damage that occurs by collision of atoms or molecules of tungsten.

That is, such a damaged region is a region where an oxygen vacancy is formed due to separation of a bond in the oxide close to the upper surface of the stacked-layer oxide film 104. Thus, the portion of the stacked-layer oxide film 104 which is close to its upper surface is uniformly changed to an n-type; therefore, in the case where the source electrode 108a and the drain electrode 108b are formed by processing the formed tungsten film, the portions of the stacked-layer oxide film 104 which are in contact with the source electrode 108a and the drain electrode 108b can be used as the $n^+$ region 110, which is advantageous.

However, since the portion of the stacked-layer oxide film 104 which is close to its upper surface is uniformly changed to an n-type, a depression portion 112 (see FIGS. 6B and 6C) on a back channel side between the source electrode 108a and the drain electrode 108b is also changed to an n-type. This induces degraded electrical characteristics of the transistor 100, such as normally-on characteristics, an increase of a leakage current, and a shift of a threshold voltage by application of stress.

Thus, it is necessary to change the n-type depression portion 112 of the stacked-layer oxide film 104 which is close to its upper surface to an i-type. Therefore, it is necessary to perform a step of changing the stacked-layer oxide film 104 in the depression portion 112 to an i-type by compensating excess oxygen (exO) for the stacked-layer oxide film 104 to reduce oxygen vacancies in such manner that the above-described oxide insulating film 109a through which oxygen is permeated is provided in contact with the upper surface of the stacked-layer oxide film 104 having the depression portion 112, the oxide insulating film 109b containing excess oxygen is provided thereover, and then heat treatment is performed.

However, even with such treatment to change the stacked-layer oxide film 104 which has been changed to an n-type at once to an i-type, the stacked-layer oxide film 104 might not be changed to an i-type sufficiently.

Thus, a method for manufacturing the transistor in which the $n^+$ regions 110 are formed and the depression portion 112 of the stacked-layer oxide film 104 on the back channel side is changed to an i-type is described below.

[3. Method for Manufacturing Transistor]

[3.1. Formation of Gate Electrode and Gate Insulating Film]

A method for manufacturing the transistor 100 is described with reference to FIGS. 5A to 5E and FIGS. 6A to 6C. In this manufacturing method, the case of using titanium as the conductive material of the source electrode 108a and the drain electrode 108b of the transistor 100 is described.

Figure 5A:
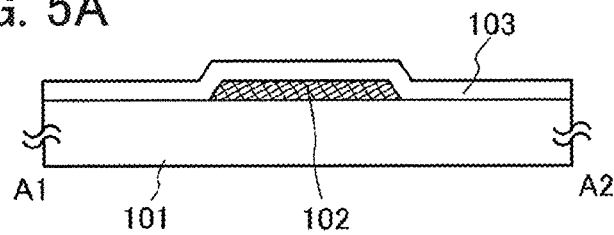
FIGS. 5A to 5E are cross-sectional views illustrating a method for manufacturing a transistor.

As illustrated in FIG. 5A, the gate electrode 102 is formed over the substrate 101, and the gate insulating film 103 is formed over the gate electrode 102. Here, a glass substrate is used as the substrate 101.

Next, the gate electrode 102 is formed. First, a conductive film is formed by a sputtering method, a CVD method, an evaporation method, or the like and then a photoresist mask is formed over the conductive film through a photolithography process. Then, part of the conductive film is etched using the photoresist mask to form the gate electrode 102. After that, the photoresist mask is removed.

Note that instead of the above formation method, the gate electrode 102 may be formed by an electrolytic plating method, a printing method, an ink-jet method, or the like.

Here, a 100-nm-thick tungsten film is formed by a sputtering method. Then, a photoresist mask is formed by a photolithography process and the tungsten film is dry-etched using the photoresist mask to form the gate electrode 102.

The gate insulating film 103 is formed by a sputtering method, a CVD method, an evaporation method, or the like.

In the case where the gate insulating film 103 is formed using a silicon oxide film, a silicon oxynitride film, or a silicon nitride oxide film, a deposition gas containing silicon and an oxidizing gas are preferably used as a source gas. As the deposition gas containing silicon, silane, disilane, trisilane, and silane fluoride can be used, for example. As the oxidizing gas, oxygen, ozone, dinitrogen monoxide, and nitrogen dioxide can be used, for example.

In the case of forming a silicon nitride film as the gate insulating film 103, it is preferable to employ a two-step formation method. First, a first silicon nitride film having few defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having few defects and a blocking property against hydrogen can be formed as the gate insulating film 103.

Moreover, in the case of forming a gallium oxide film as the gate insulating film 103, a metal organic chemical vapor deposition (MOCVD) method can be employed.

[3.2. Formation of Stacked-Layer Oxide Film]

Figure 5B:
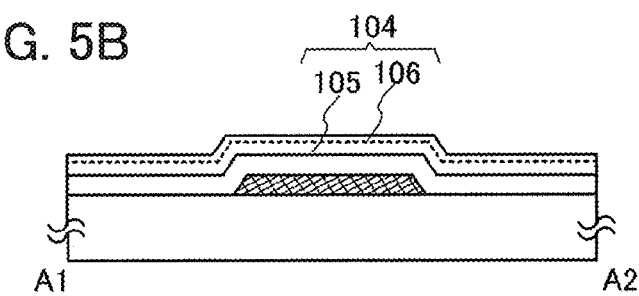

Next, a stacked-layer oxide film 104 is formed over the gate insulating film 103 as illustrated in FIG. 5B. Here, the stacked-layer oxide film 104 has a two-layer structure of an oxide semiconductor layer 105 as the lower layer and an oxide layer 106 as the upper layer. Note that the stacked-layer oxide film 104 does not necessarily have a two-layer structure and may have a stacked-layer structure of three or more layers or alternatively a single layer structure of the oxide semiconductor layer 105.

Figure 5C:
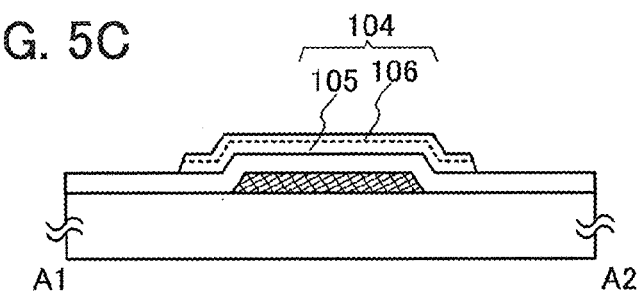

In the stacked-layer oxide film 104, first, the oxide semiconductor layer 105 and the oxide layer 106 are successively formed over the gate insulating film 103 by a sputtering method or the like. Next, after a photoresist mask is formed over the stacked-layer oxide film 104 by a photolithography process, the oxide semiconductor layer 105 and the oxide layer 106 are partly etched using the photoresist mask. Accordingly, the stacked-layer oxide film 104 having a predetermined shape in which the oxide semiconductor layer 105 and the oxide layer 106 are stacked over the gate insulating film 103 and subjected to element isolation so as to partly overlap with the gate electrode 102 is formed as illustrated in FIG. 5C. The stacked-layer oxide film can be etched using, for example, a mixed gas of methane ($CH_4$) and argon (Ar) by a dry etching method. Alternatively, a wet etching method using a mixed solution of phosphoric acid, nitric acid, and acetic acid, or the like may be employed. Then, the photoresist mask is removed.

Although the oxide semiconductor layer 105 and the oxide layer 106 included in the stacked-layer oxide film 104 can be formed by a coating method, a pulsed laser deposition method, a laser ablation method, or the like in addition to a sputtering method, it is particularly preferable to employ a sputtering method.

In the case where the oxide semiconductor layer 105 and the oxide layer 106 are formed by a sputtering method, for a power supply device for generating plasma, an RF power supply device, an AC power supply device, a DC power supply device, or the like can be used as appropriate. Note that in the case where a CAAC-OS layer which will be described later is used as the oxide semiconductor layer 105 or the oxide layer 106, it is particularly preferable to use a DC power supply device.

As a sputtering gas, an atmosphere of a rare gas such as argon or oxygen, or a mixed atmosphere of a rare gas and oxygen is used as appropriate. In the case where the mixed atmosphere of a rare gas and oxygen is used, the proportion of oxygen is preferably higher than that of a rare gas.

Further, a sputtering target may be selected as appropriate in accordance with the composition of the oxide semiconductor layer 105 or the oxide layer 106 to be formed.

[3.2.1. Formation of Stacked-Layer Oxide Film]

Here, the oxide semiconductor layer and the oxide layer are described in detail. Each of the oxide semiconductor layer 105 and the oxide layer 106 included in the stacked-layer oxide film 104 contains at least indium (In) and can be formed using a sputtering target with which a film can be formed by a sputtering method, preferably a DC sputtering method. By containing indium, the sputtering target can have increased conductivity. With the use of such a sputtering target, film formation by a DC sputtering method is performed more easily.

As a material forming the oxide layer 106, a material which is represented by an In-M-Zn oxide (a metal element such as Al, Ti, Ga, Ge, Y, Zr, Sn, La, Ce, or Hf) is used. As M, Ga is preferably used.

Note that for the oxide layer 106, a material which has a lower proportion of indium and a higher proportion of M in the atomic ratio than those of a material used for the oxide semiconductor layer 105 is used. The indium and gallium contents of the oxide layer can be compared by time-of-flight secondary ion mass spectrometry (also referred to as TOF-SIMS) or X-ray photoelectron spectrometry (also referred to as XPS).

The crystallinity of the oxide layer 106 or the oxide semiconductor layer 105 will be described below.

The oxide layer 106 or the oxide semiconductor layer 105 can be a non-single-crystal oxide semiconductor layer, for example. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like. Note that the oxide layer 106 or the oxide semiconductor layer 105 may be a single crystal oxide semiconductor layer.

The oxide layer 106 or the oxide semiconductor layer 105 may be a mixed layer including any of a CAAC-OS, a microcrystalline oxide semiconductor, and an amorphous oxide semiconductor. The mixed layer, for example, includes a region of an amorphous oxide semiconductor, a region of a microcrystalline oxide semiconductor, and a region of a CAAC-OS. Further, the mixed layer may have a stacked-layer structure including a region of an amorphous oxide semiconductor, a region of a microcrystalline oxide semiconductor, and a region of a CAAC-OS, for example.

The amorphous oxide semiconductor layer, for example, has disordered atomic arrangement and no crystalline component. Alternatively, the amorphous oxide semiconductor layer is, for example, absolutely amorphous and has no crystal part.

The microcrystalline oxide semiconductor layer includes microcrystal (also referred to as nanocrystal) with a size greater than or equal to 1 nm and less than 10 nm, for example. Note that the density of defect states of the microcrystalline oxide semiconductor layer is lower than that of the amorphous oxide semiconductor layer.

The CAAC-OS layer includes a plurality of crystal parts. In the entire CAAC-OS layer, a c-axis is aligned in a direction parallel to a normal vector of a surface where the CAAC-OS film is formed or a normal vector of a surface of the CAAC-OS film, but an a-axis and a b-axis are not aligned. Note that the density of defect states of the CAAC-OS layer is lower than those of the amorphous oxide semiconductor layer and the microcrystalline oxide semiconductor layer.

In the entire CAAC-OS layer, a c-axis is aligned in a direction parallel to a normal vector of a surface where the CAAC-OS film is formed or a normal vector of a surface of the CAAC-OS film, but an a-axis and a b-axis are not aligned. In the crystal part included in the CAAC-OS layer, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that in this specification, a simple term "perpendicular" includes a range from 80° to 100°, preferably from 85° to 95°. In addition, a term "parallel" includes a range from −10° to 10°, preferably from −5° to 5°.

Note that in most cases, a crystal part in the CAAC-OS layer fits inside a cube whose one side is less than 100 nm. In an image obtained with a transmission electron microscope (TEM), a boundary between crystal parts in the CAAC-OS layer are not clearly detected. Further, with the TEM, a grain boundary in the CAAC-OS layer is not clearly found. Thus, in the CAAC-OS layer, a reduction in electron mobility due to the grain boundary is less likely to occur.

In the CAAC-OS layer, distribution of crystal parts is not necessarily uniform. For example, in the formation process of the CAAC-OS layer, in the case where crystal growth occurs from a surface side of the oxide semiconductor layer, the proportion of crystal parts in the vicinity of the surface of the oxide semiconductor layer is higher than that in the vicinity of the surface where the oxide semiconductor film is formed in some cases. Further, when an impurity is added to the CAAC-OS layer, crystallinity of the crystal part in a region to which the impurity is added is lowered in some cases.

In the plurality of crystal parts included in the CAAC-OS layer, c-axes of crystals are aligned in the direction parallel to a normal vector of a surface where the CAAC-OS layer is formed or a normal vector of a surface of the CAAC-OS layer in a region where the crystal parts are formed. Therefore, the c-axes of the crystals are aligned in various directions depending on the shape of the CAAC-OS layer. That is, the directions of the c-axes of crystals in the plurality of crystal parts may be different from each other depending on the shape of the CAAC-OS layer (the cross-sectional shape of the surface where the CAAC-OS layer is formed or the cross-sectional shape of the surface of the CAAC-OS layer)

Note that the crystal part included in the CAAC-OS layer is formed concurrently with formation of the CAAC-OS layer or is formed through crystallization treatment such as heat treatment. Hence, the c-axes of the crystal parts are aligned in the direction parallel to a normal vector of the surface where the CAAC-OS film is formed or a normal vector of the surface of the CAAC-OS layer. For example, in the case where the shape of the CAAC-OS layer is changed by etching or the like after the crystal part is formed, a normal vector of the surface of the CAAC-OS layer after its shape is changed is not parallel to the direction of the c-axis of the crystal in some cases.

For example, when the CAAC-OS layer including a crystal of $InGaZnO_4$ is analyzed by an out-of-plane method with an X-ray diffraction (XRD) apparatus, a peak appears at 2θ of around 31° in some cases. The peak at 2θ of around 31° is derived from the (009) plane of a crystal of $InGaZnO_4$. Further, for example, in the CAAC-OS layer including a crystal of $ZnGa_2O_4$, a peak appears at 2θ of around 36° in some cases. The peak at 2θ of around 36° is derived from the (311) plane of a crystal of $ZnGa_2O_4$. The CAAC-OS layer is preferably an oxide semiconductor layer in which a peak appears at 2θ of around 31° and do not appear at 2θ of around 36°.

For example, when the CAAC-OS layer including a crystal of $InGaZnO_4$ is analyzed with an XRD apparatus by an in-plane method in which an X-ray enters a sample in a direction perpendicular to the c-axis, a peak appears at 2θ of around 56° in some cases. The peak at 2θ of around 56° is derived from the (110) plane of a crystal of $InGaZnO_4$. Here, when analysis (φ scan) is performed with 2θ fixed at around 56° and with a sample rotated using a normal vector of a surface of the sample as an axis (φ axis), although six peaks which show a plane equivalent to the (110) plane appear in the case of a single crystal oxide semiconductor layer in which the directions of an a-axis and a b-axis of one crystal part are the same as those of another crystal part, a peak is not clearly observed in the case of the CAAC-OS layer.

In a transistor using the CAAC-OS layer, change in electrical characteristics due to irradiation with visible light or ultraviolet light is small. Thus, the transistor has high reliability.

Note that when silicon and carbon are contained in the oxide semiconductor layer at a high concentration, the crystallinity of the oxide semiconductor layer is lowered in some cases. Since at least the oxide semiconductor layer 105 of the stacked-layer oxide film 104 is preferably a CAAC-OS film as described above, it is preferable to reduce the concentrations of silicon and carbon contained in the oxide semiconductor layer 105. Specifically, the concentration of silicon in part or entire of the oxide semiconductor layer 105 can be less than $1\times10^{19}$ atoms/cm$^3$, preferably less than $5\times10^{18}$ atoms/cm$^3$, further preferably less than $1\times10^{18}$ atoms/cm$^3$. The concentration of carbon in part or entire of the oxide semiconductor layer 105 can be less than $1\times10^{19}$ atoms/cm$^3$, preferably less than $5\times10^{18}$ atoms/cm$^3$, further preferably less than $1\times10^{18}$ atoms/cm$^3$.

In addition, the oxide layer 106 may have an amorphous structure or include a crystal part. Formation of the oxide layer 106 over the oxide semiconductor layer 105 having a crystal part allows the oxide layer 106 to have a crystal structure. In this case, a boundary between the oxide semiconductor layer 105 and the oxide layer 106 cannot be clearly identified by observation of the cross section with a transmission electron microscope (TEM) in some cases. Note that the oxide layer 106 has lower crystallinity than the oxide semiconductor layer 105. Hence, it can be said that the boundary can be determined by the degree of crystallinity.

[3.2.2. Preferable Conditions for Forming CAAC-OS Layer]

For the formation of the CAAC-OS layer, the following conditions are preferably employed.

The substrate temperature at the formation of the CAAC-OS layer is preferably high. For example, the CAAC-OS layer can be formed when an oxide semiconductor layer is formed at a substrate heating temperature of 100° C. to 740° C., preferably 200° C. to 500° C., further preferably 150° C. to 450° C.

For example, when the CAAC-OS layer is formed with the concentration of impurities reduced, the crystal state of the oxide semiconductor can be prevented from being broken by impurities. For example, impurities (e.g., hydrogen, water, carbon dioxide, and nitrogen) existing in a film formation chamber of a sputtering apparatus are preferably reduced. In addition, impurities in a film formation gas are preferably reduced. For example, a film formation gas whose dew point is −80° C. or lower, preferably −100° C. or lower is preferably used as a film formation gas.

Furthermore, it is preferable that the proportion of oxygen in the film formation gas be increased and the power be optimized in order to reduce plasma damage at the film formation. The proportion of oxygen in the film formation gas is 30 vol % or higher, preferably 100 vol %.

After the CAAC-OS layer is formed, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS layer in a short time. At the same time, the heat treatment in an inert atmosphere might generate oxygen vacancies in the CAAC-OS layer. In that case, the heat treatment in an oxidation atmosphere can reduce the oxygen vacancies. The heat treatment can further increase the crystallinity of the CAAC-OS layer. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS layer in a shorter time.

The concentration of hydrogen in the CAAC-OS layer formed in the above manner, which is measured by secondary ion mass spectrometry (SIMS), can be set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of nitrogen in the CAAC-OS layer formed in the above manner, which is measured by SIMS, can be set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The concentration of carbon in the CAAC-OS layer formed in the above manner, which is measured by SIMS, can be set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The concentration of silicon in the CAAC-OS layer formed in the above manner, which is measured by SIMS, can be set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The amount of each of the following gas molecules (atoms) released from the CAAC-OS layer formed in the above manner can be less than or equal to $1 \times 10^{19}$/cm$^3$, preferably less than or equal to $1 \times 10^{18}$/cm$^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

In the stacked-layer oxide film 104, hydrogen, nitrogen, carbon, silicon, and a metal element other than the main component become an impurity. In order to reduce the concentration of impurities in the stacked-layer oxide film 104, it is preferable to reduce also the concentration of impurities in the gate insulating film 103 and the interlayer insulating film 109 which are adjacent to the stacked-layer oxide film 104. For example, silicon in the interlayer insulating film 109 forms an impurity state. In some cases, the impurity state becomes a trap, which degrades electrical characteristics of the transistor.

The off-state current of a transistor manufactured using the above oxide semiconductor layer for a channel formation region can be sufficiently reduced (here, the off-state current means a drain current when a potential difference between a source and a gate is lower than or equal to the threshold voltage in the off state, for example). In the case where a highly purified oxide semiconductor layer is used for a transistor with a channel length of 10 μm, an oxide film thickness of 30 nm, and a drain voltage of about 1 V to 10 V, the off-state current of the transistor can be $1 \times 10^{-13}$ A or less. In addition, the off-state current per channel width (the value obtained by dividing the off-state current by the channel width of the transistor) can be made about $1 \times 10^{-23}$ A/μm (10 y A/μm) to $1 \times 10^{-22}$ A/μm (100 y A/μm).

In the above manner, a CAAC-OS layer can be formed. The CAAC-OS layer can be favorably used as the oxide semiconductor layer 105 or the oxide layer 106 in the stacked-layer oxide film 104.

Note that heat treatment is preferably performed to remove hydrogen or moisture in the stacked-layer oxide film 104 after its formation. For example, the heat treatment may be performed at 450° C. in a nitrogen atmosphere for one hour to dehydrate or dehydrogenate the stacked-layer oxide film 104.

Further, in order to reduce oxygen vacancies in the stacked-layer oxide film 104, it is preferable that, for example, heat treatment be further performed at 450° C. in a mixed atmosphere of nitrogen and oxygen for one hour.

[3.3. Electrode Containing Titanium]

Next, the source electrode and the drain electrode are formed over the stacked-layer oxide film 104.

Figure 5D:
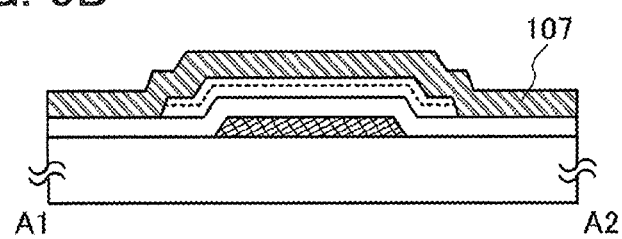

First, a conductive film 107 is formed by a sputtering method, a CVD method, an evaporation method, or the like as illustrated in FIG. 5D. A photoresist mask is formed over the conductive film by a photolithography process. Then, the conductive film 107 is etched using the photoresist mask, so that the source electrode 108a and the drain electrode 108b are formed. After that, the photoresist mask is removed. Through the above process, the source electrode 108a and the drain electrode 108b illustrated in FIG. 5E are formed.

Figure 5E:
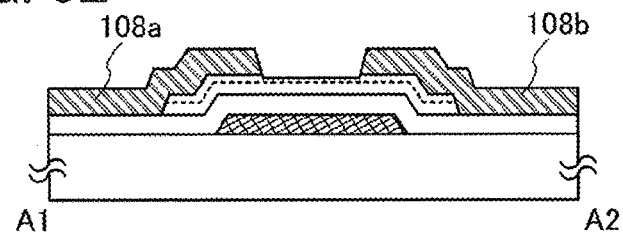

The conductive film 107 in FIG. 5D and the source electrode 108a and the drain electrode 108b in FIG. 5E are each a single layer; however, the conductive film 107 and the source electrode 108a and the drain electrode 108b each can have a stacked-layer structure of a conductive material. Note that titanium is used here as a conductive material in contact with the stacked-layer oxide film 104. Thus, in the case of a single-layer structure, the source electrode 108a and the drain electrode 108b are formed using a single-layer film of titanium, whereas in the case of a stacked-layer structure of a plurality of conductive materials, the lowest layer in contact with the stacked-layer oxide film 104 is formed using a layer containing titanium.

Here, in the case of using titanium as the conductive material, without being limited to titanium with extremely high purity, titanium may contain another element as an impurity, or alternatively titanium may contain another element as a main component (e.g., 1 wt % or more) as long as characteristics of titanium, which will be described later, can be achieved. Thus, titanium used as the conductive material may be an alloy with another metal or a compound of a nitride or the like.

In the case where the source electrode 108a and the drain electrode 108b have a stacked-layer structure of two or more layers as well as the single-layer structure of titanium, for layer(s) above the first layer, a single metal such as aluminum, titanium, chromium, nickel, copper, yttrium, zirconium, molybdenum, silver, tantalum, or tungsten, or an alloy or an a nitride containing any of these metals as its main component in a single-layer structure or a stacked-layer structure can be stacked. Specifically, the following stacked-layer structures can be employed: a two-layer structure in which an aluminum film is stacked over a titanium film; a three-layer structure in which a titanium film, an aluminum film, and a titanium film are stacked in this order; a three-layer structure in which a titanium film, an alloy film of aluminum and neodymium, and a titanium film are stacked in this order; a four-layer structure in which a titanium film, a titanium nitride film, an aluminum film, and a titanium film are stacked in this order; and the like.

In the case where the source electrode 108a and the drain electrode 108b have the above four-layer structure in which a titanium film, a titanium nitride film, an aluminum film, and a titanium film are stacked in this order, the thickness of the first titanium film can be reduced by inserting the titanium nitride film; therefore, expansion of an $n^+$ region which will be described later can be suppressed. Accordingly, the four-layer structure is preferable in that an effective channel length of the transistor can be controlled.

Alternatively, as the source electrode 108a and the drain electrode 108b, a stack of titanium and an oxide film such as an In—Zn—W oxide film, an In—Sn oxide film, an In—Zn oxide film, an In oxide film, a Zn oxide film, or a Sn oxide film can be used. A slight amount of Al, Ga, Sb, F, or the like may be added to the above oxide film. Further, a metal thin film having a thickness enough to transmit light (preferably, approximately 5 nm to 30 nm) can also be used. For example, an Ag film, a Mg film, or an Ag—Mg alloy film with a thickness of 5 nm may be used. Further, graphene may be used.

Here, for example, a 50-nm-thick titanium film, a 400-nm-thick aluminum film, and a 100-nm-thick titanium film are stacked in this order by a sputtering method (in FIG. 5D, the conductive film 107 is illustrated as a single layer). Then, the photoresist mask is formed over the conductive film 107 by a photolithography process; and the titanium film, the aluminum film, and the titanium film are dry-etched using the photoresist mask to form the source electrode 108a and the drain electrode 108b (see FIG. 5E).

Here, in the case where a tungsten film is used as the conductive film 107 (in the case where the conductive film 107 has a stacked-layer structure and a tungsten film is used for the lowest layer), an oxygen vacancy is formed due to the damage to the stacked-layer oxide film 104 at the film formation. Therefore, the sheet resistance of the stacked-layer oxide film 104 might be reduced and thus the stacked-layer oxide film 104 might be changed to an n-type as will be apparent from measurement of sheet resistance which will be described in Example 1. Thus, not only the stacked-layer oxide film 104 directly under the source electrode 108a and the drain electrode 108b but also the stacked-layer oxide film 104 on the back channel side is changed to an n-type, which causes degraded characteristics of the transistor, such as normally-on characteristics.

On the other hand, in the case where a titanium film is used as the conductive film 107 (in the case where the conductive film 107 has a stacked-layer structure and a titanium film is used for the lowest layer), the sheet resistance of the stacked-layer oxide film 104 under the titanium film is not decreased in some cases as will be described later despite film formation by a sputtering method in a similar manner.

That is, in the case where a titanium film is used as the conductive film 107, it is probable that an oxygen vacancy is hardly formed in the stacked-layer oxide film 104 under the conductive film 107. Thus, an i-type at the formation of the stacked-layer oxide film 104 can be maintained particularly on the back channel side; accordingly, favorable characteristics of the transistor can be obtained.

Note that after the stacked-layer oxide film 104 is processed into a predetermined shape, heat treatment is not performed before etching to process the conductive film 107 into the source electrode 108a and the drain electrode 108b. This is because, for example, when heat treatment is performed at approximately 350° C., oxygen is extracted from the stacked-layer oxide film 104 to the conductive film 107 and the stacked-layer oxide film 104 is further changed to an n-type; therefore, the stacked-layer oxide film 104 on the back channel side is also changed to an n-type before the conductive film 107 is removed.

As the etching for processing the conductive film 107 into the source electrode 108a and the drain electrode 108b, a wet etching method or a dry etching method can be employed.

In the case where the conductive film 107 is etched by a wet etching method, the titanium film can be etched with hydrofluoric acid, a mixed solution of hydrofluoric acid and nitric acid, ammonium fluoride, a mixed solution of ammonium fluoride and nitric acid, buffered hydrofluoric acid (BHF), or the like. In the case of using aluminum or aluminum containing niobium as another metal material besides titanium, a mixed solution of phosphoric acid, nitric acid, and acetic acid can be used, for example. In the case of using molybdenum or an alloy of molybdenum and tungsten, a mixed solution of phosphoric acid, nitric acid, and acetic acid can be used, for example. In the case of using tantalum, hydrofluoric acid, a mixed solution of hydrofluoric acid and nitric acid, ammonium fluoride, a mixed solution of ammonium fluoride and nitric acid, buffered hydrofluoric acid (BHF), or the like can be used. In the case of using copper or an alloy of copper and another element, a mixed solution of cupric chloride (or ferric chloride) and hydrochloric acid (or nitric acid) or a mixed solution of phosphoric acid, nitric acid, and acetic acid can be used, for example. In the case of using chromium, a mixed solution of ceric ammonium nitrate and perchloric acid (or nitric acid) can be used, for example. Note that an etchant used in wet etching of the conductive film 107 is not limited to the above solutions. Further, in the case where the conductive film 107 has a stacked-layer structure, an appropriate etchant may be selected for each layer to perform etching or the same etchant may be selected for two or more layers to perform etching at once.

On the other hand, in the case where the conductive film 107 is etched by a dry etching method, a parallel plate reactive ion etching (RIE) method or an inductively coupled plasma (ICP) etching method can be employed, for example. In order to etch the films into desired shape, the etching condition (the amount of electric power applied to a coil-shaped electrode, the amount of electric power applied to an electrode on a substrate side, the temperature of the electrode on the substrate side, or the like) is adjusted as appropriate. As the etching gas, a gas containing chlorine such as a gas containing chlorine ($Cl_2$), boron trichloride ($BCl_3$), silicon tetrachloride ($SiCl_4$), or carbon tetrachloride ($CCl_4$) can be used. Alternatively, a gas containing fluorine such as a gas containing carbon tetrafluoride ($CF_4$), sulfur hexafluoride ($SF_6$), nitrogen trifluoride ($NF_3$), trifluoromethane ($CHF_3$), or octafluorocyclobutane ($C_4F_8$) can be used as a gas containing halogen. Further alternatively, any of these gases to which a rare gas such as helium (He) or argon (Ar) is added, or the like can be used. Any of these gases may be selected as appropriate in accordance with the material of the conductive film 107.

Although the structure of the source electrode 108a and the drain electrode 108b will be described later in detail, part of the upper surface of the stacked-layer oxide film 104 of the transistor which is exposed on the back channel side may be removed. Removal of the part of the upper surface of the stacked-layer oxide film 104 can be performed at the same time as or at a different timing from the etching of the conductive film 107. In the case of performing the removal and etching the conductive film 107 at the same time, the part of the upper surface of the stacked-layer oxide film 104 can be removed using the etchant and the etching gas which are used to etch the conductive film 107, whereby the number of manufacturing steps can be reduced.

The depth of the removed region of the stacked-layer oxide film 104 which is formed in this manner can be adjusted as appropriate by etching conditions and the materials of the oxide semiconductor layer 105 and the oxide layer 106 included in the stacked-layer oxide film 104. Alternatively, for example, with another structure in which an oxide layer with a low etching rate which functions as an etching stopper is additionally provided between the oxide semiconductor layer 105 and the oxide layer 106, the oxide layer 106 on the back channel side can be removed completely. This structure will be described in detail.

By such removal of the part of the upper surface of the stacked-layer oxide film 104, it is possible to suppress an electrical short circuit between the source electrode and the drain electrode which is due to an residue caused by the etching to form the source electrode and the drain electrode, as well as to suppress an electrical short circuit between $n^+$ regions which will be described later.

Note that the surface of the stacked-layer oxide film 104 on the back channel side which is exposed by formation of the source electrode 108a and the drain electrode 108b is preferably cleaned by an alkaline solution such as a tetramethylammonium hydroxide (TMAH) solution; an acidic solution such as a diluted hydrofluoric acid, an oxalic acid solution, or a phosphoric acid solution; or the like. With such a structure, leakage current generated between the source electrode 108a and the drain electrode 108b can be suppressed.

Prior to formation of the interlayer insulating film 109 which will be described as follows, it is preferable to perform vacuum heat treatment at about 220° C. or plasma treatment using $N_2O$ as in-situ treatment and remove an impurity on the exposed surface of the stacked-layer oxide film 104 on the back channel side.

[3.4. Formation and Heat Treatment of Oxide Insulating Film]

After that, the oxide insulating film 109a is formed over the stacked-layer oxide film 104, and the source electrode 108a and the drain electrode 108b. Then, the oxide insulating film 109b is formed over the oxide insulating film 109a (see FIG. 6A).

Note that it is preferable that after the formation of the oxide insulating film 109a, the oxide insulating film 109b be formed successively without exposure to the air. After the formation of the oxide insulating film 109a, the oxide insulating film 109b is formed successively by adjusting at least one of the flow rate of the source gas, the pressure, the high-frequency power, and the substrate temperature without exposure to the atmosphere, whereby the concentration of impurities attributed to the atmosphere at the interface between the oxide insulating film 109a and the oxide insulating film 109b can be reduced and further oxygen contained in the oxide insulating film 109b can be moved to the stacked-layer oxide film 104; accordingly, the number of oxygen vacancies in the stacked-layer oxide film 104 can be reduced.

As for the oxide insulating film 109a, a silicon oxide film or a silicon oxynitride film can be formed under the following conditions: the substrate placed in a treatment chamber of a plasma CVD apparatus which is vacuum-evacuated is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of source gases into the treatment chamber, and a high-frequency power is supplied to an electrode provided in the treatment chamber.

A deposition gas containing silicon and an oxidizing gas are preferably used as the source gas of the oxide insulating film 109a. Typical examples of the deposition gas containing silicon include silane, disilane, trisilane, and silane fluoride. As the oxidizing gas, oxygen, ozone, dinitrogen monoxide, and nitrogen dioxide can be given as examples.

Under such conditions, an oxide insulating film through which oxygen is permeated can be formed as the oxide insulating film 109a. The pressure in the treatment chamber is set to be higher than or equal to 100 Pa and lower than or equal to 250 Pa, whereby the water content of the oxide insulating film 109a is reduced; thus, variations in electrical characteristics of the transistor 100 can be reduced and a change in the threshold voltage can be suppressed. Moreover, by setting the pressure in the treatment chamber to be greater than or equal to 100 Pa and less than or equal to 250 Pa, damage to the stacked-layer oxide film 104 can be reduced when the oxide insulating film 109a is formed, so that the number of oxygen vacancies contained in the stacked-layer oxide film 104 can be reduced. Further, when the formation temperature of the oxide insulating film 109a or the oxide insulating film 109b which will be formed later is increased to, for example, a temperature higher than 220° C., part of oxygen contained in the stacked-layer oxide film 104 is released and forms an oxygen vacancy. When the formation conditions for reducing the number of defects in the oxide insulating film 109b which will be formed later are employed to increase the reliability of the transistor, the amount of oxygen which is released from the oxide insulating film 109b is reduced. Accordingly, it becomes difficult to compensate oxygen for oxygen vacancies in the stacked-layer oxide film 104. However, by setting the pressure in the treatment chamber to be greater than or equal to 100 Pa and less than or equal to 250 Pa, damage to the stacked-layer oxide film 104 at the formation of the oxide insulating film 109a can be reduced, so that oxygen vacancies in the stacked-layer oxide film 104 can be reduced even with a small amount of oxygen released from the oxide insulating film 109b.

Note that when the ratio of the amount of the oxidizing gas to the amount of the deposition gas containing silicon is 100 or higher, the hydrogen content of the oxide insulating film 109a can be reduced. Consequently, the amount of hydrogen entering the stacked-layer oxide film 104 can be reduced; thus, shift of the threshold voltage of the transistor can be suppressed.

Further, as for the oxide insulating film 109a, a silicon oxide film or a silicon oxynitride film can be formed under the following conditions: the substrate placed in a treatment chamber of a plasma CVD apparatus which is vacuum-evacuated is held at a temperature higher than or equal to 300° C. and lower than or equal to 400° C., preferably higher than or equal to 320° C. and lower than or equal to 370° C., the pressure is greater than or equal to 100 Pa and less than or equal to 250 Pa with introduction of source gases into the treatment chamber, and a high-frequency power is supplied to an electrode provided in the treatment chamber.

Under such film formation conditions, the bonding strength of silicon and oxygen becomes strong in the above substrate temperature range. Thus, as the oxide insulating film 109a, a dense and hard oxide insulating film through which oxygen is permeated, for example, a silicon oxide film or a silicon oxynitride film having an etching rate lower than or equal to 10 nm/min, preferably lower than or equal to 8 nm/min when etching is performed at 25° C. with 0.5 wt % of hydrofluoric acid can be formed.

As for the oxide insulating film 109b, a silicon oxide film or a silicon oxynitride film can be formed under the following conditions: the substrate placed in a treatment chamber of a plasma CVD apparatus which is vacuum-evacuated is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of source gases into the treatment chamber, and a high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

A deposition gas containing silicon and an oxidizing gas are preferably used as the source gas of the oxide insulating film 109b. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 109b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the oxide insulating film 109b gets higher than that of the stoichiometric composition.

However, the bonding strength of silicon and oxygen is weak in the above substrate temperature range; therefore, part of oxygen is released by heating. Thus, the oxide insulating film 109b can be formed to be an oxide insulating film that contains oxygen at a proportion higher than that of oxygen in the stoichiometric composition and from which part of oxygen is released by heating. Further, at the formation of the oxide insulating film 109b, the oxide insulating film 109a over the stacked-layer oxide film 104 functions as a protective film of the oxide insulating film 109b, and the oxide layer 106 over the oxide semiconductor layer 105 functions as a protective film of the oxide semiconductor layer 105. Consequently, the oxide insulating film 109b can be formed using the high-frequency power having a high power density while damage to the oxide semiconductor layer 105 in which a channel is mainly formed is reduced.

Note that in the film formation conditions of the oxide insulating film 109b, the flow rate of the deposition gas containing silicon relative to the oxidizing gas can be increased, whereby the number of defects in the oxide insulating film 109b can be reduced. Typically, it is possible to form an oxide insulating film in which the number of defects is small, that is, the spin density of a signal due to a dangling bond of silicon, which appears when g is 2.001, be lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Next, heat treatment is performed (see FIG. 6B). The temperature of the heat treatment is higher than or equal to 150° C. and lower than or equal to 450° C., preferably higher than or equal to 200° C. and lower than or equal to 450° C., further preferably higher than or equal to 300° C. and lower than or equal to 450° C., for example.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is less than or equal to 20 ppm, preferably less than or equal to 1 ppm, further preferably less than or equal to 10 ppb), or a rare gas (e.g., argon or helium). The atmosphere of nitrogen, oxygen, ultra-dry air, or a rare gas preferably does not contain hydrogen, water, and the like.

By the heat treatment, part of oxygen contained in the oxide insulating film 109b can be moved to the stacked-layer oxide film 104 to compensate oxygen for the oxygen vacancies in the stacked-layer oxide film 104. Consequently, the number of oxygen vacancies in the stacked-layer oxide film 104 can be reduced.

Through such heat treatment, the oxygen vacancies are compensated by supply of oxygen to the stacked-layer oxide film 104, and further the n$^+$ regions 110 are formed in the stacked-layer oxide film 104 in portions where the stacked-layer oxide film 104 is in contact with the source electrode 108a and the drain electrode 108b (see FIGS. 6B and 6C).

Through the above steps, the transistor 100 can be manufactured. The transistor manufactured in this manner has stable electric characteristics because the oxygen vacancies in the stacked-layer oxide film 104 are reduced and the number of density of states (DOS) is small.

Note that although the case where the conductive material of the portions of the source electrode 108a and the drain electrode 108b which are in contact with the stacked-layer oxide film 104 is titanium is described here, the conductive material is not limited to titanium and another conductive material such as a metal material or an alloy material may be used. For example, tungsten can be used instead of titanium. Damage to the stacked-layer oxide film 104 at the formation of the conductive film is large and an n$^+$ region is likely to be formed in the case of using tungsten, as compared to titanium; however, oxygen vacancies can be reduced even in such case by performing oxygen ion implantation or the supply of oxygen from the interlayer insulating film in a later step.

Although the variety of films such as the metal film, the semiconductor film, and the inorganic insulating film which are described above can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma to form a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. The material of the In—Ga—Zn—O film is not limited to the above combination, and triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a hafnium oxide film is formed using a deposition apparatus employing ALD, two kinds of gases, that is, ozone (O$_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed using a deposition apparatus employing ALD, two kinds of gases, that is, H$_2$O as an oxidizer and a source gas which is obtained by vaporizing a solvent and liquid containing an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, for example, an In—Ga—Zn—O film is formed using a deposition apparatus employing ALD, an In(CH$_3$)$_3$ gas and an O$_3$ gas are sequentially introduced plural times to form an In—O layer, a Ga(CH$_3$)$_3$ gas and an O$_3$ gas are introduced at a time to form a Ga—O layer, and then a Zn(CH$_3$)$_2$ gas and an O$_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing these gases. Note that although an H$_2$O gas which is obtained by bubbling with an inert gas such as Ar may be used instead of an O$_3$ gas, it is preferable to use an O$_3$ gas which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Further, instead of an In(CH$_3$)$_3$ gas, an In(C$_2$H$_5$)$_3$ gas may be used. Furthermore, a Zn(CH$_3$)$_2$ gas may be used.

[4. Transistor to be Manufactured]

Here, the structure of the transistor manufactured in a manner as described above is described in detail.

Figure 2A:
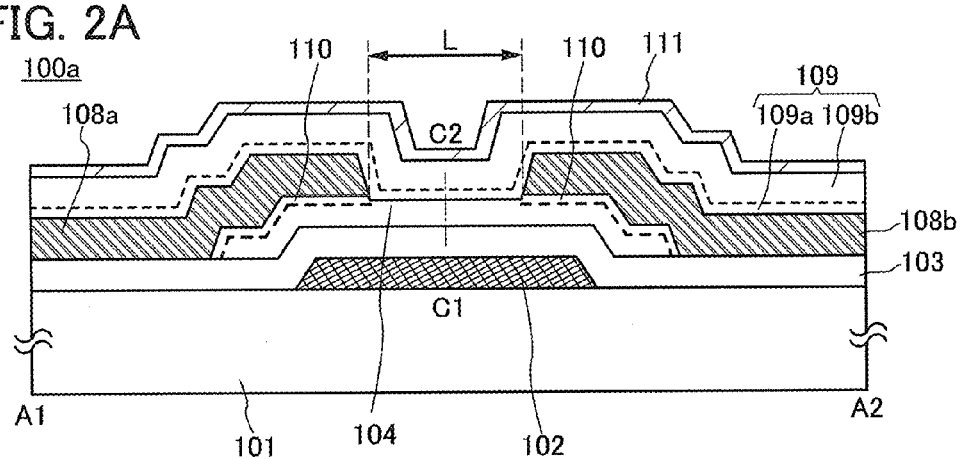
FIGS. 2A to 2C are cross-sectional views each illustrating one embodiment of a transistor.
Figure 2B:
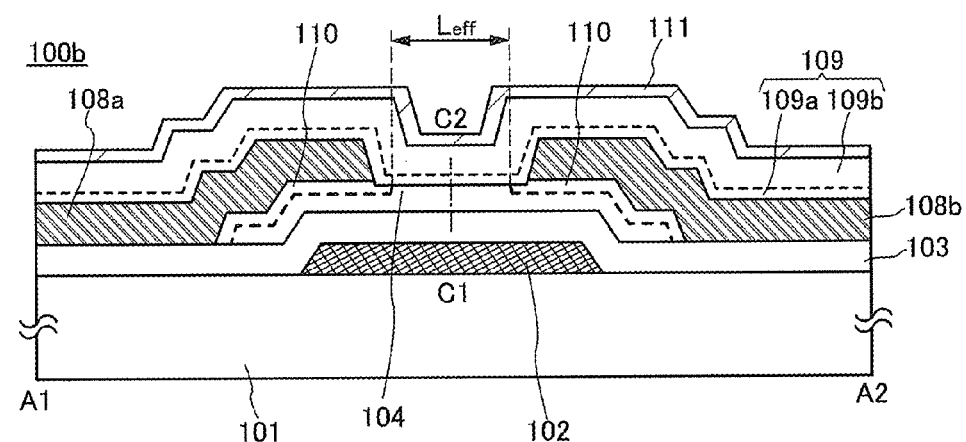
Figure 2C:
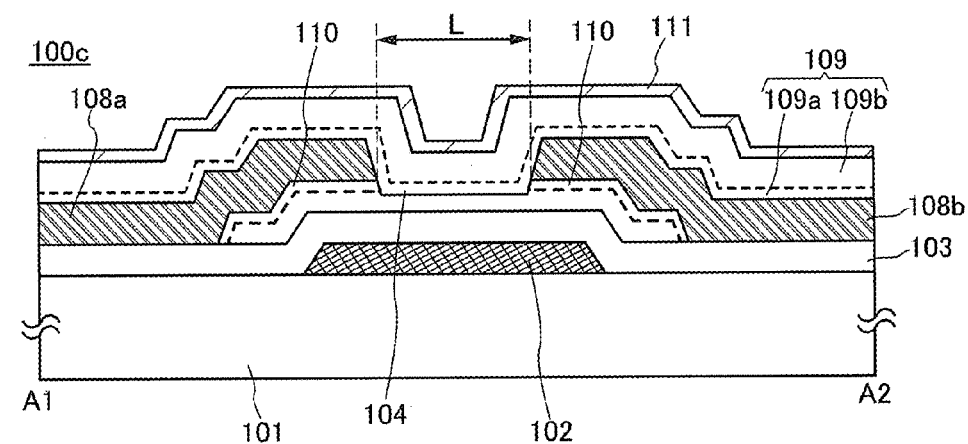

FIGS. 2A to 2C are structure examples of the transistor manufactured in the manner as described above. FIGS. 2A, 2B, and 2C which illustrate a transistor 100a, a transistor 100b, and a transistor 100c, respectively, are each a cross-sectional view taken along dashed-dotted line A1-A2 in the top view of the transistor 100 in FIG. 1A.

Note that although the stacked-layer oxide film 104 in each of the transistor 100a, the transistor 100b, and the transistor 100c illustrated in FIGS. 2A to 2C has a single-layer structure, a two-layer structure of the oxide semiconductor layer 105 and the oxide layer 106 as described above or a stacked-layer structure of three or more layers may be employed. Note that the stacked-layer oxide film 104 may be a single layer structure of the oxide semiconductor layer 105.

[4.1 Transistor Including n$^+$ Region]

The transistor 100a illustrated in FIG. 2A includes the gate electrode 102 provided over the substrate 101. The transistor 100a includes the gate insulating film 103 formed over the substrate 101 and the gate electrode 102, the stacked-layer oxide film 104 overlapping with the gate electrode 102 with the gate insulating film 103 provided therebetween, and the source electrode 108a and the drain electrode 108b in contact with the stacked-layer oxide film 104. The interlayer insulating film 109 is formed over the gate insulating film 103, the stacked-layer oxide film 104, and the source electrode 108a and the drain electrode 108b. The interlayer insulating film 109 has a stacked-layer structure of the oxide insulating film 109a and the oxide insulating film 109b. The interlayer insulating film 111 is provided over the interlayer insulating film 109.

Here, in the transistor 100a, portions of the stacked-layer oxide film 104 which are in contact with the source electrode 108a and the drain electrode 108b each include the n$^+$ region 110. With the n$^+$ regions 110, contact resistance between the stacked-layer oxide film 104 and each of the source electrode 108a and the drain electrode 108b can be reduced as described above.

The n$^+$ regions 110 of the transistor 100a are formed directly under the source electrode 108a and the drain electrode 108b and the n$^+$ regions 110 are regions of the stacked-layer oxide film 104 which have shallow depths from the interface with the source electrode 108a and the drain electrode 108b. Therefore, extension of the n$^+$ region 110 hardly occurs; thus, the channel length (L) is substantially equal to a distance between the source electrode 108a and the drain electrode 108b which corresponds to a designed channel length.

Accordingly, the distance between the source electrode 108a and the drain electrode 108b of the transistor 100a can be regarded as a channel length; therefore, a transistor having desired characteristics can be designed easily.

Figure 9A:
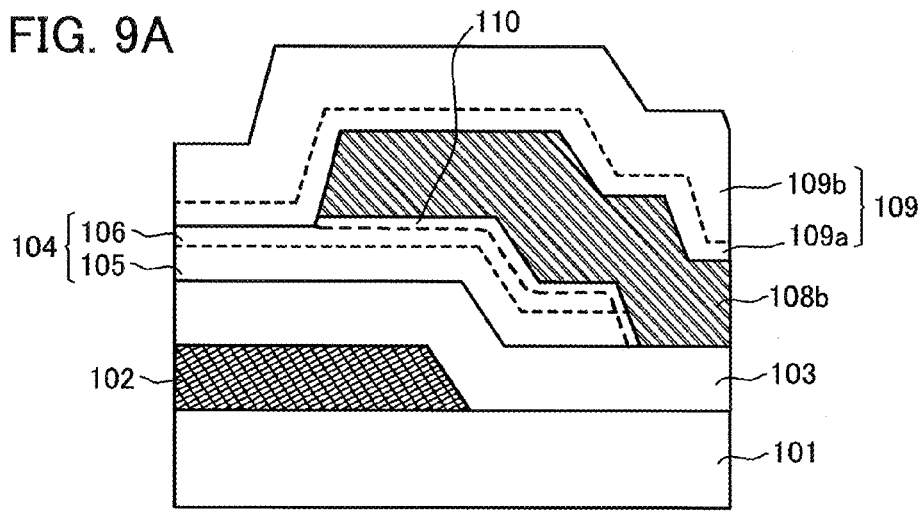
FIGS. 9A to 9C are cross-sectional views each illustrating one embodiment of a transistor.
Figure 9B:
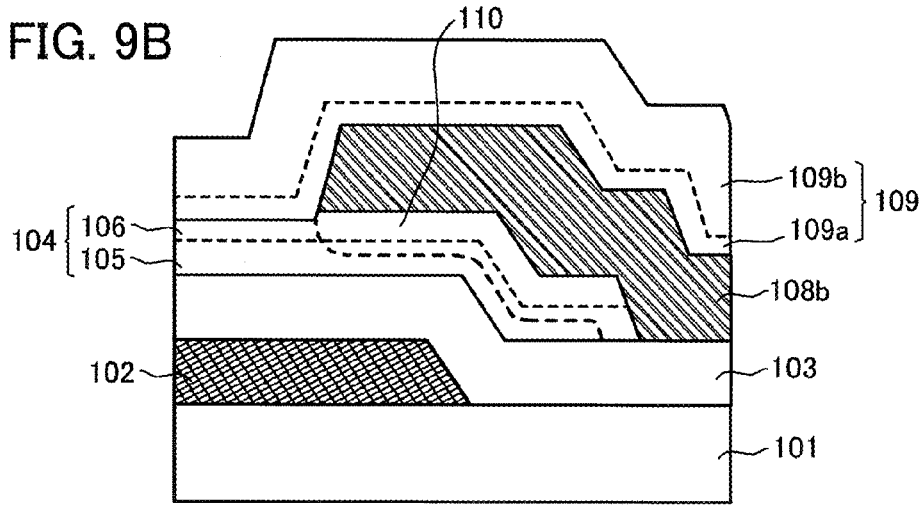
Figure 9C:
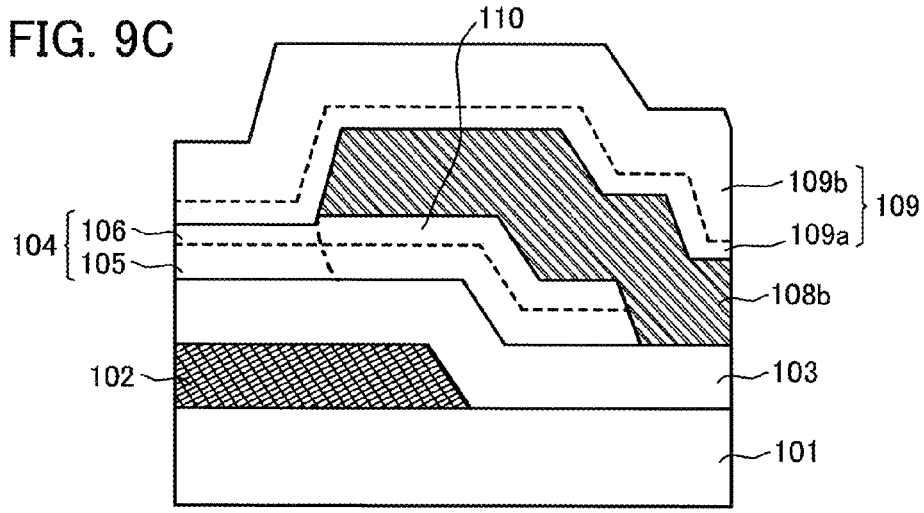

FIGS. 9A to 9C are schematic diagrams each illustrating the depth of the n$^+$ region 110 in the film thickness direction (depth direction) of the stacked-layer oxide film 104.

As illustrated in FIG. 9A, the n$^+$ region 110 may be provided only in the oxide layer 106 to have a shallow depth. In that case, the n$^+$ regions 110 may be prevented from being in contact with each other even with the use of a material or manufacturing conditions that extend the n$^+$ regions 110, which will be described later. For example, in the case where titanium is used for the portions of the source electrode 108a and the drain electrode 108b which are at least in contact with the stacked-layer oxide film 104, the n$^+$ regions 110 can be formed in such a manner that the oxide layer 106 is formed by a sputtering method at a high substrate temperature with a target containing In, Ga, and Zn in an atomic ratio of 1:3:2.

Whereas, as illustrated in FIGS. 9B and 9C, the n$^+$ region 110 may be provided inside the oxide semiconductor layer 105, or alternatively the n$^+$ region 110 may be completely formed in the stacked-layer oxide film 104 so that its thickness corresponds to that of the stacked-layer oxide film 104 so as to be in contact with the upper surface of the gate insulating film 103. Accordingly, the contact resistance between the stacked-layer oxide film 104 and each of the source electrode 108a and the drain electrode 108b can be sufficiently reduced.

[4.2. Transistor Including n$^+$ Region in Region not Overlapping with Source Electrode and Drain Electrode]

The n$^+$ regions 110 of the transistor 100b illustrated in FIG. 2B which are formed directly under the source electrode 108a and the drain electrode 108b are wider and are diffused deeply than the n$^+$ regions 110 of the transistor 100a. Therefore, the n$^+$ regions 110 are extended even in a region between the source electrode 108a and the drain electrode 108b. An effective channel length ($L_{eff}$) of the transistor 100b is shorter than the distance between the source electrode 108a and the drain electrode 108b which corresponds to a designed channel length, and the effective channel length ($L_{eff}$) is a distance between the n$^+$ regions 110 which are extended more inwardly than the source electrode 108a and the drain electrode 108b.

In this manner, the effective channel length ($L_{eff}$) can be reduced by extending the n$^+$ regions 110 more inwardly than the source electrode 108a and the drain electrode 108b. Accordingly, a transistor with a channel length shorter than that of the designed channel length between the source electrode 108a and the drain electrode 108b can be manufactured.

Note that the other components of the transistor 100b are the same as those of the transistor 100a.

Figure 10A:
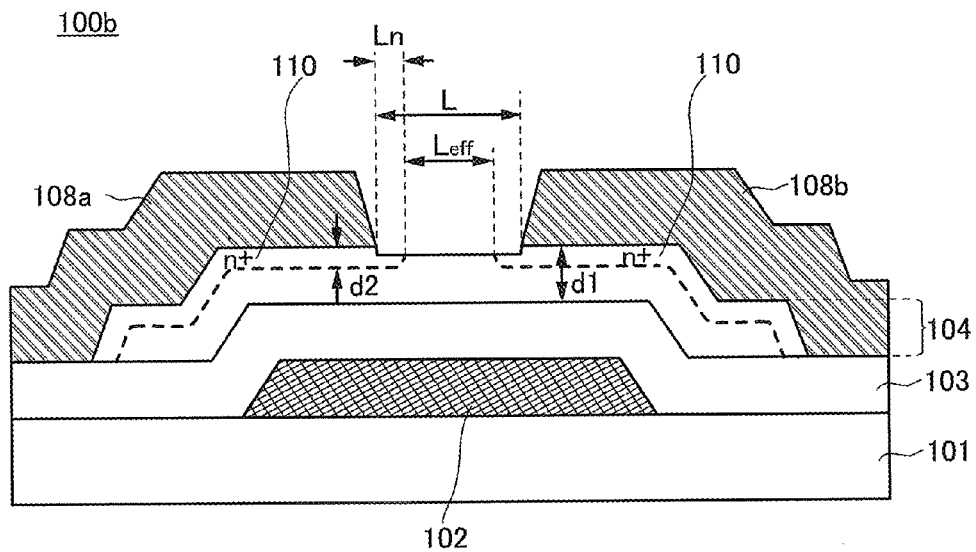
FIGS. 10A and 10B are cross-sectional views each illustrating one embodiment of a transistor.

FIG. 10A is a schematic diagram illustrating the thickness and the like of the components of the transistor 100b. The effective channel length ($L_{eff}$) of the transistor 100b is shorter than the distance between the source electrode 108a and the drain electrode 108b which corresponds to a designed channel length. This is because the end portions of the n$^+$ regions 110 are extended longer and projected more than the end portions of the source electrode 108a and the drain electrode 108b. When a difference between the end portion of the source electrode 108a or the drain electrode 108b and the end portion of the n$^+$ region 110 is set to $L_n$, the relation of $L_{eff}=L-2L_a$ is satisfied. Note that although the lengths of the projected portions of the n$^+$ regions 110 are symmetrical here, the lengths of $L_n$ may be different.

Figure 10B:
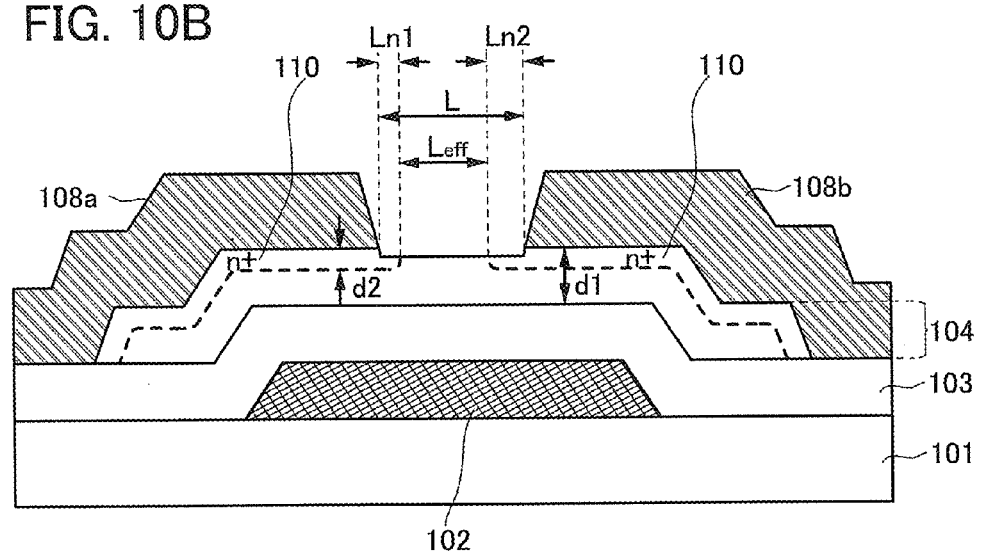

A transistor in which a difference ($L_n$) between an end portion of the source electrode 108a and an end portion of the n$^+$ region 110 is different from a difference ($L_n$) between an end portion of the drain electrode 108b and an end portion of the n$^+$ region 110 is illustrated in FIG. 10B. When the length of the projected portion of the n$^+$ region 110 on the source electrode 108a side is set to $L_n1$ and the length of the projected portion of the n$^+$ region 110 on the drain electrode 108b side is set to $L_n2$, $L_n1$ is shorter than $L_n2$ in FIG. 10B. As a manner for making the lengths of $L_n$ different from each other, for example, different materials may be used for the source electrode 108a and the drain electrode 108b or oxygen may be additionally implanted in a portion close to the end portion of one of the source electrode 108a and the drain electrode 108b.

In the above manner, in the transistor 100b in which the n$^+$ regions 110 are extended longer than the end portions of the source electrode 108a and the drain electrode 108b, the effective channel length ($L_{eff}$) is preferably less than or equal to 5 μm, further preferably less than or equal to 2 μm. Further, a depth d2 of the n$^+$ region 110 is preferably less than half of the channel length (L), that is, $L_{eff}/2$. Accordingly, contact between the n$^+$ regions 110 can be suppressed.

Figure 11A:
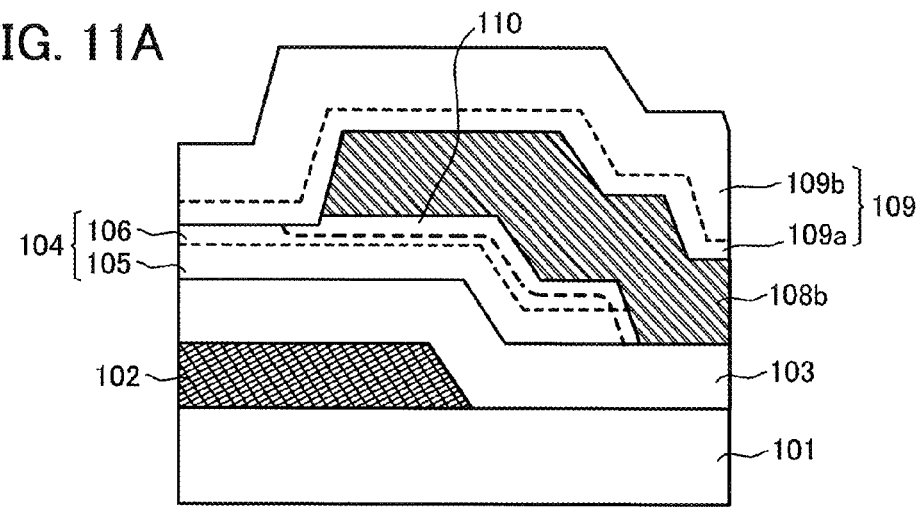
FIGS. 11A to 11C are cross-sectional views each illustrating one embodiment of a transistor.
Figure 11B:
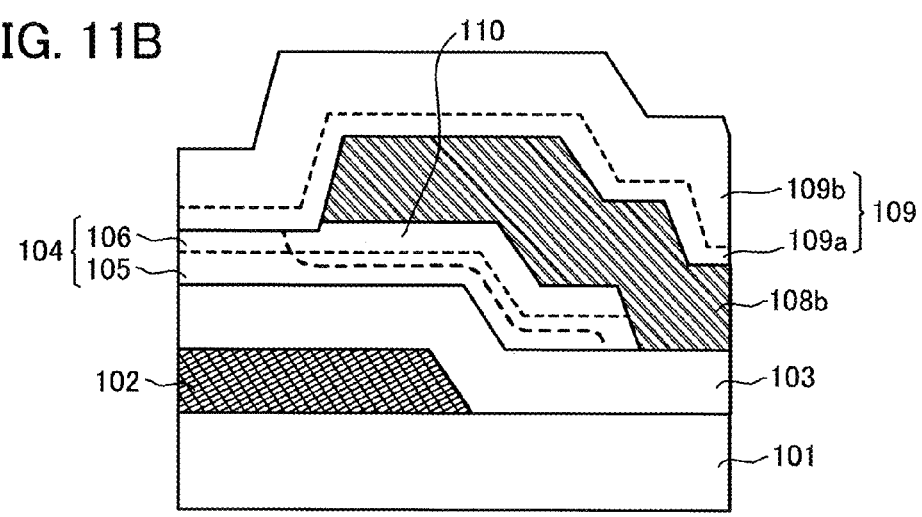
Figure 11C:
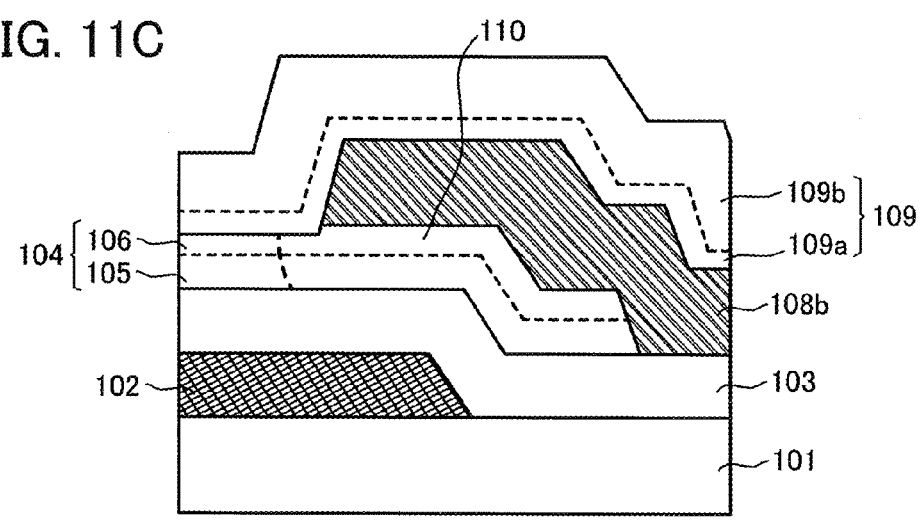

FIGS. 11A to 11C are schematic diagrams each illustrating the depth of the n⁺ region 110 in the film thickness direction (depth direction) of the stacked-layer oxide film 104.

As illustrated in FIG. 11A, the n⁺ region 110 may be provided only in the oxide layer 106 to have a shallow depth. In that case, the n⁺ regions 110 may be prevented from being in contact with each other even with the use of a material or manufacturing conditions that extend the n⁺ regions 110.

Whereas, as illustrated in FIGS. 11B and 11C, the n⁺ region 110 may be provided inside the oxide semiconductor layer 105, or alternatively the n⁺ region 110 may be completely formed in the stacked-layer oxide film 104 so that its thickness corresponds to that of the stacked-layer oxide film 104 so as to be in contact with the upper surface of the gate insulating film 103. When the n⁺ region 110 is formed deeply in the stacked-layer oxide film 104, the n⁺ region 110 can be projected sufficiently; thus, a transistor having a short effective channel length ($L_{eff}$) can be manufactured. Accordingly, the contact resistance between the stacked-layer oxide film 104 and each of the source electrode 108a and the drain electrode 108b can be sufficiently reduced.

Figure 12A:
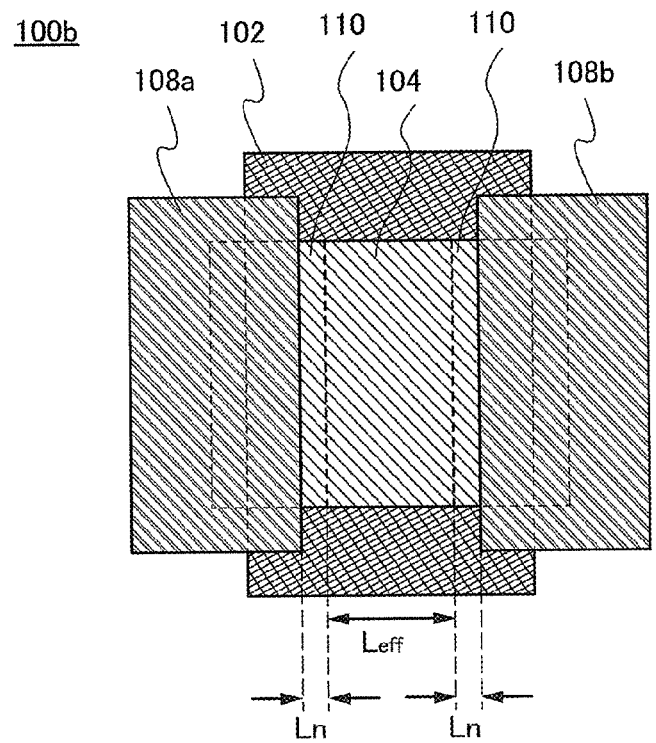
FIGS. 12A and 12B are top views each illustrating one embodiment of a transistor.

FIG. 12A is the top view of the transistor 100b. Since the n⁺ regions 110 are extended by $L_n$ in a region between the source electrode 108a and the drain electrode 108b, the effective channel length ($L_{eff}$) is shorter than the distance between the source electrode 108a and the drain electrode 108b. As illustrated in FIG. 12A, when the expansion of the n⁺ regions 110 are isotropic, the values of $L_n$ are almost the same in any place in the case where the end portions of the source electrode 108a and the drain electrode 108b each have a linear shape on the back channel side.

Figure 12B:
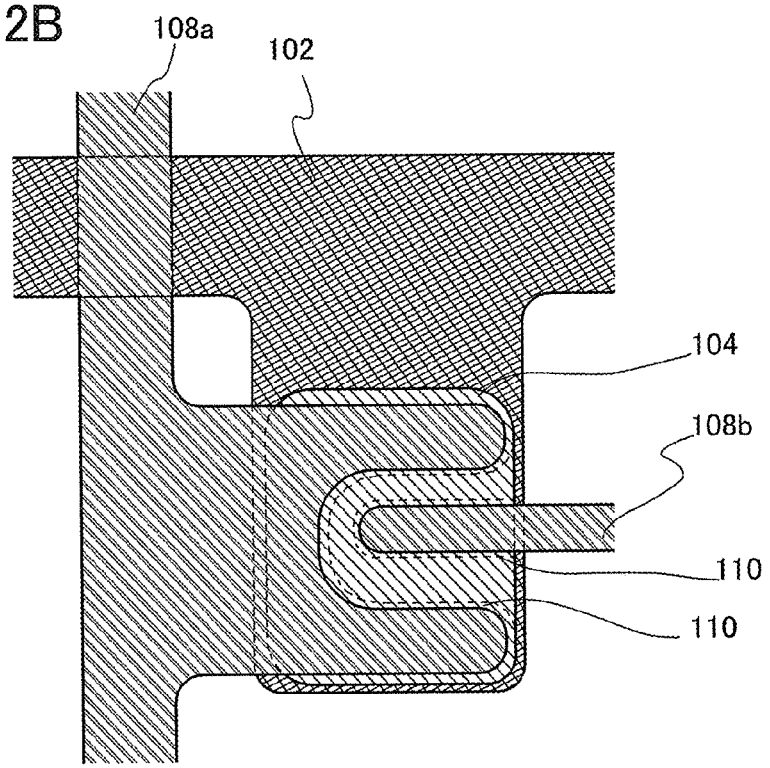

Whereas, as illustrated in FIG. 12B, in a transistor including the source electrode 108a and the drain electrode 108b whose end portions are partly curved when seen from the above, the exposed portion on the back channel side has a U shape or a shape that can be called a horseshoe shape. When the n⁺ regions 110 are extended isotropically, the n⁺ regions 110 are extended more in a portion where the source electrode 108a or the drain electrode 108b is curved inwardly.

[4.3. Transistor Including Stacked-Layer Oxide Film with Depression Portion in Region not Overlapping with Source Electrode and Drain Electrode]

The transistor 100c illustrated in FIG. 2C has a structure with a depression portion in which part of the stacked-layer oxide film 104 is removed in a region between the source electrode 108a and the drain electrode 108b.

The transistor 100c includes the n⁺ regions 110 in portions of the stacked-layer oxide film 104 which are in contact with the source electrode 108a and the drain electrode 108b in a manner similar to those of the transistor 100a and the transistor 100b. Here, the depression portion of the stacked-layer oxide film 104 is formed deeply than the depth of the n⁺ region 110. Therefore, the n⁺ region 110 under the source electrode 108a and the n⁺ region 110 under the drain electrode 108b are separated by the depression portion of the stacked-layer oxide film 104. In other words, the n⁺ regions 110 are in contact with the side surface of the depression portion of the stacked-layer oxide film 104 and are shallower than the depression portion of the stacked-layer oxide film 104.

With such a structure, the n⁺ region 110 under the source electrode 108a and the n⁺ region 110 under the drain electrode 108b can be prevented from being in contact with each other.

Note that the other components of the transistor 100c are the same as those of the transistor 100a.

Here, contact between the n⁺ region 110 under the source electrode 108a and the n⁺ region 110 under the drain electrode 108b is described with reference to FIGS. 13A to 13D.

Figure 13A:
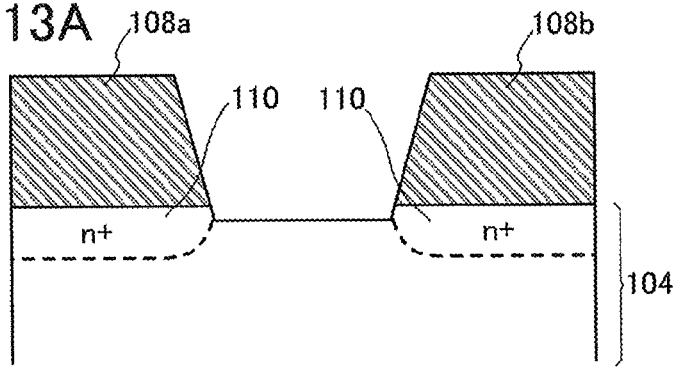
FIGS. 13A to 13D are cross-sectional views each illustrating one embodiment of a transistor.
Figure 13B:
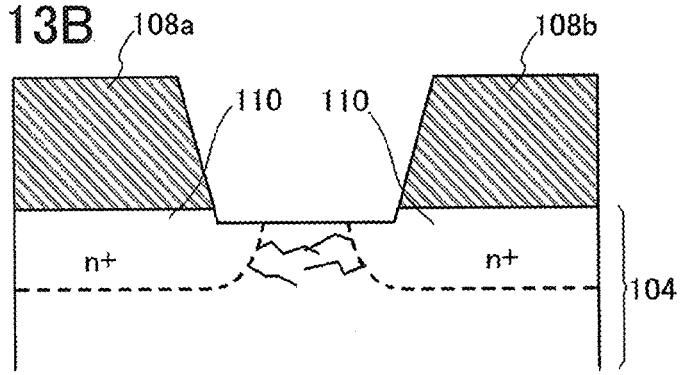
Figure 13C:
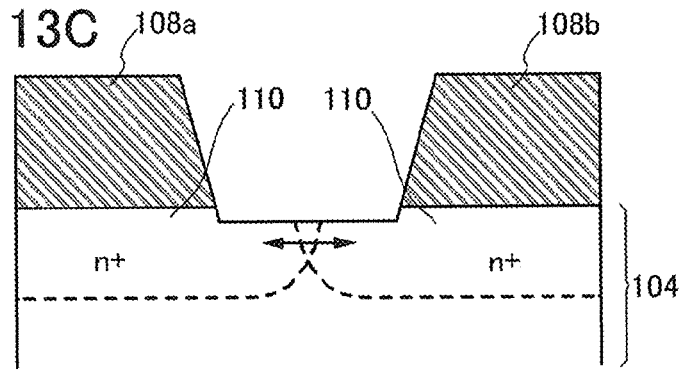

The n⁺ regions 110 in the stacked-layer oxide film 104 are formed or extended by damage due to sputtering performed to form the source electrode 108a and the drain electrode 108b, heat treatment after the formation of the interlayer insulating film, or the like (see FIG. 13A). The shape of the n⁺ region 110 depends on the material, design, manufacturing conditions, and the like of a transistor and its peripheral structure. Therefore, for example, in the case where the n⁺ regions 110 are extended too much or a channel length is designed short, the n⁺ region 110 under the source electrode 108a and the n⁺ region 110 under the drain electrode 108b come close to each other (see FIG. 13B). In that case, even when the n⁺ region 110 under the source electrode 108a and the n⁺ region 110 under the drain electrode 108b are not in complete contact with each other, the material of the source electrode 108a and the drain electrode 108b is extended to have whiskers, so that the n⁺ regions 110 are extended (see FIG. 13B), and the n⁺ regions 110 are electrically connected to each other in some cases. This phenomenon is probably likely to occur when the material of the source electrode 108a and the drain electrode 108b is titanium. Further, in the case where the n⁺ region 110 under the source electrode 108a and the n⁺ region 110 under the drain electrode 108b are in contact with each other as illustrated in FIG. 13C, desired characteristics of a transistor cannot be obtained due to an electrical short circuit between the source and the drain.

Figure 13D:
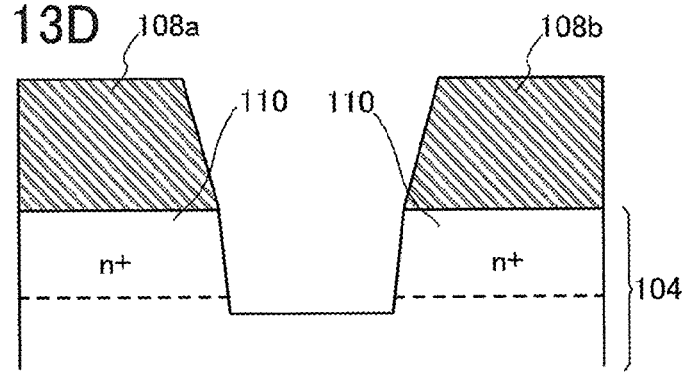

Thus, the probability that the n⁺ regions 110 are in contact with each other can be eliminated in such a manner that a depression portion is formed more deeply than the n⁺ regions 110 by partly removing the stacked-layer oxide film 104 as illustrated in FIG. 13D.

Figure 14:
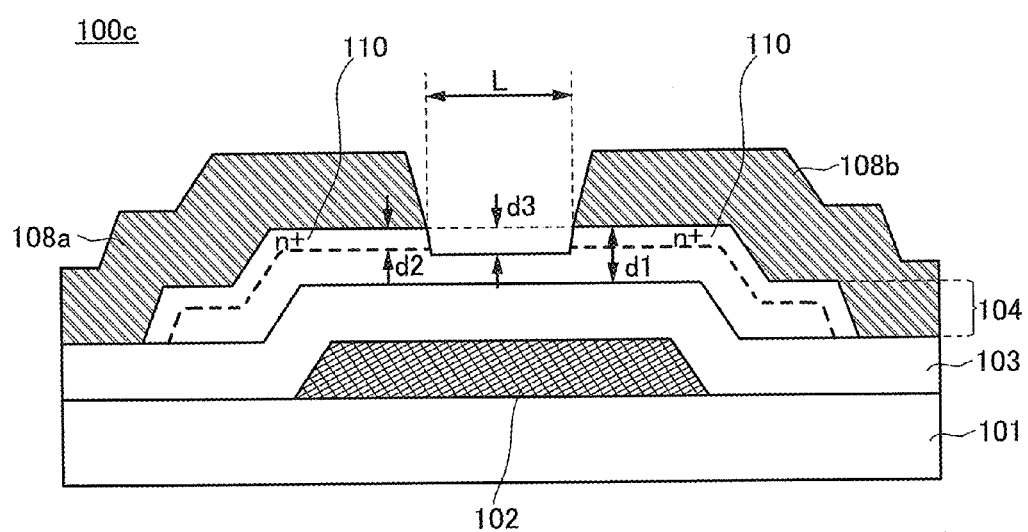
FIG. 14 is a cross-sectional view illustrating one embodiment of a transistor.

FIG. 14 is a schematic diagram illustrating the thickness and the like of the components of the transistor 100c. In the transistor 100c, a channel length (L) is substantially equal to the distance between the source electrode 108a and the drain electrode 108b. Here, when the thickness of the stacked-layer oxide film 104, the thickness of the n⁺ region 110, and the depth of the depression portion of the stacked-layer oxide film 104 are set to d1, d2, and d3, respectively, the relation of d1>d3>d2 is preferably satisfied. Note that d2 and d3 may be equal; alternatively, d2 may be larger than d3. This is because there is a small possibility that the n⁺ regions 110 are in contact with each other in a deep portion of the stacked-layer oxide film 104 even when d2 is larger than d3 because contact between the n⁺ regions 110 due to their extension is more likely to occur when the n⁺ regions 110 are closer to the source electrode 108a and the drain electrode 108b.

Here, the channel length (L) is preferably less than or equal to 5 μm, further preferably less than or equal to 2 μm. Further, the depth d2 of the n⁺ region 110 is preferably less than half of the channel length (L), that is, L/2. Accordingly, the possibility that the n⁺ regions 110 are in contact with each other can be eliminated.

Further, a region of the stacked-layer oxide film 104 where the depression portion is formed is preferably formed in the CAAC-OS layer described above. This is because in an oxide semiconductor, CAAC-OS has high processability by etching and thus can form a depression portion having a favorable side surface.

Contact between the n⁺ regions 110 can be avoided by providing the depression portion in the stacked-layer oxide film 104 in this manner; accordingly, a transistor having high reliability can be formed.

Figure 15A:
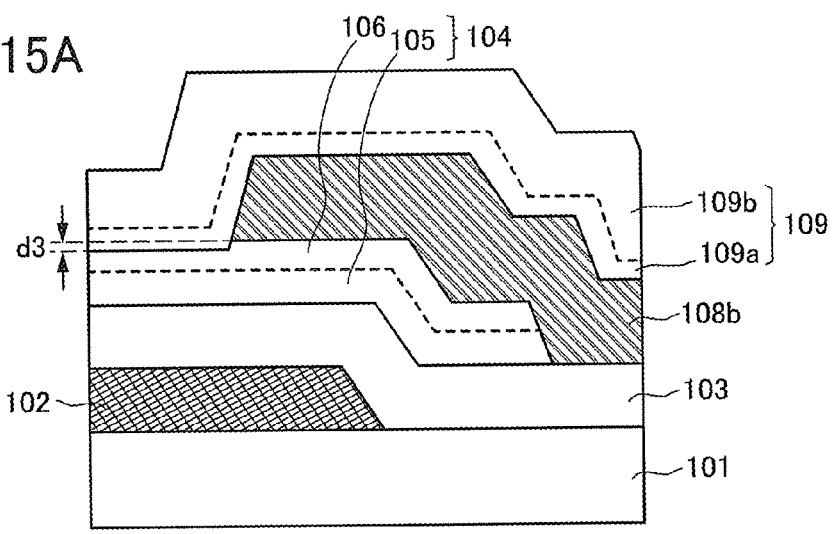
FIGS. 15A to 15C are cross-sectional views each illustrating one embodiment of a transistor.

Here, the relation between the stacked-layer oxide film 104 and the depth of the depression portion is described with reference to FIGS. 15A to 15C. FIG. 15A illustrates the structure in which the depth d3 of the depression portion of the stacked-layer oxide film 104 is made shallow and the depression portion is provided in the oxide layer 106 which is the upper layer of the stacked-oxide film 104. In that case, the upper surface of the oxide semiconductor layer 105 is protected by the oxide layer 106; therefore, the state of the interface between the oxide semiconductor layer 105 and the oxide layer 106 can be kept well. Thus, the band energy structure shown in FIG. 3A can be obtained.

Figure 15B:
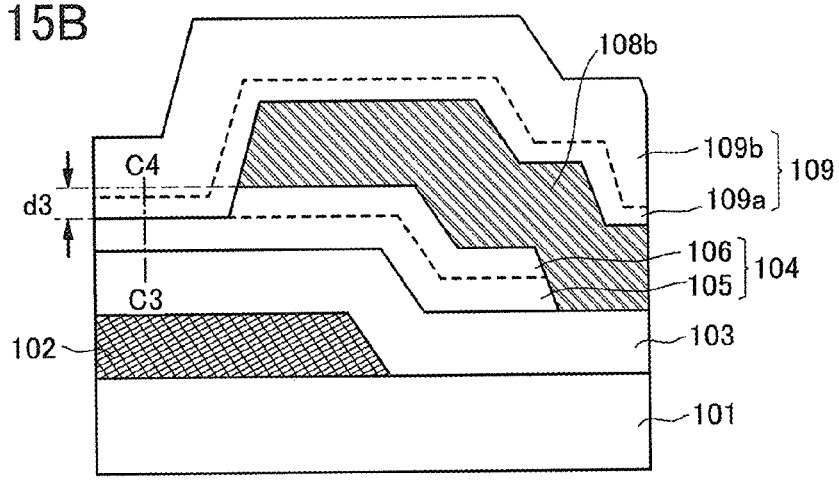

FIG. 15B illustrates the structure in the case where the depth d3 of the depression portion of the stacked-layer oxide film 104 is substantially as large as the thickness of the oxide layer 106. That is, the portion of the oxide layer 106 which does not overlap with the source electrode 108a and the drain electrode 108b is removed.

Figure 4:
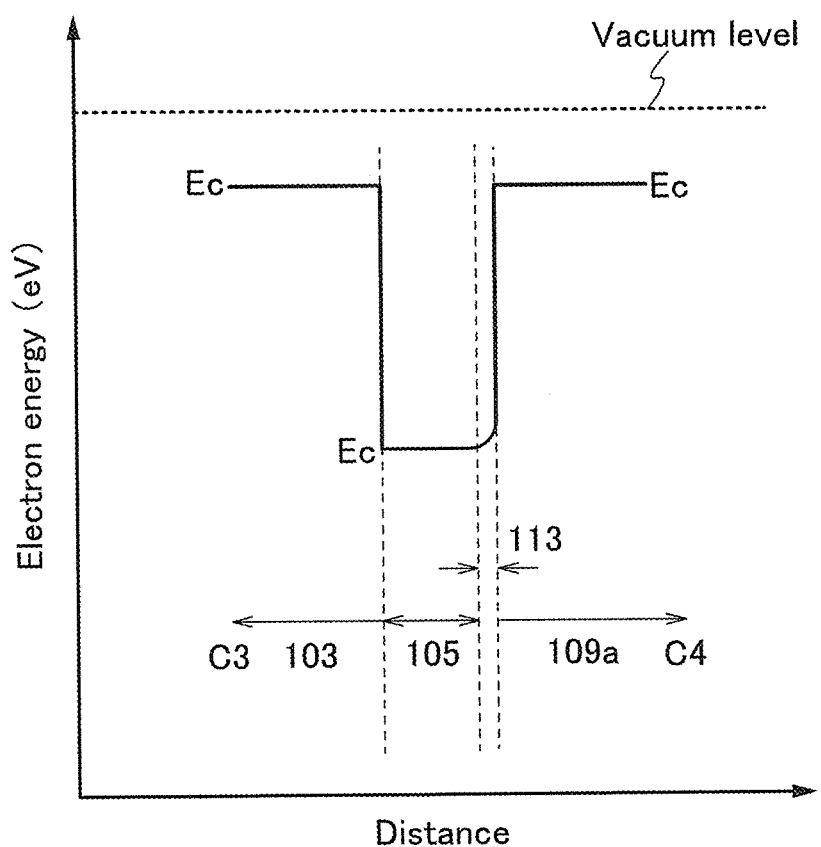
FIG. 4 is a diagram showing a band structure of a transistor.

Here, the energy band structure taken along dashed-dotted line C3-C4 in the vicinity of the stacked-layer oxide film 104 in the transistor illustrated in FIG. 15B is described with reference to FIG. 4. In FIG. 4, Ec indicates conduction band minimum energies of the gate insulating film 103, the oxide semiconductor layer 105, and the oxide insulating film 109a.

In the transistor illustrated in FIG. 15B, the upper layer of the stacked-layer oxide film 104, that is, the oxide layer 106 is etched in some cases at the formation of the source electrode 108a and the drain electrode 108b. Particularly when the oxide layer 106 is etched by a wet etching method, In is preferentially removed in some cases. Therefore, a $GaO_x$ layer or a mixed layer of the oxide semiconductor layer 105 and the oxide layer 106 (hereinafter referred to as a $GaO_x$ layer or a mixed layer 113) is formed in some cases on the upper surface of the oxide semiconductor layer 105 at the etching of the oxide layer 106.

For example, in the case where the oxide semiconductor layer 105 is an In—Ga—Zn oxide in which an atomic ratio of In to Ga and Zn is 1:1:1 or an In—Ga—Zn oxide in which an atomic ratio of In to Ga and Zn is 3:1:2 and the oxide layer 106 is an In—Ga—Zn oxide in which an atomic ratio of In to Ga and Zn is 1:3:2 or an In—Ga—Zn oxide in which an atomic ratio of In to Ga and Zn is 1:6:4, the Ga content of the oxide layer 106 is higher than that of the oxide semiconductor layer 105; therefore, the $GaO_x$ layer or the mixed layer 113 might be formed on the upper surface of the oxide semiconductor layer 105.

Accordingly, it is considered that even in the case where the oxide layer 106 is etched, the band structure shown in FIG. 4 where the conduction band minimum energy of the oxide semiconductor layer 105 on the oxide insulating film side gets higher is obtained.

Figure 15C:
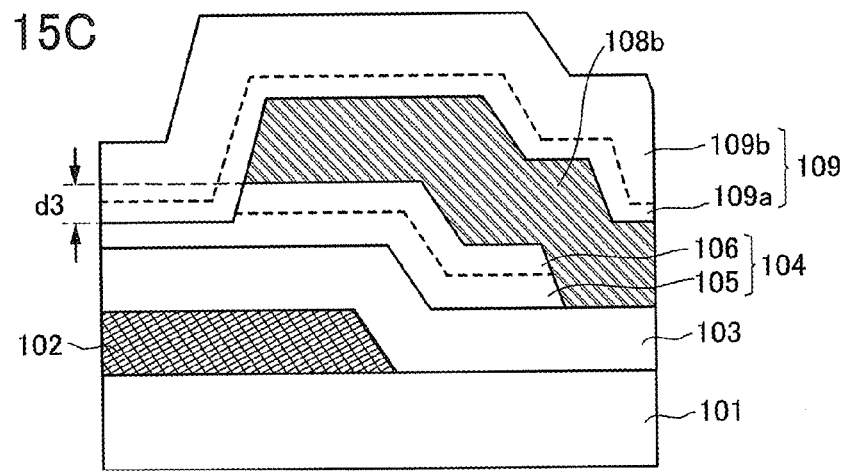

FIG. 15C illustrates the structure in the case where the depth d3 of the depression portion of the stacked-layer oxide film 104 is deep and the depression portion reaches the inside of the oxide semiconductor layer 105. As described above, the possibility that the n⁺ regions 110 are in contact with each other can be eliminated more surely in such a manner that the depression portion is formed more deeply than the depression portion having the depth d3 in FIGS. 15A and 15B.

Figure 16:
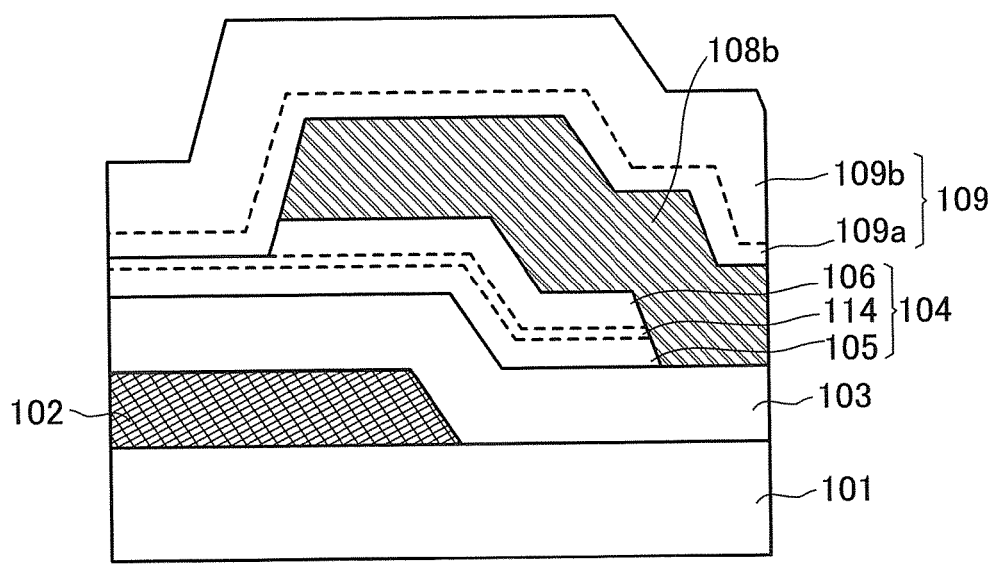
FIG. 16 is a cross-sectional view illustrating one embodiment of a transistor.

Here, as a modification example, the structure of a transistor including the stacked-layer oxide film 104 that includes an oxide layer 114 having a high etching resistance is described with reference to FIG. 16.

The oxide layer 114 having a high etching resistance is provided between the oxide semiconductor layer 105 and the oxide layer 106 in the stacked-layer oxide film 104, for example. In particular, the etching resistance of the oxide layer 114 is higher than that of the oxide layer 106. Therefore, in the case where wet etching or dry etching is performed as described above to form the depression portion in the stacked-layer oxide film 104, the oxide layer 106 on the back channel side is removed, whereas the oxide layer 114 functions as an etching stopper and is hardly etched.

With the oxide layer 114 having a high etching resistance which is provided in this manner, the oxide semiconductor layer 105 is prevented from being etched and the oxide semiconductor layer 105 can be formed to have a uniform thickness. Therefore, variations in electrical characteristics of a plurality of transistors provided over the substrate can be suppressed.

Further, it is preferable to use a material which is less likely to change the oxide layer 114 to an n-type. Such a material can prevent an electrical short circuit of the n⁺ regions 110 on the source side and the drain side.

Note that the transistor having a channel-etched and bottom-gate structure is described above. A channel-etched transistor is preferable because its manufacturing process is similar to that of a conventional transistor including amorphous silicon and its channel length can be made short. However, one embodiment of the present invention is not limited to a channel-etched transistor and a transistor having a channel-protective and bottom-gate structure in which a channel protective film is formed over the stacked-layer oxide film 104 may be employed. In the case of employing a channel-protective transistor, a channel protective film is provided at a channel formation region. Therefore, the stacked-layer oxide film over the channel formation region is not etched and thus the thickness of the stacked-layer oxide film can be designed small. Further, oxygen vacancies in the stacked-layer oxide film can be reduced by supply of oxygen from the channel protective film to the stacked-layer oxide film in such a manner that excess oxygen is contained in the channel protective film.

The transistor is not limited to a transistor having a bottom-gate structure, and alternatively a transistor having a top-gate structure may be employed or further a transistor having a dual-gate structure in which another gate electrode (back gate electrode) is provided so as to face a gate electrode with the stacked-layer oxide film 104 provided therebetween may be employed. In the case of a transistor having a dual-gate structure, the threshold voltage of the transistor can be controlled with the back gate electrode.

[5. Semiconductor Device]

A semiconductor device including the transistor described above is described. Note that a semiconductor device of one embodiment of the present invention includes, in its category, various semiconductor integrated circuits formed using semiconductor elements, such as microprocessors, image processing circuits, controllers for display modules, digital signal processors (DSPs), microcontrollers, and the like. In addition, the semiconductor device of one embodiment of the present invention includes, in its category, various devices such as display modules and RF tags formed using the above semiconductor integrated circuits.

Display modules to which the transistor described above is applied will be described below.

As a display element provided in a display module, a light-emitting element (also referred to as a light-emitting display element), a liquid crystal element (also referred to as a liquid crystal display element), or the like can be used. The light-emitting element includes, in its category, an element whose luminance is controlled by current or voltage, and specifically includes an inorganic electroluminescent (EL) element, an organic EL element, and the like. The transistor described in the above embodiment can also be applied to display modules such as electronic paper whose contrast is changed by an electric effect (e.g., electronic ink), a digital micromirror device (DMD), a plasma display panel (PDP), and a field emission display (FED). Here, a display module including an EL element and a display module including a liquid crystal element will be described as examples of display modules.

Note that the display module in this specification includes, in its category, a panel in which a display element is sealed with a substrate, a resin material, or the like and the panel further provided with an IC including a built-in scan line driver circuit or signal line driver circuit. In addition, the display module includes, in its category, panels having any of the following: a printed board provided with an arithmetic unit such as a controller, an element such as a resistor (R), a capacitor (C), or a coil (L), or the like; an optically functioning film such as a polarizing plate; a light source (including a lighting device) such as a cold cathode fluorescent lamp (CCFL) or a light-emitting diode (LED); an input device such as a resistive touch sensor or a capacitive touch sensor; a cooling device; a bezel (frame) which protects the panel; and the like.

The above-mentioned IC may be mounted on a connector such as a TAB tape, a TCP, or a COF, or may be directly mounted on a panel by a COG method.

[5.1. Display Module Including EL Element]

Figure 17:
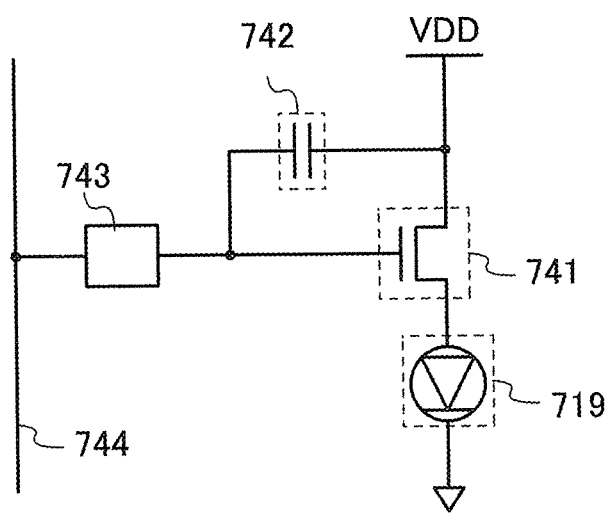
FIG. 17 is a circuit diagram of part of a pixel in a display module including an EL element.

FIG. 17 is an example of a circuit diagram of a pixel in a display module including an EL element (hereinafter referred to as an EL display module).

The EL display module illustrated in FIG. 17 includes a switch element 743, a transistor 741, a capacitor 742, and a light-emitting element 719.

A gate of the transistor 741 is electrically connected to one terminal of the switch element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switch element 743 is electrically connected to a signal line 744. The other terminal of the light-emitting element 719 is supplied with a constant potential. Note that the constant potential is a ground potential (GND) or a potential lower than the ground potential.

Note that as the transistor 741, the transistor of one embodiment of the present invention described above is used. The transistor has stable electrical characteristics. Therefore, the display module can have high display quality.

It is preferable to use a transistor as the switch element 743. The use of a transistor allows the display module to have smaller pixel area and higher resolution. As the switch element 743, the transistor of one embodiment of the present invention may be used. The use of the above transistor as the switch element 743 enables the switch element 743 to be manufactured through the same process as the transistor 741 and enables display modules to be obtained with high productivity.

Figure 18A:
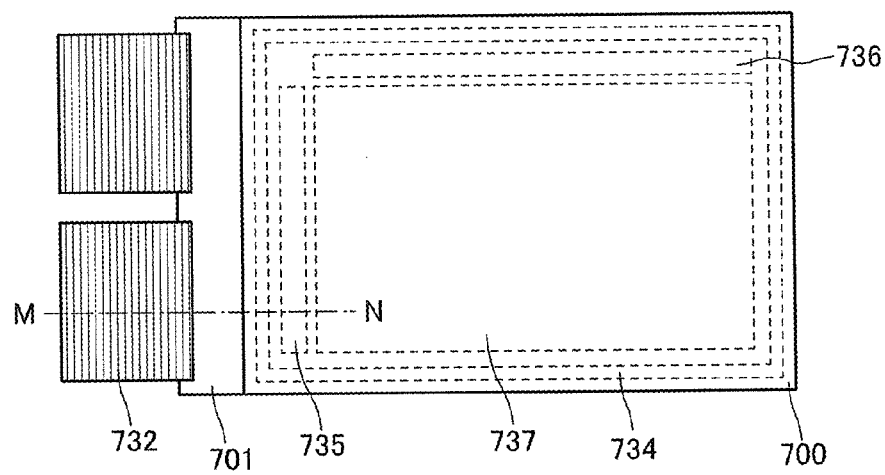
FIGS. 18A to 18C are a top view and a cross-sectional view of a display module including an EL element and a cross-sectional view of a light-emitting layer.

FIG. 18A is a top view of the EL display module. The EL display module includes a substrate 701, a substrate 700, a sealant 734, a driver circuit 735, a driver circuit 736, a pixel region 737, and a flexible printed circuit (FPC) 732. The sealant 734 is provided between the substrate 701 and the substrate 700 so as to surround the pixel region 737, the driver circuit 735, and the driver circuit 736. Note that the driver circuit 735 and/or the driver circuit 736 may be provided outside the sealant 734.

Mixture of moisture such as water causes element breakdown or malfunction of the transistor of one embodiment of the present invention and the EL element. Thus, sufficient sealing with the sealant 734 is needed to maintain and/or improve the reliability of a semiconductor device.

As the sealant 734, a resin material such as an epoxy resin, an acrylic resin, or a urethane resin can be used, for example. Such a resin material may be a heat-curable resin material, a photo-curable resin material, or a heat- and photo-curable resin material. Furthermore, as the sealant 734, a mixture of different kinds of resins, such as a mixture of an acrylic-based resin and an epoxy-based resin, may be used. Such a resin mixed with a UV initiator, a heat-curing agent, a coupling agent, or the like as appropriate is used.

As the sealant 734, instead of the above resin, frit glass including low-melting-point glass (a glass material with glass frit) can be used. In the case where frit glass is used as the sealant 734, airtightness can be increased as compared with the case where a resin is used.

In FIG. 18A, the sealant 734 is provided so as to surround the pixel region 737; the pixel region 737 may be surrounded doubly or multiply to improve reliability, and furthermore, the sealant 734 may be provided at the side of the substrate 700 or 701.

Figure 18B:
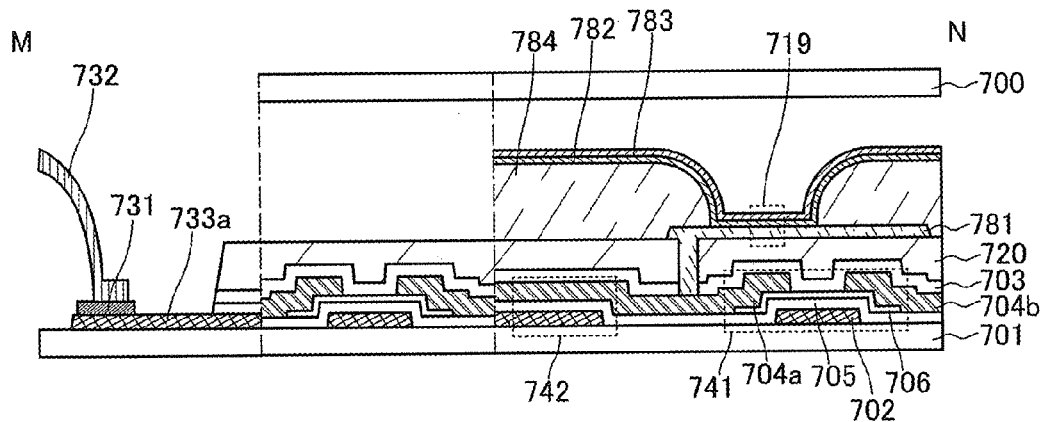

FIG. 18B is a cross-sectional view of the EL display module which is taken along dashed-dotted line M-N in FIG. 18A. The FPC 732 is electrically connected to a wiring 733a through a terminal 731. Note that the wiring 733a is formed using the same layer as a gate electrode 702.

Note that FIG. 18B illustrates an example in which the transistor 741 and the capacitor 742 are provided on the same plane. In such a structure, the capacitor 742 can be manufactured on the same plane as the gate electrode, a gate insulating film, and a source electrode (drain electrode) of the transistor 741. When the transistor 741 and the capacitor 742 are provided on the same plane in this manner, the process for manufacturing the display module can be shortened and the productivity can be improved.

FIG. 18B illustrates an example in which a transistor having the bottom-gate structure among the transistor structures of one embodiment of the present invention is used as the transistor 741. That is, the gate electrode 702 is provided over the substrate 701, and an oxide film 706 is provided over the gate electrode 702 with a gate insulating film 705 provided therebetween. The above description can be referred to for the details of the transistor 741.

An insulating film 720 is provided over the transistor 741 and the capacitor 742.

An opening reaching a source electrode 704a of the transistor 741 is provided in the insulating film 720 and a protective insulating film 703.

An electrode 781 is provided over the insulating film 720. The electrode 781 is in contact with the source electrode 704a of the transistor 741 through the opening provided in the insulating film 720 and the protective insulating film 703.

A partition 784 having an opening reaching the electrode 781 is provided over the electrode 781.

Over the partition 784, a light-emitting layer 782 is provided which is in contact with the electrode 781 in the opening provided in the partition 784.

An electrode 783 is provided over the light-emitting layer 782.

A region where the electrode 781, the light-emitting layer 782, and the electrode 783 overlap with one another serves as the light-emitting element 719.

Note that the insulating film 720 may be formed to have a single-layer structure or a stacked-layer structure using one or more insulating films containing any of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like can also be used.

Figure 18C:
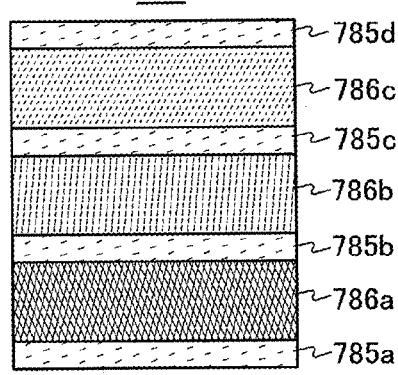

The light-emitting layer 782 is not limited to a single layer and may be provided by stacking a plurality of kinds of light-emitting layers and the like. For example, the light-emitting layer 782 may have a structure illustrated in FIG. 18C. FIG. 18C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. At this time, when the light-emitting element 719 is formed using light-emitting layers with appropriate emission colors as the light-emitting layer 786a, the light-emitting layer 786b, and the light-emitting layer 786c, the light-emitting element 719 can have high color rendering properties or high emission efficiency.

By stacking a plurality of kinds of light-emitting layers, white light may be obtained. Although not illustrated in FIG. 18B, white light may be extracted through a coloring layer.

Although the structure in which three light-emitting layers and four intermediate layers are provided is shown here, the number of light-emitting layers and the number of intermediate layers are not limited thereto and can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 can be formed with only the intermediate layer 785a, the light-emitting layer 786a, the intermediate layer 785b, the light-emitting layer 786b, the light-emitting layer 786c, and the intermediate layer 785d, and the intermediate layer 785c may be omitted.

In addition, the intermediate layer can be formed using a stacked-layer structure of a hole-injection layer, a hole-transport layer, an electron-transport layer, an electron-injection layer, and the like. Note that not all of these layers need to be provided as the intermediate layer. These layers may be selected and provided as appropriate. Note that a plurality of layers having similar functions may be provided. Further, a carrier generation layer, an electron-relay layer, or the like may be added as appropriate as an intermediate layer.

As the electrode 781, a conductive film having a visible light transmitting property may be used. The phrase "having a visible light transmitting property" means that the average transmittance in the visible light region (e.g., the wavelength range from 400 nm to 800 nm) is 70% or higher, particularly 80% or higher.

As the electrode 781, an oxide film such as an In—Zn—W oxide film, an In—Sn oxide film, an In—Zn oxide film, an In oxide film, a Zn oxide film, or a Sn oxide film may be used, for example. A slight amount of Al, Ga, Sb, F, or the like may be added to the above oxide film. Further, a metal thin film having a thickness small enough to transmit light (preferably, approximately 5 nm to 30 nm) can also be used. For example, an Ag film, a Mg film, or an Ag—Mg alloy film having a thickness of 5 nm may be used. Further, graphene may be used.

Alternatively, as the electrode 781, a film capable of efficiently reflecting visible light is preferable. For example, a film containing lithium, aluminum, titanium, magnesium, lanthanum, silver, silicon, or nickel may be used as the electrode 781.

As the electrode 783, a film selected from the films given as examples of the electrode 781 can be used. Note that in the case where the electrode 781 has a visible light transmitting property, it is preferable that the electrode 783 efficiently reflect visible light. In the case where the electrode 781 efficiently reflect visible light, the electrode 783 preferably has a visible light transmitting property.

Note that the electrode 781 and the electrode 783 provided in the structure illustrated in FIG. 18B may be interchanged. It is preferable to use a conductive film having a high work function for the electrode which functions as an anode, and a conductive film having a low work function for the electrode which functions as a cathode. Note that in the case where a carrier generation layer is provided in contact with the anode, a variety of conductive films can be used for the anode regardless of their work functions.

For the partition 784, the protective insulating film 703 can be referred to. A resin film of a polyimide resin, an acrylic resin, an epoxy resin, a silicone resin, or the like can also be used.

The transistor 741 connected to the light-emitting element 719 has stable electrical characteristics. Therefore, a display module having high display quality can be provided.

Figure 19A:
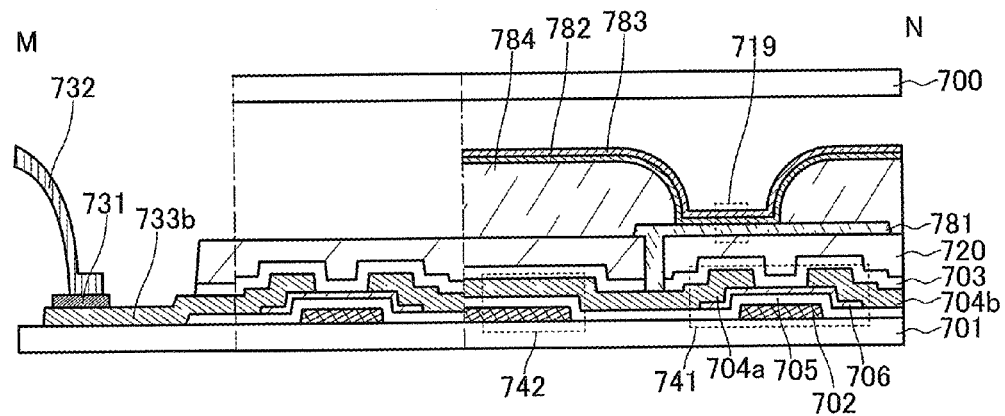
FIGS. 19A and 19B are each a cross-sectional view of a display module including an EL element.
Figure 19B:
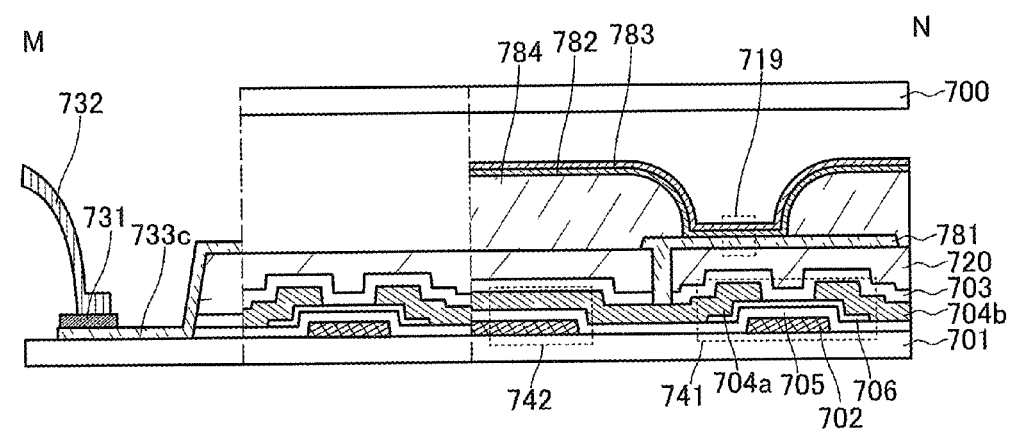

FIGS. 19A and 19B are each an example of a cross-sectional view of an EL display module which is partly different from that in FIG. 18B. Specifically, a wiring connected to the FPC 732 is different. In FIG. 19A, the FPC 732 is connected to a wiring 733b through the terminal 731. The wiring 733b is formed using the same layer as the source electrode 704a and a drain electrode 704b. In FIG. 19B, the FPC 732 is electrically connected to a wiring 733c through the terminal 731. The wiring 733c is formed using the same layer as the electrode 781.

[5.2. Display Module Including Liquid Crystal Element]

Next, a display module including a liquid crystal element (hereinafter referred to as a liquid crystal display module) is described.

Figure 20:
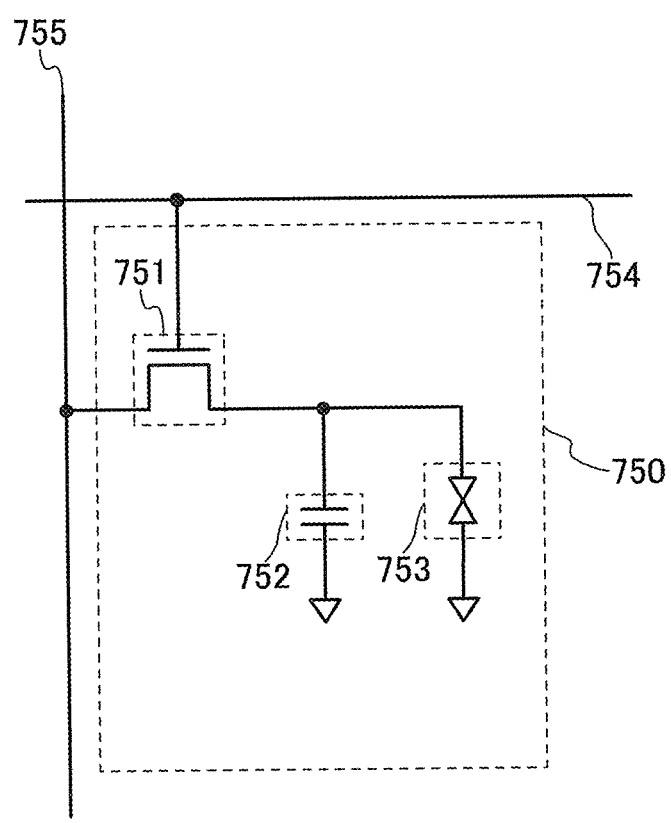
FIG. 20 is a circuit diagram of a pixel of a display module including a liquid crystal element.

FIG. 20 is a circuit diagram illustrating a structural example of a pixel of a liquid crystal display module. A pixel 750 illustrated in FIG. 20 includes a transistor 751, a capacitor 752, and an element 753 in which a space between a pair of electrodes is filled with a liquid crystal (hereinafter also referred to as a liquid crystal element).

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring supplied with a common potential.

One electrode of the liquid crystal element 753 is electrically connected to the other of the source and the drain of the transistor 751, and the other electrode of the liquid crystal element 753 is electrically connected to the wiring supplied with the common potential. Note that the common potential supplied to the wiring electrically connected to the other electrode of the capacitor 752 and the common potential supplied to the other electrode of the liquid crystal element 753 may be different potentials.

Figure 21A:
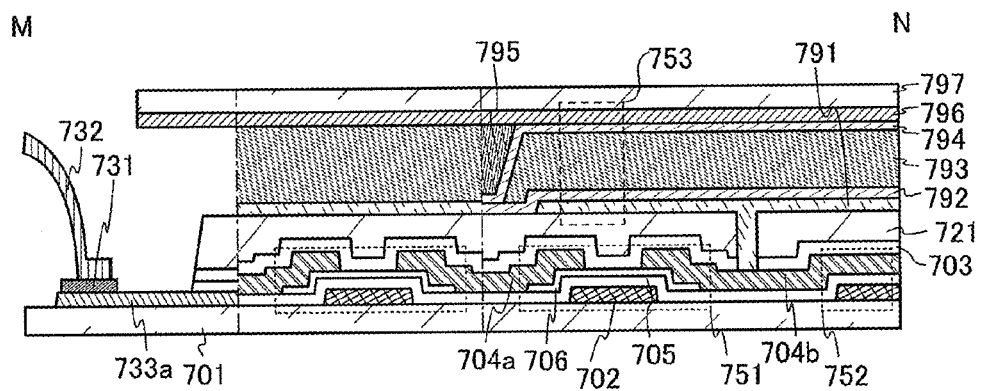
FIGS. 21A to 21C are each a cross-sectional view of a display module including a liquid crystal element.

Note that a top view of the liquid crystal display module is substantially similar to that of the display module including the EL element. A cross-sectional view of the liquid crystal display module which is taken along dashed-dotted line M-N in FIG. 18A, is illustrated in FIG. 21A. In FIG. 21A, the FPC 732 is electrically connected to the wiring 733a through the terminal 731. Note that the wiring 733a is formed using the same layer as the gate electrode 702.

FIG. 21A illustrates an example in which the transistor 751 and the capacitor 752 are provided on the same plane. In such a structure, the capacitor 752 can be formed on the same plane as the gate electrode, a gate insulating film, and a source electrode (drain electrode) of the transistor 751. When the transistor 751 and the capacitor 752 are provided on the same plane in this manner, the process for manufacturing the display module can be shortened and the productivity can be improved.

As the transistor 751, the transistor of one embodiment of the present invention can be used. FIG. 21A illustrates an example in which a transistor having a bottom-gate structure is used. That is, the gate electrode 702 is provided over the substrate 701, and the oxide film 706 is provided over the gate electrode 702 with the gate insulating film 705 provided therebetween. The above description can be referred to for the details of the transistor 751.

Note that the transistor 751 can have extremely low off-state current. Therefore, a charge held by the capacitor 752 does not leak easily, and a voltage applied to the liquid crystal element 753 can be maintained for a long time. Thus, by turning off the transistor 751 when a moving image with little motion or a still image is displayed, an electrode for operating the transistor 751 becomes unnecessary, and the display module can have low power consumption.

An insulating film 721 is provided over the transistor 751 and the capacitor 752.

An opening reaching the source electrode 704a of the transistor 741 is provided in the insulating film 721 and the protective insulating film 703.

An electrode 791 is provided over the insulating film 721. The electrode 791 is in contact with the drain electrode 704b of the transistor 751 through the opening provided in the insulating film 721 and the protective insulating film 703.

An insulating film 792 functioning as an alignment film is provided over the electrode 791.

A liquid crystal layer 793 is provided over the insulating film 792, and an insulating film 794 functioning as an alignment film is provided over the liquid crystal layer 793.

A spacer 795 is provided over the insulating film 794.

An electrode 796 is provided over the spacer 795 and the insulating film 794, and a substrate 797 is provided over the electrode 796.

Note that the insulating film 721 may be formed to have a single-layer structure or a stacked-layer structure using one or more insulating films containing any of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide. A resin film of a polyimide resin, an acrylic resin, an epoxy resin, a silicone resin, or the like can also be used.

For the liquid crystal layer 793, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal exhibits a cholesteric phase, a smectic phase, a cubic phase, a chiral nematic phase, an isotropic phase, or the like depending on conditions.

Note that a liquid crystal exhibiting a blue phase may be used for the liquid crystal layer 793. In that case, the insulating film 792 and the insulating film 794 which serve as alignment films can be omitted from the structure. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal material exhibiting a blue phase and a chiral material has a short response time of 1 msec or less, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of a display panel in the manufacturing process can be reduced. Thus, the display panel can be provided with high productivity. Accordingly, the liquid crystal display module can be provided with high productivity. A transistor formed using an oxide film has a possibility that the electrical characteristics of the transistor may be changed significantly by the influence of static electricity and may deviate from the designed range. Therefore, it is more effective to use a liquid crystal composition exhibiting a blue phase for the liquid crystal display module including the transistor formed using an oxide.

The specific resistivity of the liquid crystal material is higher than or equal to $1 \times 10^9 \Omega \cdot cm$, preferably higher than or equal to $1 \times 10^{11} \Omega \cdot cm$, further preferably higher than or equal to $1 \times 10^{12} \Omega \cdot cm$. Note that the value of the specific resistivity is measured at 20° C.

The size of a storage capacitor formed in the liquid crystal display module is set considering the leakage current of the transistor provided in a pixel portion, or the like so that charge can be held for a predetermined period. The size of the storage capacitor may be set considering the off-state current of the transistor, or the like. When a transistor of one embodiment of the present invention is used, it is sufficient to provide a storage capacitor having a capacitance that is ⅓ or less, preferably ⅕ or less, of liquid crystal capacitance of each pixel.

In the transistor of one embodiment of the present invention, the current in an off state (off-state current) can be controlled to be low. Accordingly, an electric signal such as an image signal can be held for a longer period, and a writing interval can be set longer in an on state. Accordingly, the frequency of refresh operation can be reduced, which is effective in suppressing power consumption.

The transistor of one embodiment of the present invention can have relatively high field-effect mobility and thus can operate at high speed. For example, when such a transistor which can operate at high speed is used for a liquid crystal display module, a switching transistor in a pixel portion and a transistor in a driver circuit portion can be formed over one substrate. That is, since a semiconductor device formed using a silicon wafer or the like is not additionally needed as a driver circuit, the number of components of the semiconductor device can be reduced. In addition, by using a transistor which can operate at high speed also in a pixel portion, a high-quality image can be provided.

For the liquid crystal display module, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

Alternatively, a normally black liquid crystal display module such as a transmissive liquid crystal display module utilizing a vertical alignment (VA) mode may be used. The vertical alignment mode is a method of controlling alignment of liquid crystal molecules of a liquid crystal display panel, in which liquid crystal molecules are aligned in a vertical direction with respect to a panel surface when no voltage is applied. Some examples of the vertical alignment mode can be given. For example, a multi-domain vertical alignment (MVA) mode, a patterned vertical alignment (PVA) mode, or an advanced super view (ASV) mode can be used. Moreover, it is possible to use a method called domain multiplication or multi-domain design, in which a pixel is divided into some regions (subpixels) and molecules are aligned in different directions in their respective regions.

As the electrode 791, a conductive film having a visible light transmitting property may be used.

As the electrode 791, an oxide film such as an In—Zn—W oxide film, an In—Sn oxide film, an In—Zn oxide film, an In oxide film, a Zn oxide film, or a Sn oxide film may be used, for example. A slight amount of Al, Ga, Sb, F, or the like may be added to the oxide film. Further, a metal thin film having a thickness small enough to transmit light (preferably, approximately 5 nm to 30 nm) can also be used. For example, an Ag film, a Mg film, or an Ag—Mg alloy film having a thickness of 5 nm may be used. Further, graphene may be used.

Alternatively, as the electrode 791, a film capable of efficiently reflecting visible light is preferable. For example, a film containing aluminum, titanium, chromium, copper, molybdenum, silver, tantalum, or tungsten may be used as the electrode 791.

As the electrode 796, a film selected from the films given as examples of the electrode 791 can be used. Note that in the case where the electrode 791 has a visible light transmitting property, the electrode 796 is preferably capable of efficiently reflecting visible light. In the case where the electrode 791 is capable of efficiently reflecting visible light, the electrode 796 preferably has a visible light transmitting property.

Note that the electrode 791 and the electrode 796 provided in the structure illustrated in FIG. 21A may be interchanged.

For the insulating film 792 and the insulating film 794, a material selected from organic compounds or inorganic compounds may be used.

For the spacer 795, a material selected from organic compounds such as an acrylic resin or inorganic compounds such as silica may be used. Note that the spacer 795 can have any of various shapes such as a columnar shape or a spherical shape.

A region where the electrode 791, the insulating film 792, the liquid crystal layer 793, the insulating film 794, and the electrode 796 overlap with one another serves as the liquid crystal element 753.

For the substrate 797, glass, a resin, a metal, or the like may be used. The substrate 797 may have flexibility.

Although not illustrated, a black matrix (a light-blocking layer) and color filters for three colors of RGB (R, G, and B represent red, green, and blue, respectively) can be provided over the substrate 797.

On the sides of the substrate 701 and the substrate 797 which are opposite to the sides facing the liquid crystal layer 793, an optical member (an optical substrate) such as a polarizing member, a retardation member, or an anti-reflection member, or the like may be provided as appropriate. For example, circular polarization may be obtained by using a polarizing substrate and a retardation substrate.

As a display method in the pixel portion, a progressive method, an interlace method, or the like can be employed. Further, color components controlled in a pixel at the time of color display are not limited to the three colors of R, G, and B. For example, R, G, B, and W (W represents white); or R, G, B, and one or more of yellow, cyan, magenta, and the like can be used. Note that the sizes of display regions may be different between respective dots of color components. Note that the display module is not limited to a display module for color display, and can also be used for a liquid crystal display module for monochrome display.

Figure 21B:
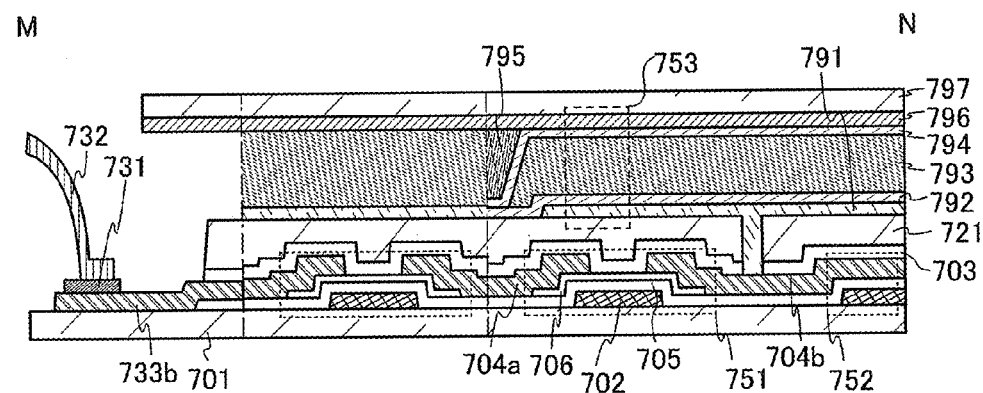
Figure 21C:
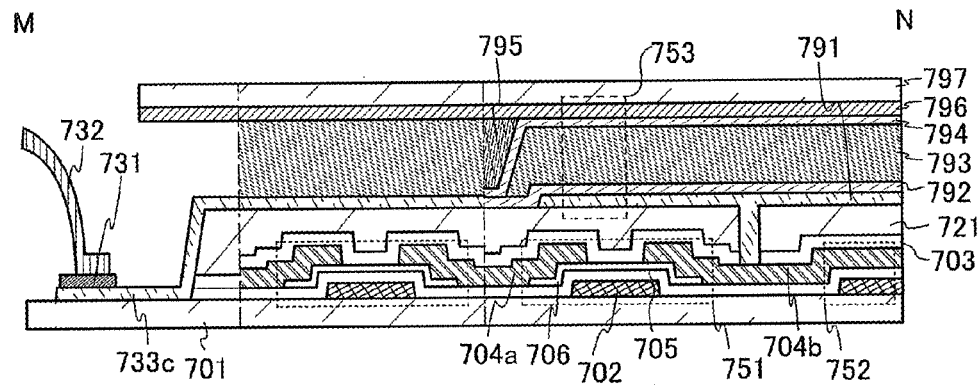

FIGS. 21B and 21C are each an example of a cross-sectional view of a liquid crystal display module which is partly different from that in FIG. 21A. Specifically, a wiring connected to the FPC 732 is different. In FIG. 21B, the FPC 732 is connected to the wiring 733b through the terminal 731. The wiring 733b is formed using the same layer as the source electrode 704a and the drain electrode 704b. In FIG. 21C, the FPC 732 is connected to the wiring 733c through the terminal 731. The wiring 733c is formed using the same layer as the electrode 791.

The transistor 751 connected to the liquid crystal element 753 has stable electrical characteristics. Therefore, a display module having high display quality can be provided. In addition, the transistor 751 can have extremely low off-state current; thus, a liquid crystal display module with low power consumption can be provided.

Here, as an example of a display mode of the above-described liquid crystal display module, a display module including a FFS mode liquid crystal element is described with reference to FIGS. 22A to 22C.

Figure 22A:
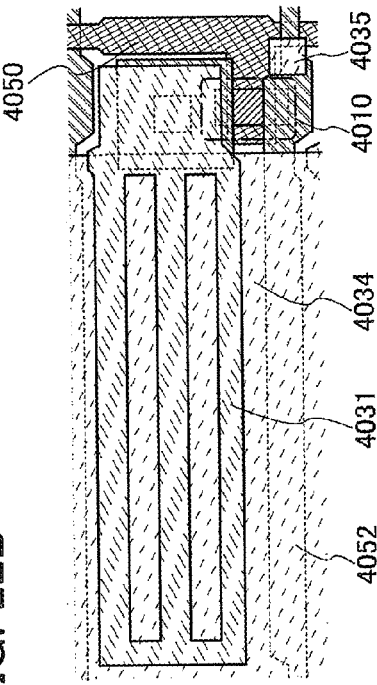
FIGS. 22A to 22C illustrate a display module including an FFS mode liquid crystal element.

FIG. 22A is a plan view of a liquid crystal display module. In FIG. 22A, a sealant 4005 is provided so as to surround a pixel portion 4002 and a scan line driver circuit 4004 which are provided over a substrate 4001. A substrate 4006 is provided over the pixel portion 4002 and the scan line driver circuit 4004. Consequently, the pixel portion 4002 and the scan line driver circuit 4004 are sealed together with a liquid crystal element, by the substrate 4001, the sealant 4005, and the substrate 4006. In FIG. 22A, an IC chip or a signal line driver circuit 4003 which is formed using a single crystal semiconductor film or a polycrystalline semiconductor film over a substrate separately prepared is mounted in a region that is different from the region surrounded by the sealant 4005 over the substrate 4001. Various signals and potentials are supplied to the pixel portion 4002 from a FPC 4018 through the signal line driver circuit 4003 and the scan line driver circuit 4004.

Although FIG. 22A illustrates an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that there is no particular limitation on the method for connecting a separately formed driver circuit, and a chip on glass (COG) method, a wire bonding method, a tape automated bonding (TAB) method, or the like can be used. FIG. 22A illustrates an example in which the signal line driver circuit 4003 is mounted by a COG method.

The pixel portion and the scan line driver circuit which are provided over the substrate include a plurality of transistors; the transistor of one embodiment of the present invention can be applied thereto.

Figure 22B:
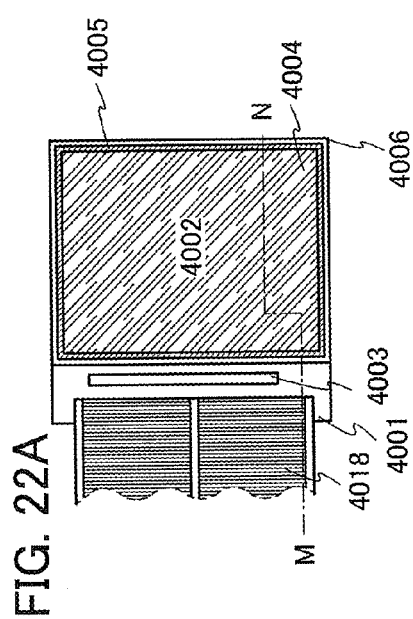

FIG. 22B illustrates an example of a pixel structure of the pixel portion 4002 where an FFS mode is employed. FFS is a display mode in which liquid crystal molecules are aligned by a fringe electric field formed by a common electrode (hereinafter referred to as a first electrode) and a pixel electrode (hereinafter referred to as a second electrode) which are parallel and overlap with each other over a substrate. Increases in aperture ratio and viewing angle of a liquid crystal display module can be achieved.

A pixel includes an intersection of a wiring 4050 electrically connected to a gate electrode of a transistor 4010 and a wiring 4052 electrically connected to one of a source electrode and a drain electrode of the transistor 4010. The wiring 4050 functions as a gate signal line (scan line), and the wiring 4052 functions as a source signal line. In addition, the pixel includes a first electrode 4034 isolated from other pixels or shared with other pixels and a second electrode 4031 isolated from other pixels and electrically connected to the other of the source electrode and the drain electrode of the transistor 4010. The second electrode 4031 is provided so as to overlap with the first electrode 4034 and provided with a plurality of openings which form slits.

Figure 22C:
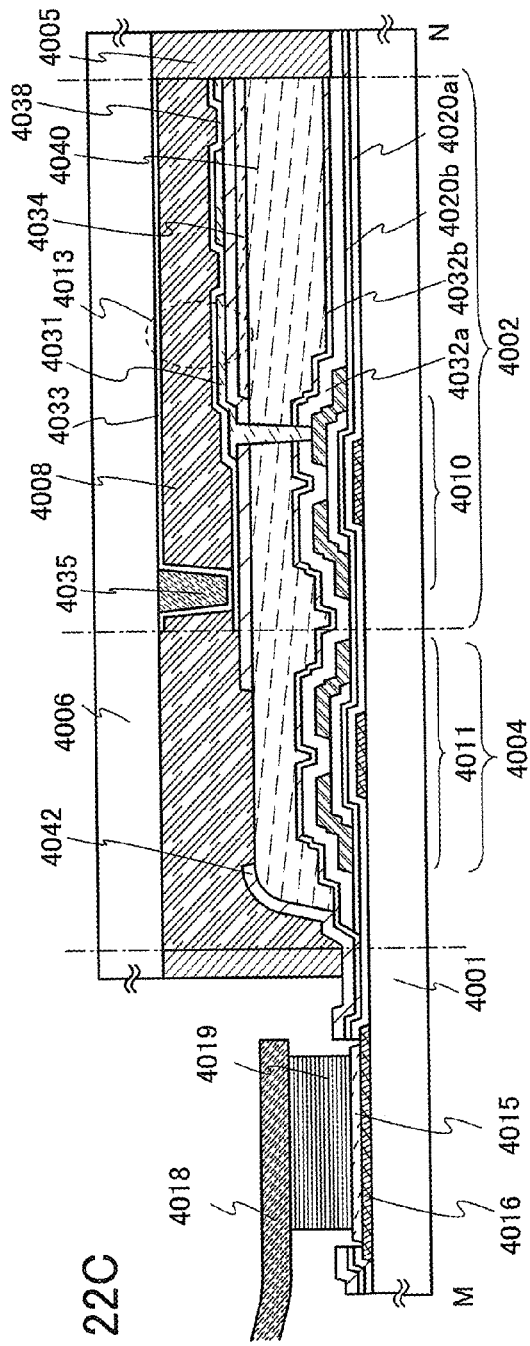

FIG. 22C corresponds to a cross-sectional view taken along the line M-N in FIG. 22A. In the liquid crystal display module, the transistor 4010 provided in the pixel portion 4002 is electrically connected to the liquid crystal element.

As illustrated in FIGS. 22A and 22C, the liquid crystal display module includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed using the same conductive layer as the first electrode 4034, and the terminal electrode 4016 is formed using the same conductive layer as gate electrodes of the transistor 4010 and a transistor 4011. As the material of the conductive layer, a material which can be used for the gate electrode 102 illustrated in FIGS. 1A to 1C can be used, for example.

The pixel portion 4002 and the scan line driver circuit 4004 which are provided over the substrate 4001 include a plurality of transistors. FIG. 22C illustrates the transistor 4010 included in the pixel portion 4002 and the transistor 4011 included in the scan line driver circuit 4004 as an example, and insulating films 4032a and 4032b are provided over the transistors 4010 and 4011.

In FIG. 22C, a planarization insulating film 4040 is provided over the insulating film 4032b, and an insulating film 4042 is provided between the first electrode 4034 and the second electrode 4031.

For the planarization insulating film 4040, an organic resin such as an acrylic-, polyimide-, or benzocyclobutene-based resin, polyamide, or epoxy can be used. Other than such organic materials, it is also possible to use a low dielectric constant material (low-k material), a siloxane-based resin, or the like.

As the transistors 4010 and 4011, the transistor of one embodiment of the present invention can be used. The transistors 4010 and 4011 are transistors having a bottom-gate structure.

A gate insulating film included in the transistors 4010 and 4011 can have a single-layer structure or a stacked-layer structure. Here, a gate insulating film 4020a and a gate insulating film 4020b each have a stacked-layer structure. In FIG. 22C, the gate insulating film 4020a and the insulating film 4032b extend under the sealant 4005 so as to cover an end portion of the connection terminal electrode 4015, and the insulating film 4032b covers side surfaces of the gate insulating film 4020b and the insulating film 4032a. For the gate insulating films 4020a and 4020b, a material which can be used for the gate insulating film 103 illustrated in FIGS. 1A to 1C can be used, for example.

In addition, a conductive layer may be provided so as to overlap with the oxide film of the transistor 4011 in the driver circuit. By providing the conductive layer so as to overlap with the oxide film, the threshold voltage of the transistor 4011 can be controlled.

In addition, the conductive layer has a function of blocking an external electric field (particularly, blocking static electricity), that is, preventing an external electric field from affecting the inside (a circuit portion including a transistor). The blocking function of the conductive layer can prevent change in the electrical characteristics of the transistor due to an influence of an external electric field such as static electricity.

In FIG. 22C, a liquid crystal element 4013 includes the first electrode 4034, the second electrode 4031, and a liquid crystal layer 4008. Note that an insulating film 4038 and an insulating film 4033 functioning as alignment films are provided so that the liquid crystal layer 4008 is interposed therebetween. As the liquid crystal layer 4008, a layer of a material which can be used for the liquid crystal layer 793 illustrated in FIGS. 21A to 21C can be used, for example.

The liquid crystal element 4013 includes the second electrode 4031 having an opening pattern below the liquid crystal layer 4008 and the first electrode 4034 having a flat-plate shape below the second electrode 4031 with the insulating film 4042 provided therebetween. The second electrode 4031 having an opening pattern has a shape including a bend portion or a branching comb-like shape. Since the second electrode 4031 has an opening pattern, the first electrode 4034 and the second electrode 4031 can form a fringe electric field therebetween. Note that a structure may be employed in which the second electrode 4031 having a flat-plate shape is formed on and in contact with the planarization insulating film 4040, and the first electrode 4034 having an opening pattern and serving as a pixel electrode is formed over the second electrode 4031 with the insulating film 4042 provided therebetween.

As the first electrode 4034 and the second electrode 4031, an oxide film such as an In—Zn—W oxide film, an In—Sn oxide film, an In—Zn oxide film, an In oxide film, a Zn oxide film, or a Sn oxide film may be used. A slight amount of Al, Ga, Sb, F, or the like may be added to the above oxide film. Further, a metal thin film having a thickness small enough to transmit light (preferably, approximately 5 nm to 30 nm) can also be used. For example, an Ag film, a Mg film, or an Ag—Mg alloy film having a thickness of 5 nm may be used. Further, graphene may be used.

The first electrode 4034 and the second electrode 4031 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag), alloys thereof, and nitrides thereof.

A conductive composition containing a conductive high molecule (also referred to as conductive polymer) can be used for the first electrode 4034 and the second electrode 4031.

A spacer 4035 is a columnar spacer obtained by selective etching of an insulating film and is provided in order to control the thickness (cell gap) of the liquid crystal layer 4008. Alternatively, a spherical spacer may be used.

Alternatively, a liquid crystal composition exhibiting a blue phase for which an alignment film is unnecessary may be used for the liquid crystal layer 4008. In that case, the liquid crystal layer 4008 is in contact with the first electrode 4034 and the second electrode 4031.

Note that the insulating film 4042 illustrated in FIG. 22C partly has an opening, through which moisture contained in the planarization insulating film 4040 can be released. However, the opening is not necessarily provided depending on the film quality of the insulating film 4042 provided over the planarization insulating film 4040.

The size of a storage capacitor formed in the liquid crystal display module is set considering the leakage current of the transistor provided in the pixel portion, or the like so that charge can be held for a predetermined period. The size of the storage capacitor may be set considering the off-state current of the transistor or the like. By using the transistor of one embodiment of the present invention, the size of the storage capacitor can be reduced. Accordingly, the aperture ratio of each pixel can be increased.

As illustrated in FIGS. 22B and 22C, a structure may be employed in which no capacitor is provided as a storage capacitor in a pixel, and parasitic capacitance generated between the first electrode 4034 and the second electrode 4031 may be used as a storage capacitor. When a capacitor is not provided in this manner, the aperture ratio of the pixel can be further increased.

In the transistor of one embodiment of the present invention, the current in an off state (off-state current) can be controlled to be low. Thus, an electric signal such as an image signal can be held for a longer period, and a writing interval can be set longer. Accordingly, the frequency of refresh operation can be reduced, which is effective in suppressing power consumption.

The transistor of one embodiment of the present invention can have high field-effect mobility and thus can operate at high speed. For example, when such a transistor is used for a liquid crystal display module, a switching transistor in a pixel portion and a transistor in a driver circuit portion can be formed over one substrate. In addition, by using such a transistor also in a pixel portion, a high-quality image can be provided.

In the liquid crystal display module, a black matrix (light-blocking layer), an optical member (optical substrate) such as a polarizing member, a retardation member, or an anti-reflection member, and the like are provided as appropriate. For example, circular polarization may be obtained by using a polarizing plate and a retardation plate. In addition, a backlight, a side light, or the like may be used as a light source.

In addition, a touch sensor may be provided over the pixel portion 4002. When a touch sensor is provided, intuitive operation is possible. The touch sensor will be described later.

As described above, the EL display module and the liquid crystal display module are described as a display module provided with a transistor of one embodiment of the present invention. Alternatively, the display module provided with the transistor of one embodiment of the present invention can be employed for another display module such as a display module including an electrophoretic element, for example. Further, the transistor of one embodiment the present invention can be used for another semiconductor device such as a photosensor, a memory, a CPU, or a microcomputer as well as the display modules which are described as examples of the semiconductor device.

[5.3 Display Module Provided with Touch Sensor]

Here, a structure example of a sensor that can detect proximity or touch of an object (hereinafter referred to as a touch sensor) is described.

For a touch sensor, a variety of types such as a capacitive type, a resistive type, a surface acoustic wave type, and an infrared type can be employed.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. Here, the use of a mutual capacitive type is preferable because of simultaneous sensing of multiple points (also referred to as multipoint sensing or multi-touch).

Besides the touch sensor described here in detail, a sensor that can detect the operation (gesture) of an object (e.g., a finger or a hand), eye movements of users, or the like by a camera (including an infrared camera) or the like can be used as a human interface.

[5.3.1. Example of Detection Method of Sensor]

Figure 23A:
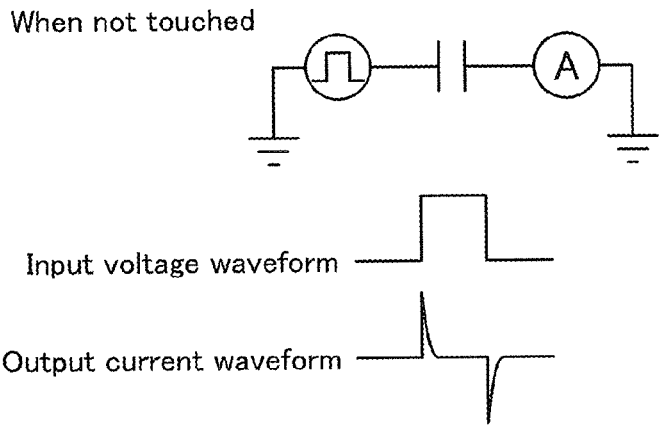
FIGS. 23A to 23C each illustrate a touch sensor.
Figure 23B:
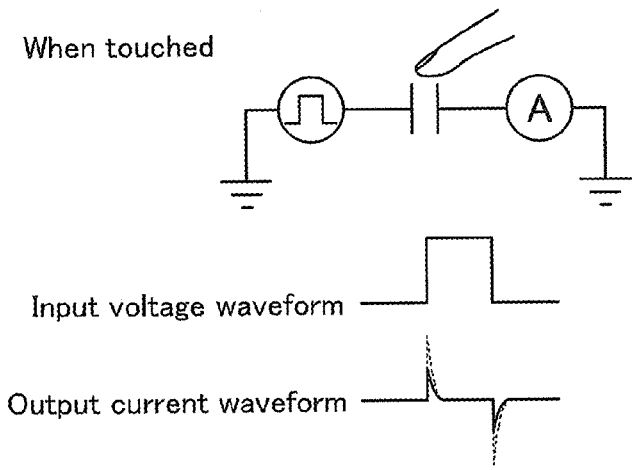

FIGS. 23A and 23B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 23A, a waveform having a sharp peak is detected as an output current waveform.

Further, in the case where an object having conductivity is proximate to or touches a capacitor as illustrated in FIG. 23B, the capacitance value between the electrodes is decreased; accordingly, the current value of the output is decreased.

By detecting a change in capacitance by using a change in output current (or potential) with respect to input voltage in this manner, proximity or a touch of an object can be detected.

[5.3.2. Structure Example of Touch Sensor]

Figure 23C:
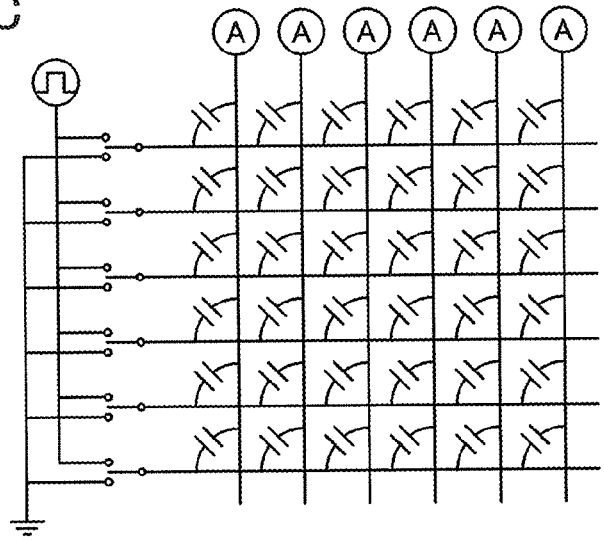

FIG. 23C illustrates a structure example of a touch sensor provided with a plurality of capacitors arranged in a matrix.

The touch sensor includes a plurality of wirings extending in an X direction (the horizontal direction of this figure) and a plurality of wirings extending in a Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that the touch sensor sequentially scans the plurality of wirings extending in the X direction so that input voltage is input and detects a change in current (or potential) flowing through the wirings extending in the Y direction.

[5.3.3. Structural Example of Touch Panel]

A structure example of a touch panel incorporating the touch sensor into a display portion including a plurality of pixels is described below. Here, an example where a liquid crystal element is used as a display element provided in the pixel is shown.

Figure 24A:
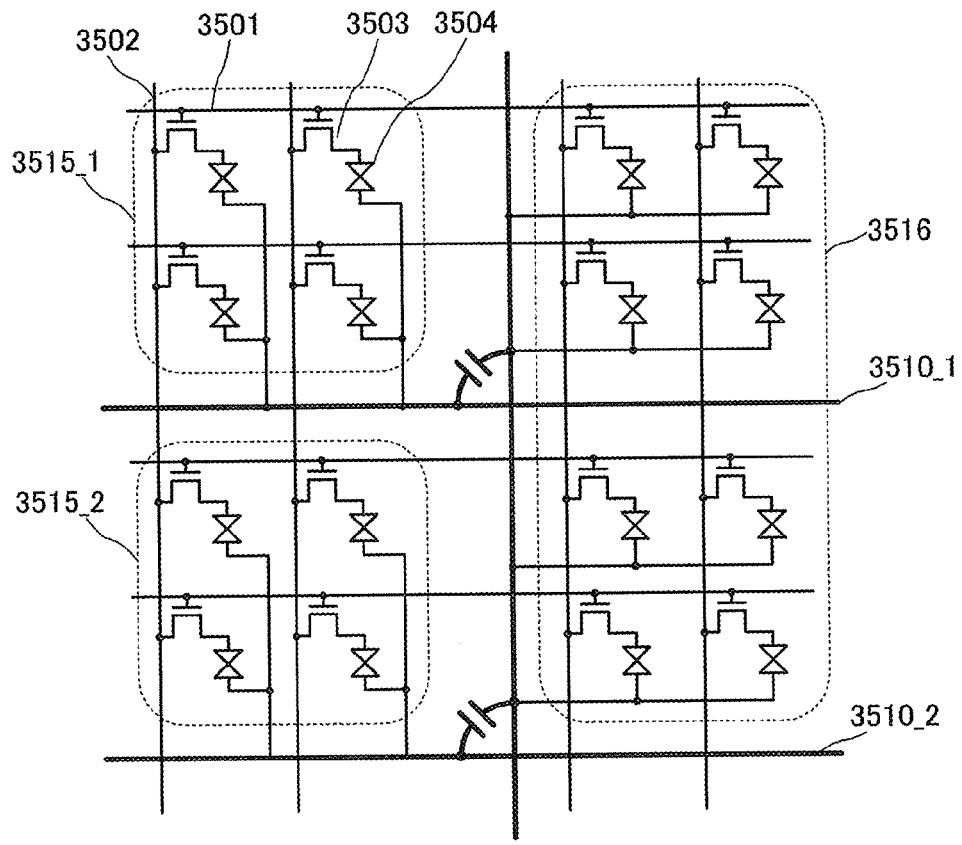
FIGS. 24A and 24B each illustrate a pixel provided with a touch sensor.

FIG. 24A is an equivalent circuit diagram of part of a pixel circuit provided in the display portion of the touch panel exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction.

The wiring 3510_1 (or 3510_2) extending in the X direction is electrically connected to the island-shaped block 3515_1 (or the block 3515_2). Further, the wiring 3511 extending in the Y direction is electrically connected to the linear block 3516.

Figure 24B:
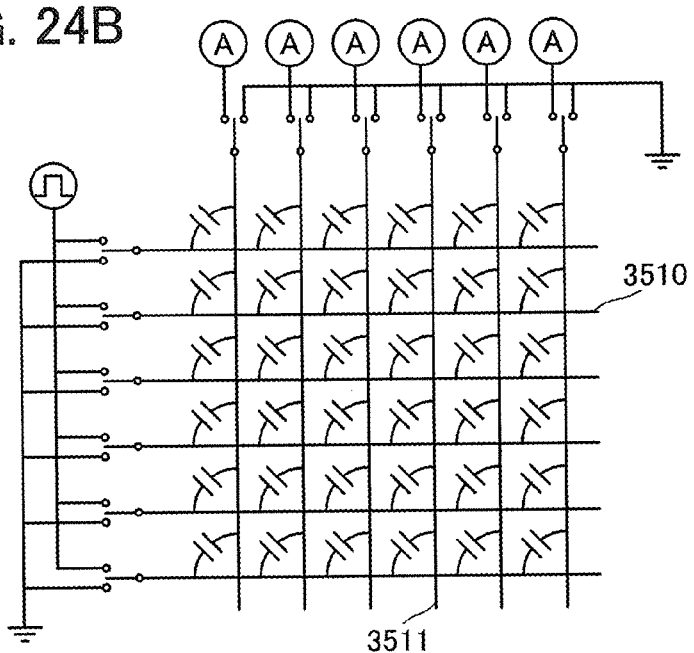

FIG. 24B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction, or the wirings 3511 can be electrically connected to the detection circuit.

[5.3.4. Example of Operation of Touch Panel]

Operation of the above-described touch panel is described with reference to FIGS. 25A and 25B and FIG. 26.

Figure 26:
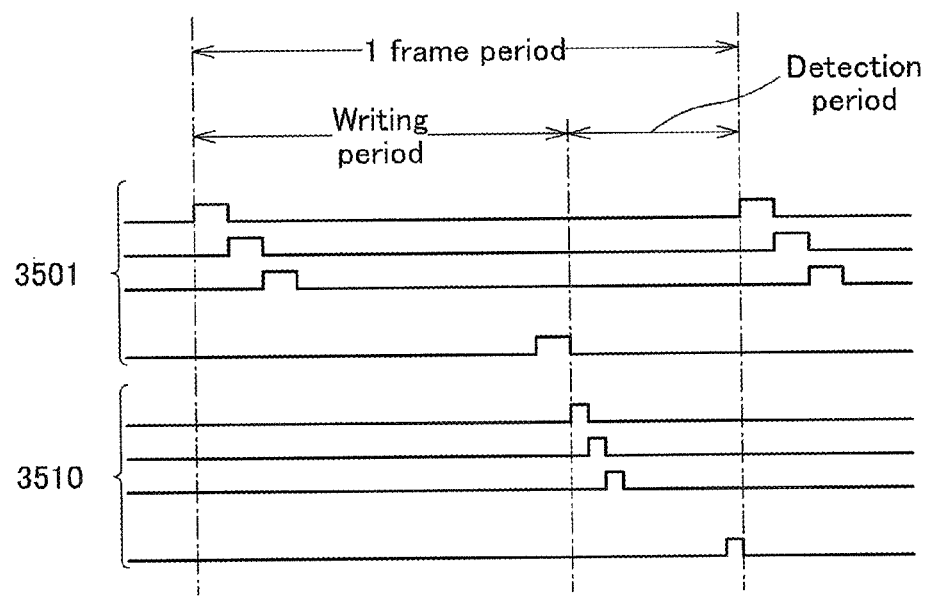
FIG. 26 illustrates the operation of a touch sensor and a pixel.

As illustrated in FIG. 26, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 25A:
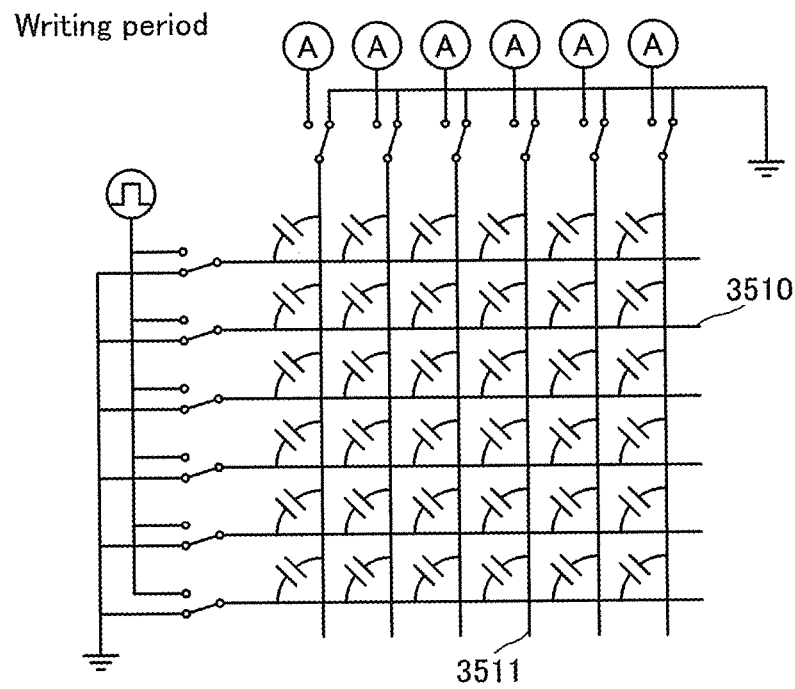
FIGS. 25A and 25B each illustrate the operation of touch sensors and pixels.

FIG. 25A is an equivalent circuit diagram in the writing period. In the wiring period, a common potential is input to both the wiring 3510 extending in the X direction and the wiring 3511 extending in the Y direction.

Figure 25B:
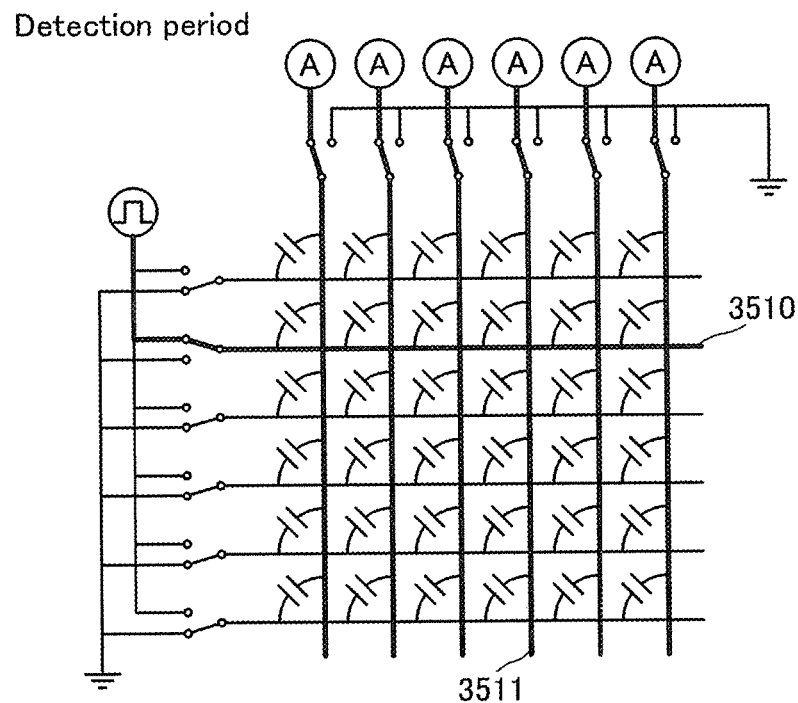

FIG. 25B is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

[5.3.5. Structure Examples of Pixel]

Structure examples of a pixel which can be used for the above touch panel are described below.

Figure 27A:
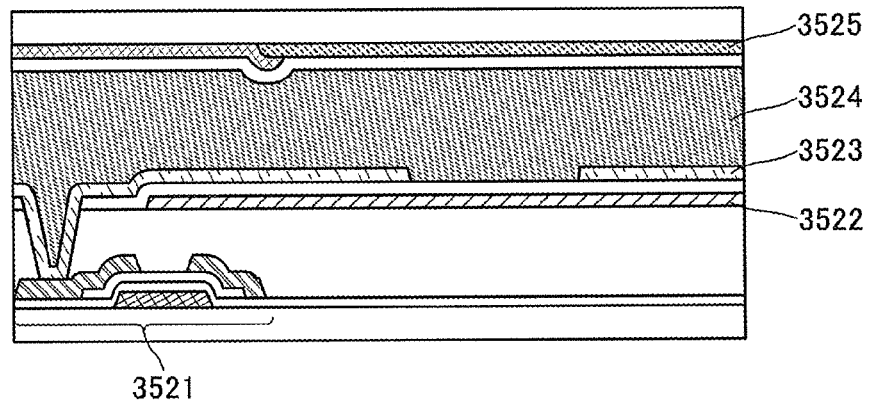
FIGS. 27A to 27C each illustrate a pixel.

FIG. 27A is a cross-sectional schematic view illustrating part of a pixel using a fringe field switching (FFS) mode.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating layer provided therebetween. The electrode 3523 and the electrode 3522 can each function as one electrode of a liquid crystal element, and by applying different potentials therebetween, alignment of liquid crystals can be controlled.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating layer provided therebetween.

Figure 27B:
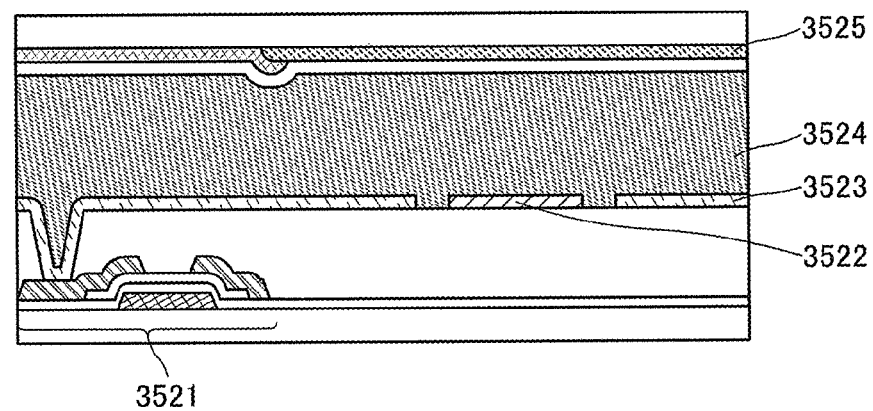

FIG. 27B is a cross-sectional schematic view illustrating part of a pixel having an in-plane-switching (IPS) mode.

The electrode 3523 and electrode 3522 provided in the pixel each have a comb-like shape and are provided on the same plane so as to engage with each other and be apart from each other.

For example, the electrode 3522 is electrically connected to the above-described wiring 3510 or wiring 3511; thus, the pixel of the above-described touch panel can be formed.

Figure 27C:
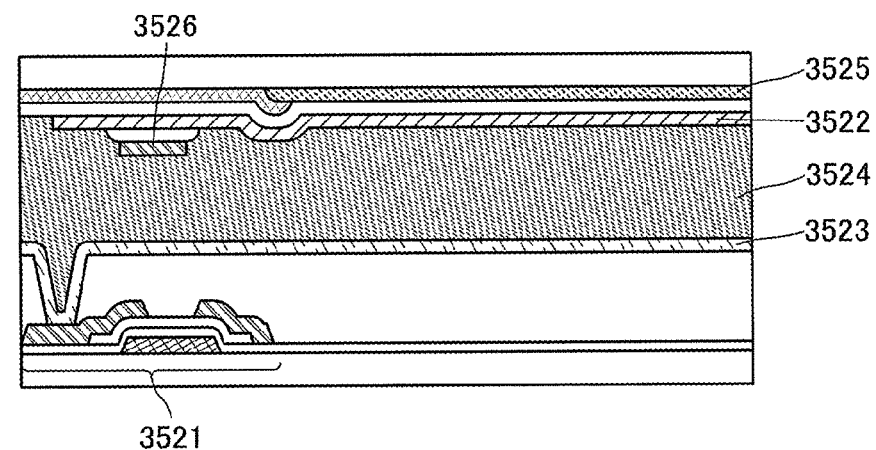

FIG. 27C is a cross-sectional schematic view illustrating part of a pixel having a vertical alignment (VA) mode.

The electrode 3522 is provided so as to face the electrode 3523 with the liquid crystal 3524 provided therebetween. A wiring 3526 is provided over the electrode 3522. For example, the wiring 3526 can be provided to electrically connect the block including the pixel illustrated in FIG. 27C and blocks different from the block including the pixel illustrated in FIG. 27C.

For example, the electrode 3522 is electrically connected to the above-described wiring 3510 or wiring 3511; thus, the pixel of the above-described touch panel can be formed.

[6. Electric Device]

Next, electric devices including the semiconductor device as a component are described.

[6.1. Range of Electric Devices]

Electric devices refer to industrial products including portions which operate with electric power. Electric devices include a wide range of applications for business use, industrial use, military use, and the like without being limited to consumer products such as household appliances.

Examples of electric devices include the following: display devices such as televisions and monitors, lighting devices, desktop or laptop personal computers, word processors, image reproduction devices which reproduce still images or moving images stored in recording media such as digital versatile discs (DVDs), portable or stationary audio reproduction devices such as compact disc (CD) players and digital audio players, portable or stationary radio receivers, audio recording and reproduction devices such as tape recorders and IC recorders (voice recorders), headphone stereos, stereos, remote controllers, clocks such as table clocks and wall clocks, cordless phone handsets, transceivers, cellular phones, car phones, portable or stationary game machines, pedometers, calculators, portable information terminals, electronic notebooks, e-book readers, electronic translators, audio input devices such as microphones, cameras such as still cameras and video cameras, toys, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashing machines, dish drying machines, clothes dryers, futon dryers, electric refrigerators, electric freezers, electric refrigerator-freezers, freezers for preserving DNA, flashlights, electric power tools, alarm devices such as smoke detectors, gas alarms, and security alarms, health and medical equipment such as hearing aids, cardiac pacemakers, X-ray equipment, radiation counters, electric massagers, and dialyzers. Further examples include the following industrial equipment: guide lights, traffic lights, meters such as gas meters and water meters, belt conveyors, elevators, escalators, industrial robots, wireless relay stations, cellular base stations, power storage systems, and power storage devices for leveling the amount of power supply and smart grid. Moreover, examples of electric devices include moving objects such as electric vehicles (EV), hybrid electric vehicles (HEV) which include both an internal-combustion engine and a motor, plug-in hybrid electric vehicles (PHEV), tracked vehicles in which caterpillar tracks are substituted for wheels of the above vehicles, agricultural machines, motorized bicycles including motor-assisted bicycles, motorcycles, electric wheelchairs, electric carts, boats or ships, submarines, aircrafts such as fixed-wing aircrafts and rotary-wing aircrafts, rockets, artificial satellites, space probes, planetary probes, and spacecrafts.

[6.2. Specific Example of Electric Device]

Specific examples of these electric devices are illustrated in FIGS. 28A to 28D.

Figure 28A:
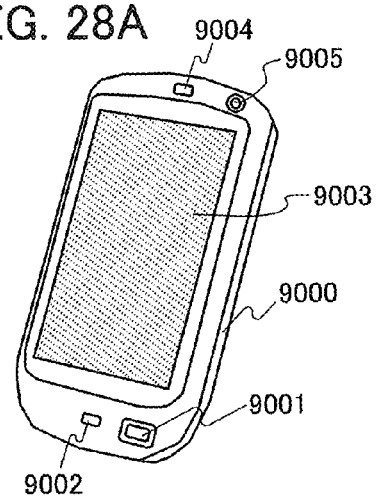
FIGS. 28A to 28F each illustrate an electric device.

FIG. 28A illustrates a portable information terminal as one example. The portable information terminal illustrated in FIG. 28A includes a housing 9000, a button 9001, a microphone 9002, a display portion 9003, a speaker 9004, and a camera 9005, and has a function as a cellular phone. One embodiment of the present invention can be applied to the display portion 9003. Further, one embodiment of the present invention can be applied to an arithmetic unit, a wireless circuit, or a memory circuit inside a main body.

Figure 28B:
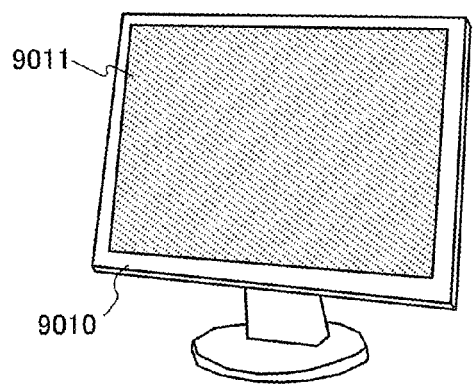

FIG. 28B illustrates a display. The display illustrated in FIG. 28B includes a housing 9010 and a display portion 9011. One embodiment of the present invention can be applied to the display portion 9011. Further, one embodiment of the present invention can be applied to an arithmetic unit, a wireless circuit, or a memory circuit inside a main body.

Figure 28C:
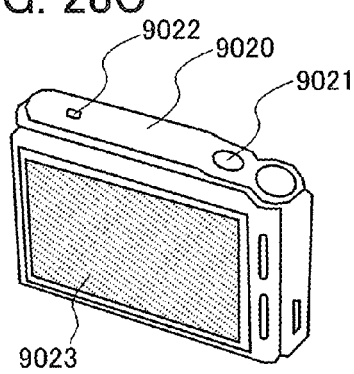

FIG. 28C illustrates a digital still camera. The digital still camera illustrated in FIG. 28C includes a housing 9020, a button 9021, a microphone 9022, and a display portion 9023. One embodiment of the present invention can be applied to the display portion 9023. Further, one embodiment of the present invention can be applied to an arithmetic unit, a wireless circuit, or a memory circuit inside a main body.

Figure 28D:
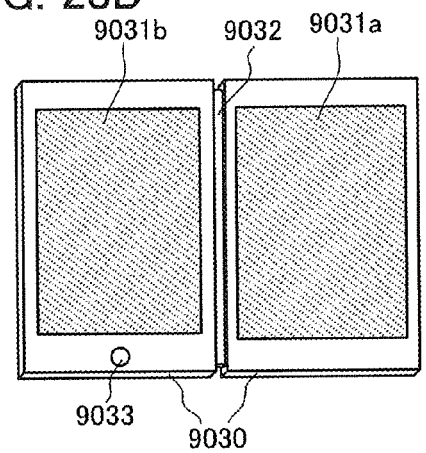

FIG. 28D illustrates a foldable portable information terminal. The foldable portable information terminal illustrated in FIG. 28D includes housings 9030, a display portion 9031a, a display portion 9031b, a hinge 9032, and an operation switch 9033. One embodiment of the present invention can be applied to the display portion 9031a and the display portion 9031b. Further, one embodiment of the present invention can be applied to an arithmetic unit, a wireless circuit, or a memory circuit inside a main body.

Part or the whole of the display portion 9031a and/or the display portion 9031b can function as a touch panel. By touching an operation key displayed on the touch panel, a user can input data, for example.

Figure 28E:
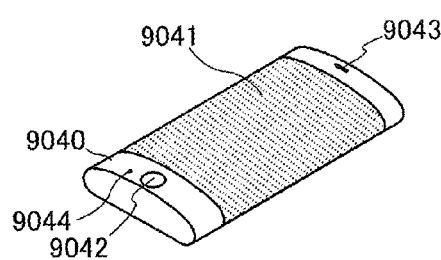
Figure 28F:
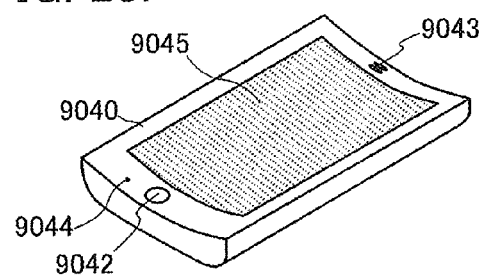

Electric devices illustrated in FIGS. 28E and 28F are examples of portable information terminals each including a display module with a curved surface in a display portion.

The portable information terminal illustrated in FIG. 28E includes an operation button 9042, a speaker 9043, a microphone 9044 in addition to a display portion 9041 provided in a housing 9040. The portable information terminal further includes an external connection port (not illustrated) such as a stereo headphone jack, a memory card slot, a camera connector, or a USB connector.

Further, one embodiment of the present invention can be applied to the display portion 9041. One embodiment of the present invention can be applied to an arithmetic unit, a wireless circuit, or a memory circuit inside a main body. By using a substrate with a curved surface as a support substrate for display elements, a portable information terminal including a panel with a curved surface can be obtained. The display portion 9041 is an example with an outwardly curved surface.

The portable information terminal illustrated in FIG. 28F is an example which has a structure similar to that of the portable information terminal illustrated in FIG. 28E and includes a display portion 9045 curved along a side surface of the housing 9040. The portable information terminal illustrated in FIG. 28F is an example which has a structure similar to that of the portable information terminal illustrated in FIG. 28E and includes the display portion 9045 which is curved inwardly.

Each of the display portions of the electric devices illustrated in FIGS. 28A to 28F and the like can also function as an image sensor. For example, an image of a palm print, a fingerprint, or the like is taken by touch on the display portion with the palm or the finger, whereby personal identification can be performed. Furthermore, when a backlight or a sensing light source which emits near-infrared light is provided for the display portion, an image of a finger vein, a palm vein, or the like can also be taken. Such a function can be achieved by using the semiconductor device of one embodiment of the present invention.

Each of the electric devices and the like can be operated with a button provided on the device or a touch panel provided in the display portion, or can be operated by recognition of user's movement (gesture) (also referred to as gesture input) using a camera provided on the device, a sensor provided in the device, or the like. Alternatively, each device can be operated by recognition of user's voice (also referred to as voice input). Such operation can be achieved by using the semiconductor device of one embodiment of the present invention.

The electric devices and the like can be connected to a network. The electric devices and the like not only can display information on the Internet but also can be used as a terminal which controls another device connected to the network from a distant place. Such a function can be achieved by using the semiconductor device of one embodiment of the present invention.

With the use of the semiconductor device of one embodiment of the present invention, an electric device with high performance and low power consumption can be provided.

Example 1

In this example, measurement results that show how sheet resistance of an oxide semiconductor layer changes before and after heat treatment corresponding to the heat treatment performed after the formation of the oxide insulating film shown in the above embodiment will be described with reference to FIGS. 29, 30, 31, and 32. For example, it can be considered that the oxide semiconductor layer is an i-type in the case where the sheet resistance of the oxide semiconductor layer exceeds the measurement upper limit value of measurement equipment (i.e., exceeds the range) and the oxide semiconductor layer is an n-type in the case where the sheet resistance of the oxide semiconductor layer can be measured.

As samples for measurements of sheet resistance, the following samples were manufactured: samples which each include an IGZO layer formed over a glass substrate by a sputtering method with a target containing In, Ga, and Zn in an atomic ratio of 1:1:1 (hereinafter the IGZO layer is referred to as an IGZO (111) layer in this example) and samples which each include an IGZO layer formed over a glass substrate by a sputtering method with a target containing In, Ga, and Zn in atomic ratio of 1:3:2 (hereinafter the IGZO layer is referred to as an IGZO (132) layer in this example). Here, the IGZO (111) layer was formed under conditions where the flow rates of argon and oxygen were each 100 sccm, the pressure was 0.6 Pa, the power (AC) was 5 kW, and the substrate temperature was 170° C. The IGZO (132) layer was formed under conditions where the flow rates of argon and oxygen were 135 sccm and 15 sccm, respectively, the pressure was 0.3 Pa, the power (AC) was 5 kW, and the substrate temperature was 100° C. In either case, after the formation of the IGZO layer, heat treatment was performed at 450° C. in a nitrogen atmosphere for one hour, and then another heat treatment was performed at 450° C. in a mixed atmosphere of nitrogen and oxygen for one hour.

Further, a tungsten layer or a titanium layer was formed as a conductive layer over the IGZO layer of each sample. The tungsten layer was formed under conditions where the flow rate of argon was 100 sccm, the pressure was 2.0 Pa, the power (DC) was 20 kW or 60 kW, and the substrate temperature was 100° C. The titanium layer was formed under conditions where the flow rate of argon was 100 sccm, the pressure was 0.3 Pa, the power (DC) was 58 kW, and the substrate temperature was 70° C.

After the formation of the conductive layer, some samples were not subjected to heat treatment and the other samples were subjected to heat treatment, and the IGZO layer was exposed by removal of the conductive layer in each sample. Heat treatment was performed at 350° C. in a mixed atmosphere of nitrogen and oxygen for one hour as the heat treatment after the formation of the conductive layer. The conductive layer was removed by a dry etching method under conditions where the etching gases were $SF_6$ and oxygen whose flow rates were 900 sccm and 100 sccm, respectively, the power of the ICP power source was 2000 W, the bias power was 200 W, the pressure was 2.0 Pa, and the substrate temperature was 80° C.

The sheet resistance of the IGZO layer was measured by repeating a series of the following steps: a probe is made contact with the exposed surface of the IGZO layer to measure the sheet resistance, the IGZO layer was etched with an etchant so as to be etched by several nanometers, and further the sheet resistance of the surface was measured. Accordingly, a profile of sheet resistance from the surface of the IGZO layer which had been in contact with the conductive layer to a region in the thickness direction can be obtained. Note that the sheet resistance was measured by a DC four-probe method. The DC four-probe method is a method for calculating resistance such that four probes are aligned on the surface of a measurement sample with predetermined intervals, current is made to flow in a portion between the two outermost probes, and voltage is measured with the two innermost probes. Although the four-probe method was employed in this example, another measurement method such as a four-terminal method may be employed instead of the four-probe method.

FIGS. 29, 30, 31, and 32 show measurement results of sheet resistance obtained in this manner. In each figure, the horizontal axis represents the etching amount (unit: nm) of the IGZO layers, and the vertical axis represents sheet resistance (unit: Q/square). In the horizontal axis, a value of 0 nm indicates a position of the outermost surfaces of the IGZO layers which were exposed by removal of the conductive layers, and the rightward direction indicates the depth directions of the IGZO layers.

Figure 29:
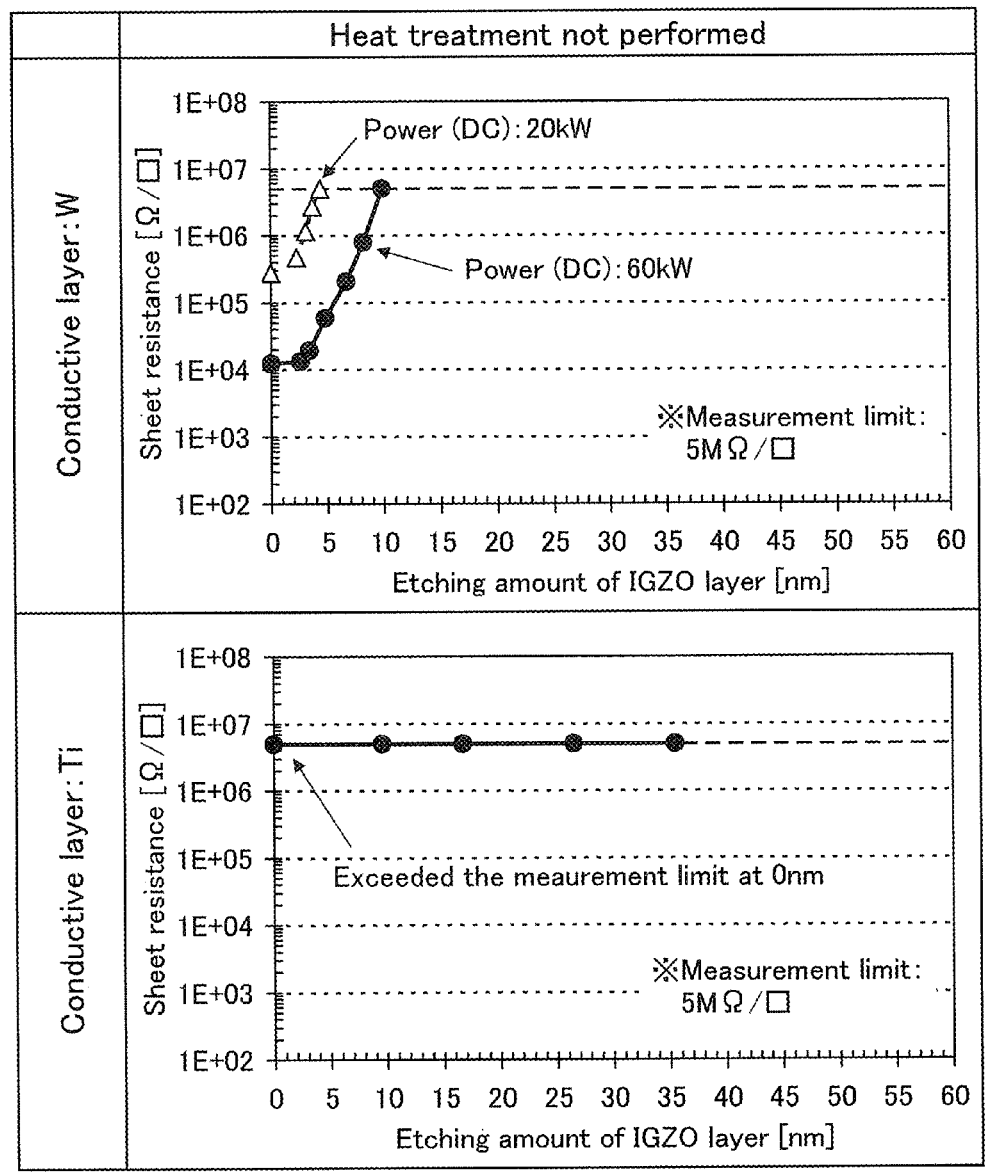
FIG. 29 shows measurement results of sheet resistance.
Figure 30:
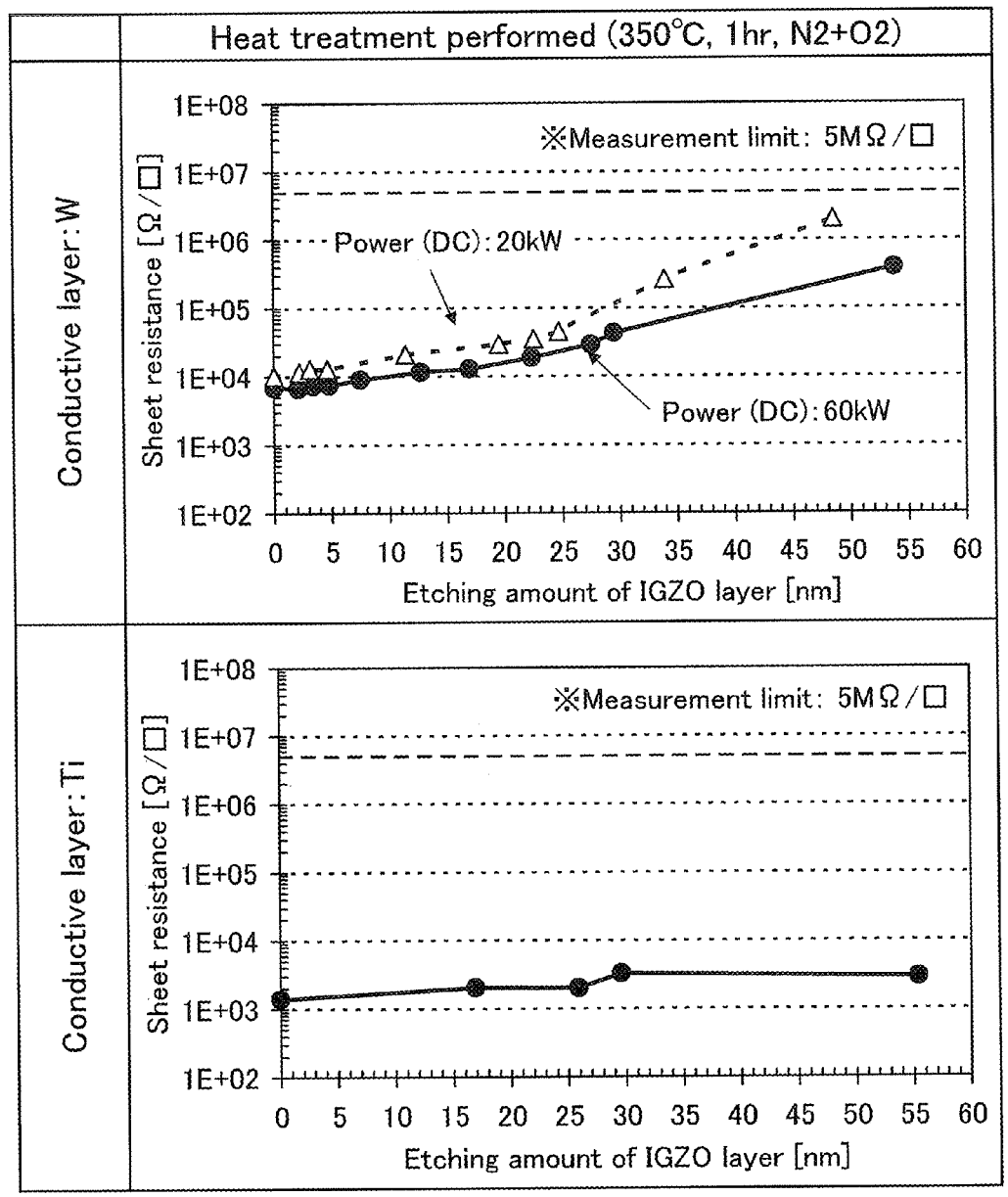
FIG. 30 shows measurement results of sheet resistance.
Figure 31:
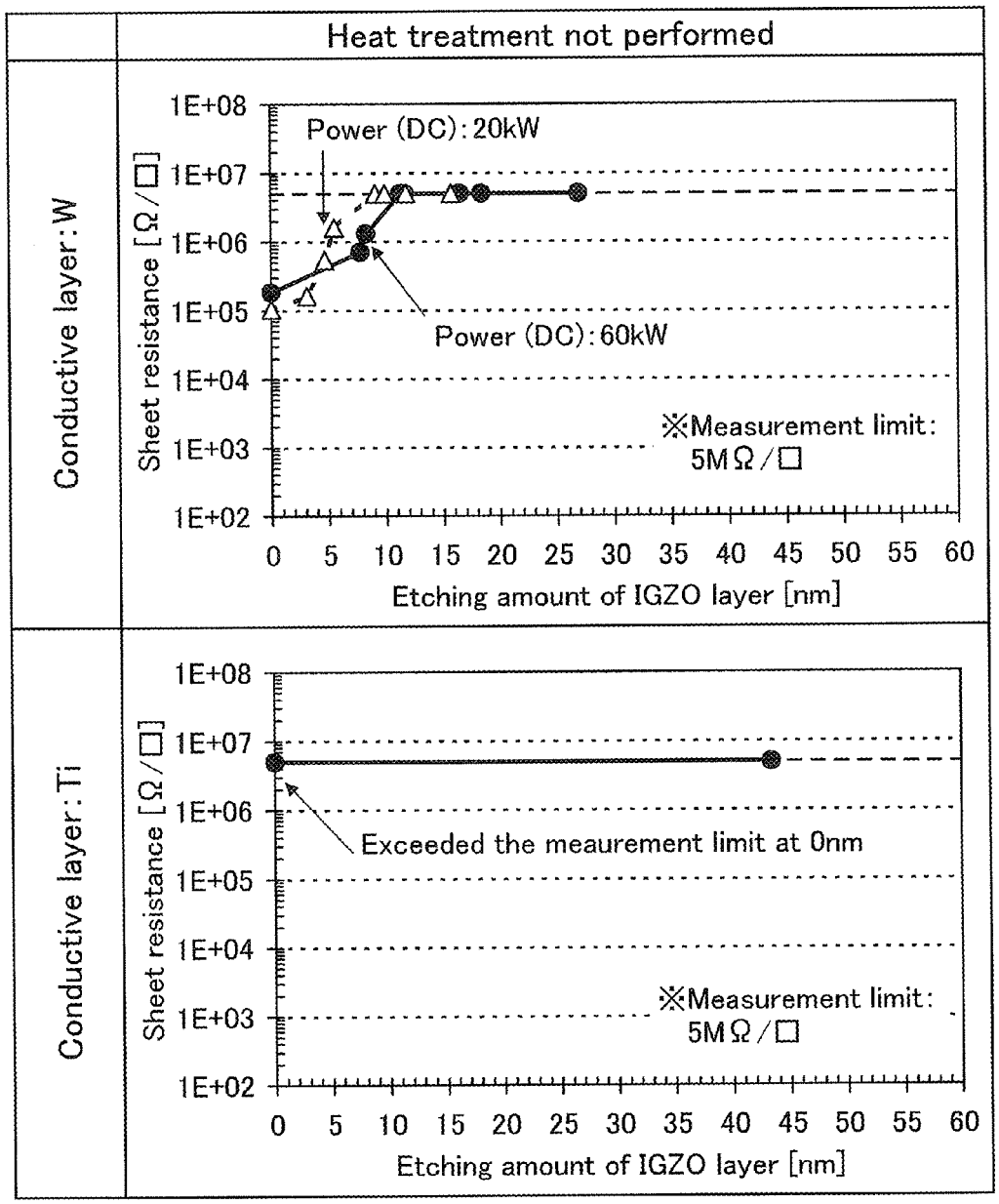
FIG. 31 shows measurement results of sheet resistance.

FIGS. 29 and 30 each show the measurement results in the case where the oxide semiconductor layers were each an IGZO (111) layer. The case where heat treatment was not performed after the formation of the conductive layers is shown in FIG. 29, and the case where heat treatment was performed after the formation of the conductive layers is shown in FIG. 30. In a similar manner, FIGS. 31 and 32 each show the measurement results in the case where the oxide semiconductor layers were each an IGZO (132) layer. The case where heat treatment was not performed after the formation of the conductive layers is shown in FIG. 31, and the case where heat treatment was performed after the formation of the conductive layers was shown in FIG. 32. In each figure, the top graph shows the case where a tungsten layer was formed as each of the conductive layers and then removed, and the bottom graph shows the case where a titanium layer was formed as the conductive layer and then removed.

First, the case where the oxide semiconductor layer was an IGZO (111) layer was evaluated. In the case where a tungsten layer was formed as each of the conductive layers over the IGZO (111) layer, sheet resistance of an upper portion of the IGZO layer was able to be measured even when heat treatment was not performed after the formation of the tungsten layer (see FIG. 29). The sheet resistance also differs depending on the power at the formation of the tungsten layer; sheet resistance can be measured in a region at a depth of approximately 5 nm from the surface when the power was 20 kw and in a region at a depth of approximately 10 nm therefrom when the power was 60 kw. Thus, the above results show that the upper portion of the IGZO layer is changed to an n-type at the stage of the formation of the tungsten layer.

On the other hand, in the case where a titanium layer was formed as the conductive layer, sheet resistance exceeded the range in a state without heat treatment (see FIG. 29). Thus, this result in the case where a titanium layer was formed as the conductive layer shows that the upper portion of the IGZO layer was not changed to an n-type but its i-type was maintained at the film formation stage.

Whereas in the case where heat treatment was performed after the formation of the conductive layers, sheet resistance of deep regions of the IGZO layers can be measured in the thickness direction even when the conductive layers are each either the tungsten layer or the titanium layer (see FIG. 30). Accordingly, this shows that the heat treatment after the formation of the conductive layer changes the IGZO layer to an n-type in a wide region, that is, from the top surface to the deep region in the thickness direction.

Thus, it was confirmed that the oxide semiconductor layer under the conductive layer was changed to an n-type by heat treatment, whereas in the case where the titanium layer was used as the conductive layer, even sheet resistance of a region of the oxide semiconductor layer which was under the conductive layer was not reduced at the film formation stage, that is, its i-type was maintained.

Figure 32:
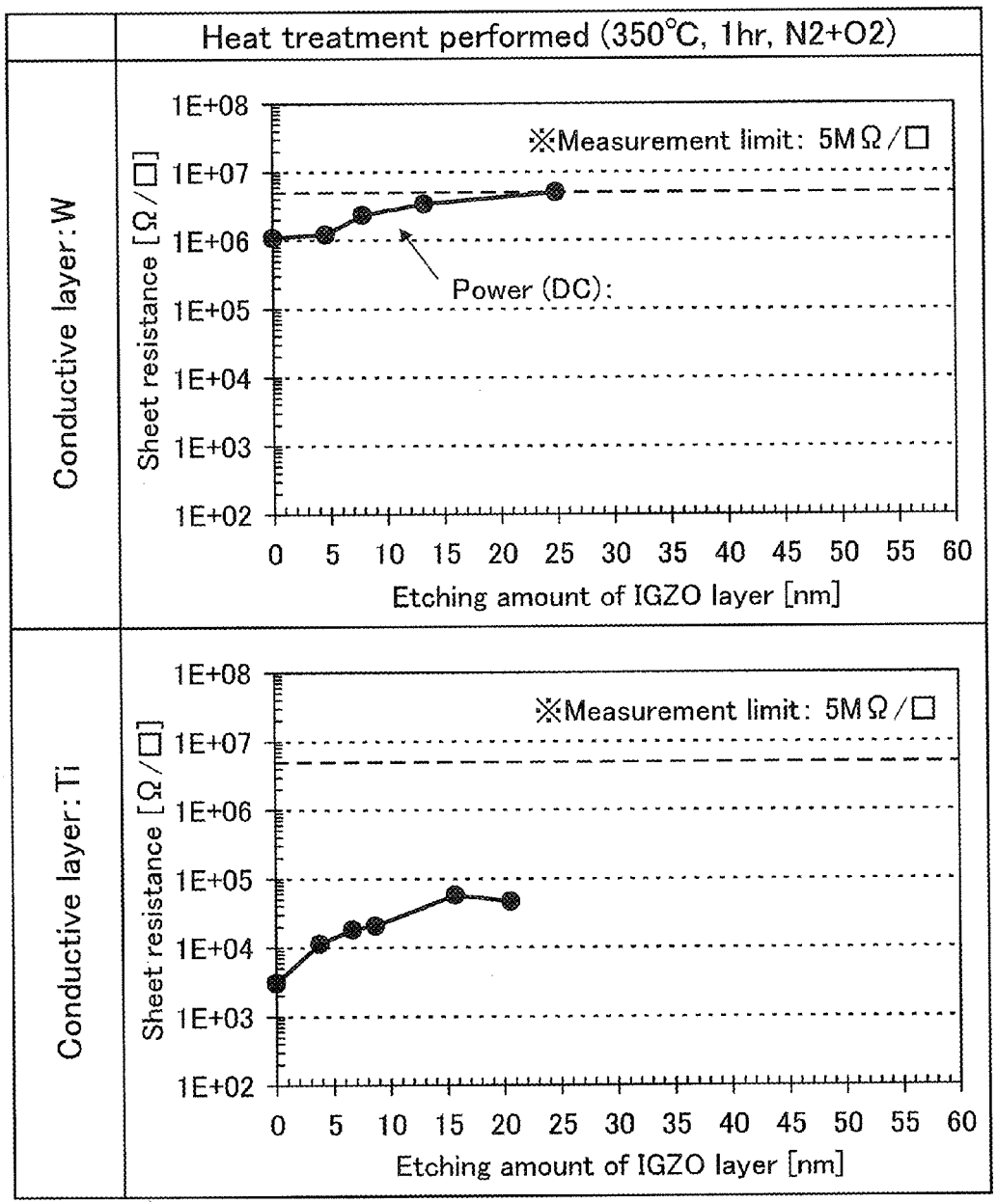
FIG. 32 shows measurement results of sheet resistance.

Although the above are the measurement results in the case where the IGZO (111) layers were used as the oxide semiconductor layers, there was the same tendency in the case where the IGZO (132) layers were used as the oxide semiconductor layers (see FIG. 31 and FIG. 32).

Figure 33:
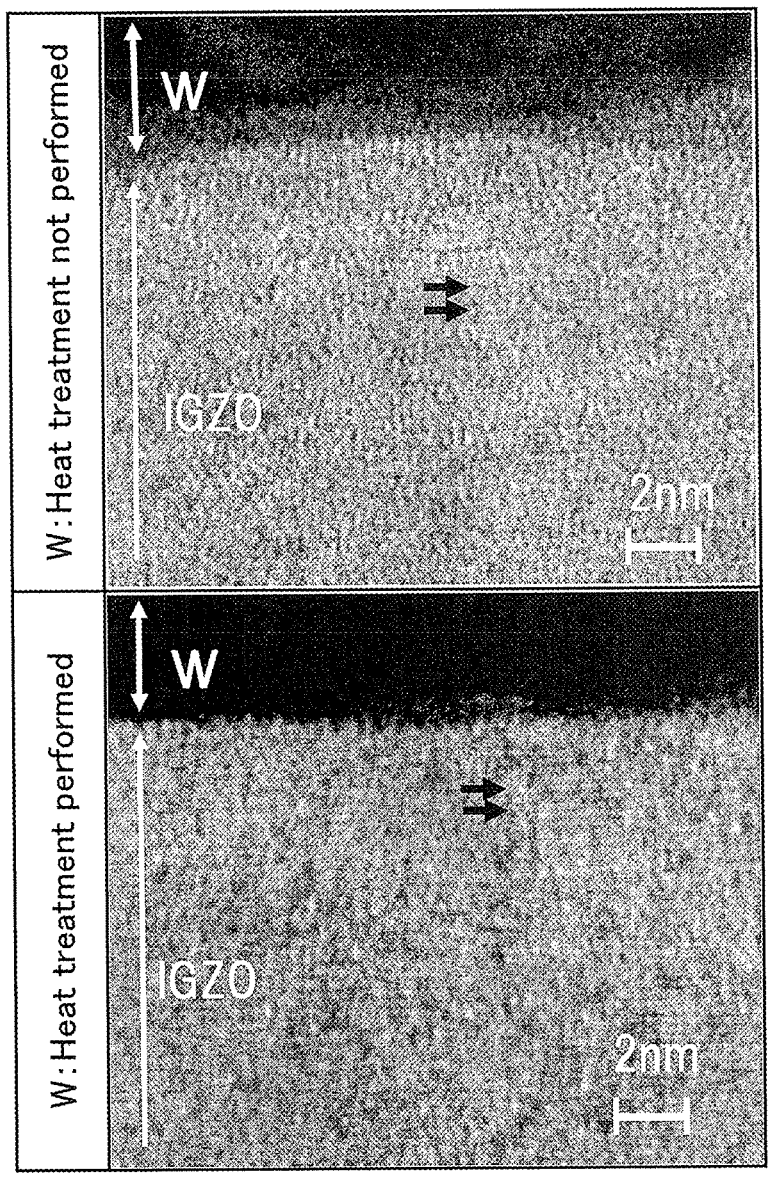
FIG. 33 is TEM images of a CAAC-OS film over which a tungsten layer is formed.

Note that in the case where the IGZO layer includes a CAAC-OS layer, the structure itself of the CAAC-OS layer does not break even when the IGZO layer is changed to an n-type by forming a tungsten layer thereover by a sputtering method. FIG. 33 shows TEM observation results of samples in each of which a tungsten layer was formed over an IGZO layer including a CAAC-OS layer and one of which heat treatment was performed and the other of which was not performed after the formation of the tungsten layer. In either case, the structure of crystals arranged in a layered manner as indicated by arrows in the TEM image can be seen. Thus, it can be said that the CAAC-OS layer is maintained.

Example 2

In this example, comparison between an oxide semiconductor layer including an nanocrystal (a nc-OS layer) and a CAAC-OS layer which is made regarding the measurement results that show how sheet resistance of an oxide semiconductor layer changes before and after heat treatment corresponding to the heat treatment performed after the formation of the oxide insulating film shown in the above embodiment will be described with reference to FIGS. 34 and 35.

As samples for measurements of sheet resistance, the following samples were manufactured: samples which each include an IGZO layer including an nanocrystal formed over a glass substrate by a sputtering method with a target containing In, Ga, and Zn in an atomic ratio of 1:1:1 (hereinafter the IGZO layer is referred to as an nc-OS layer in this example) and samples which each include an IGZO layer including a CAAC-OS layer formed over a glass substrate by a sputtering method (hereinafter the IGZO layer is referred to as a CAAC-OS layer in this example). Here, the nc-OS layer was formed under conditions where the flow rates of argon and oxygen were 135 sccm and 15 sccm, respectively, the pressure was 0.6 Pa, the power (AC) was 5 kW, and the substrate temperature was 100° C. The CAAC-OS layer was formed under conditions where the flow rates of argon and oxygen were each 100 sccm, the pressure was 0.6 Pa, the power (AC) was 5 kW, and the substrate temperature was 170° C. In either case, after the formation of the IGZO layer, heat treatment was performed at 450° C. in a nitrogen atmosphere for one hour, and then another heat treatment was performed at 450° C. in a mixed atmosphere of nitrogen and oxygen for one hour.

Further, a tungsten layer or a titanium layer was formed as a conductive layer over the IGZO layer of each sample. The tungsten layer was formed under conditions where the flow rate of argon was 100 sccm, the pressure was 2.0 Pa, the power (DC) was 20 kW or 60 kW, and the substrate temperature was 100° C. The titanium layer was formed under conditions where the flow rate of argon was 100 sccm, the pressure was 0.3 Pa, the power (DC) was 58 kW, and the substrate temperature was 70° C.

After the formation of the conductive layer, some samples were not subjected to heat treatment and the other samples were subjected to heat treatment, and the IGZO layer was exposed by removal of the conductive layer in each sample. Heat treatment was performed at 350° C. in a mixed atmosphere of nitrogen and oxygen for one hour as the heat treatment after the formation of the conductive layer. The conductive layer was removed by a dry etching method under conditions where the etching gases were $SF_6$ and oxygen whose flow rates were 900 sccm and 100 sccm, respectively, the power of the ICP power source was 2000 W, the bias power was 200 W, the pressure was 2.0 Pa, and the substrate temperature was 80° C.

The sheet resistance of the IGZO layer was measured by repeating a series of the following steps: a probe is made contact with the exposed surface of the IGZO layer to measure the sheet resistance, the IGZO layer was etched with an etchant so as to be etched by several nanometers, and further the sheet resistance of the surface was measured. Note that the sheet resistance was measured by a DC four-probe method.

Figure 34:
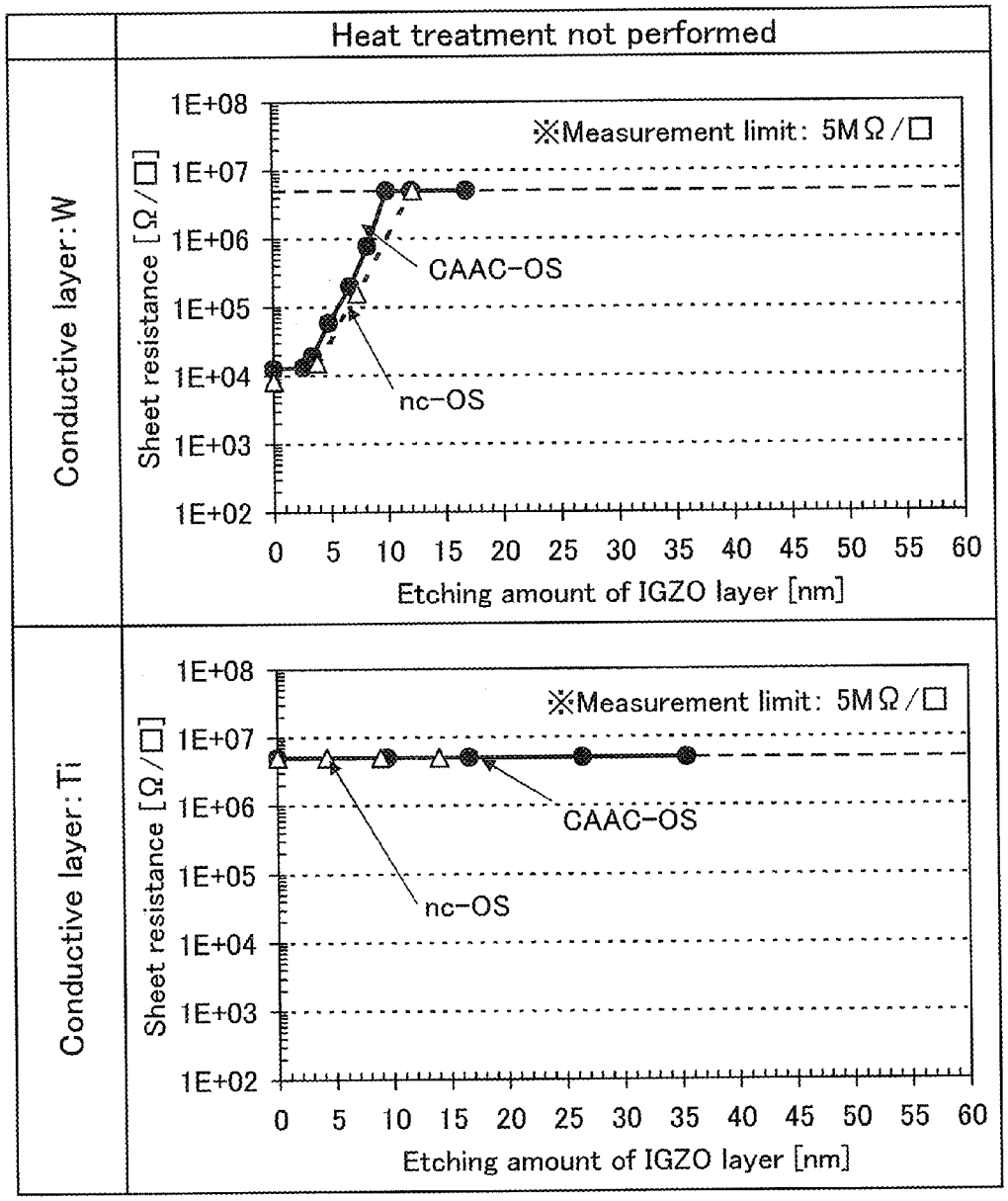
FIG. 34 shows measurement results of sheet resistance.
Figure 35:
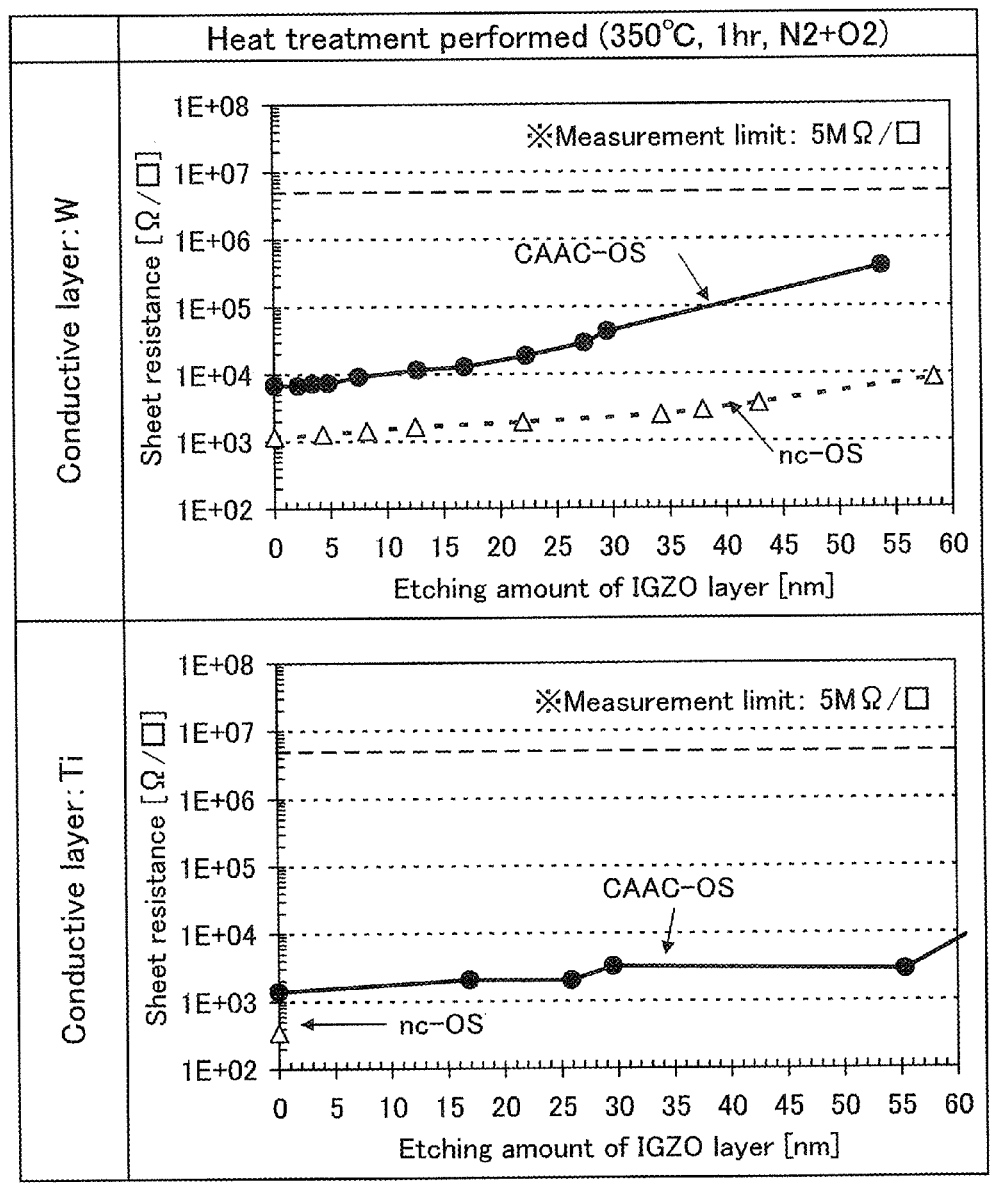
FIG. 35 shows measurement results of sheet resistance.

FIGS. 34 and 35 show measurement results of sheet resistance obtained in this manner. In each figure, the horizontal axis represents the etching amount (unit: nm) of the IGZO layers, and the vertical axis represents sheet resistance (unit: Q/square). In the horizontal axis, a value of 0 nm indicates a position of the outermost surfaces of the IGZO layers which were exposed by removal of the conductive layers, and the rightward direction indicates the depth directions of the IGZO layers.

The case where heat treatment was not performed after the formation of the conductive layers is shown in FIG. 34, and the case where heat treatment was performed after the formation of the conductive layers is shown in FIG. 35. In each figure, the top graph shows the case where a tungsten layer was formed as each of the conductive layers and then removed, and the bottom graph shows the case where a titanium layer was formed as each of the conductive layer and then removed.

In the case where a tungsten layer was formed as each of the conductive layers over the IGZO layer, sheet resistance of an upper portion of the IGZO layer was able to be measured even when heat treatment was not performed after the formation of the tungsten layer (see FIG. 34). The comparison between the nc-OS layer and the CAAC-OS layer shows that a region of the nc-OS layer which was changed to an n-type was slightly deeper than that of the CAAC-OS layer.

On the other hand, in the case where a titanium layer was formed as each of the conductive layers, sheet resistance exceeded the range in a state without heat treatment (see FIG. 34). Thus, this result in the case where a titanium layer was formed as each of the conductive layers shows that the upper portion of the IGZO layer was not changed to an n-type but its i-type was maintained at the film formation stage.

Whereas in the case where heat treatment was performed after the formation of the conductive layers, sheet resistance of deep regions of the IGZO layers can be measured in the thickness direction even when the conductive layers are either the tungsten layer or the titanium layer (see FIG. 35).

Accordingly, this shows that the heat treatment after the formation of the conductive layer changes the IGZO layer to an n-type in a wide region, that is, from the top surface to the deep region in the thickness direction. In the case where the conductive layers were each a tungsten layer, the resistance of the nc-OS layer was lower than that of the CAAC-OS layer and an n-type region of the nc-OS layer was deeper than that of the CAAC-OS layer. In the case where the conductive layers were each a titanium layer, the resistance of the nc-OS layer was lower than that of the CAAC-OS layer.

That is, the above results show that, compared to the nc-OS layer, the CAAC-OS layer is less likely to have lower resistance due to the conductive layer provided thereover and therefore the cross-sectional area of an n-type region does not increase in the thickness direction.

However, in the sample in which the titanium layer was formed over the nc-OS layer and then subjected to heat treatment, the IGZO layer was not able to be etched uniformly by wet etching. TEM images of the sample are shown in FIG. 36.

Figure 36:
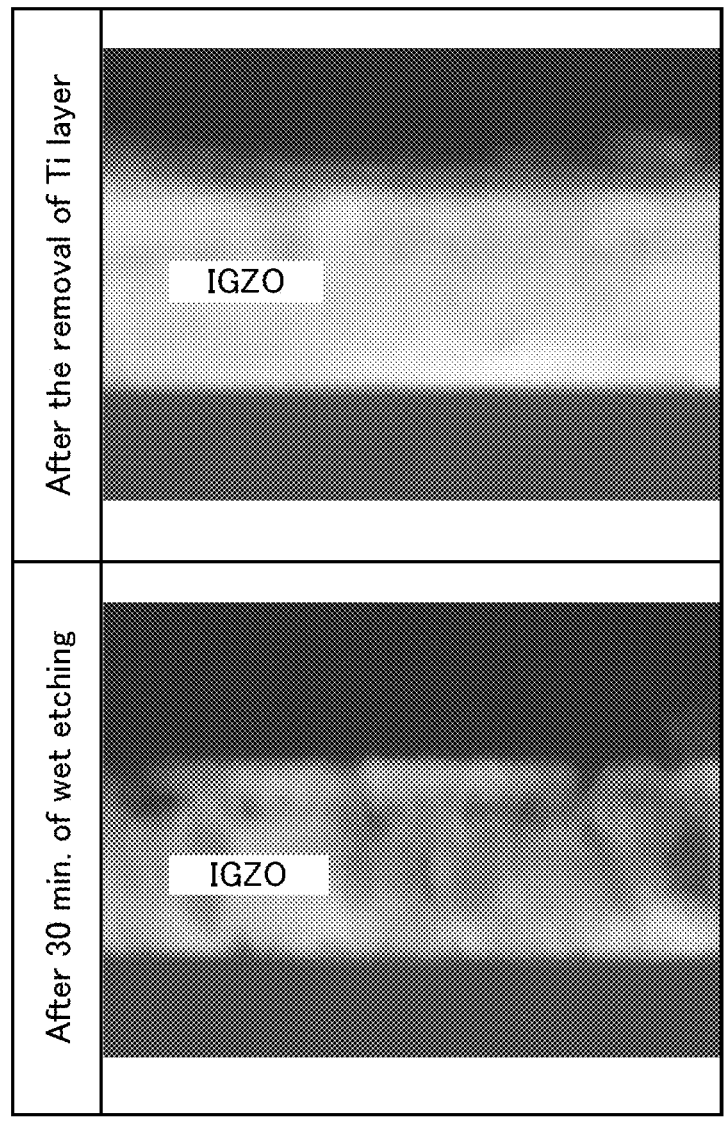
FIG. 36 is TEM images of a nc-OS film over which a titanium layer is formed.

In FIG. 36, the top image shows the cross section of the nc-OS layer after the titanium layer was removed, and the bottom image shows the cross section of the nc-OS layer after wet etching which was continued for 30 minutes. The bottom image shows that the nc-OS layer was sperse after being subjected to the wet etching for 30 minutes. This is probably because a region of the nc-OS layer is reacted with titanium and deformed. Also as seen from the bottom image of FIG. 36, the deformation of the nc-OS layer by titanium does not occur entirely but might occur locally.

Example 3

In this example, measurement results of diffusion of metal which is used for a conductive layer to an oxide semiconductor layer in the case where heat treatment corresponding to the heat treatment performed after the formation of the oxide insulating film will be described with reference to FIG. 37.

First, in each measurement sample, an IGZO layer which was an oxide semiconductor layer was formed over a glass substrate by a sputtering method with a target containing In, Ga, and Zn in an atomic ratio of 1:1:1. The IGZO layer was formed under conditions where the flow rates of argon and oxygen were each 100 sccm, the pressure was 0.6 Pa, the power (AC) was 5 kW, and the substrate temperature was 170° C. The thickness of the IGZO layer is 100 nm. Then, a 100-nm-thick conductive layer was formed thereover. Note that as the samples, two samples each including a tungsten layer and two samples each including a titanium layer were prepared, and one of each kind of samples was not subjected to heat treatment and the other of each kind of samples was subjected to heat treatment at 350° C. in a mixed atmosphere of oxygen and nitrogen for one hour.

Note that in the samples each including the tungsten layer as the conductive layer, the IGZO layer was formed over a glass substrate. The IGZO layer was formed by a sputtering method under conditions where the flow rates of oxygen and argon were 20 sccm and 180 sccm, respectively, the pressure was 0.6 Pa, the power (AC) was 5 kW, and the substrate temperature was 100° C. The thickness of the IGZO layer is 100 nm. Then, a 100-nm-thick conductive layer including tungsten was formed thereover as the conductive layer. The two samples were prepared, one of which was not subjected to heat treatment and the other of which was subjected to heat treatment at 350° C. in a mixed atmosphere of oxygen and nitrogen for one hour. Further, in the above samples, titanium was used instead of tungsten to obtain the samples each including the titanium layer as the conductive layer.

The samples manufactured in the above manners were each subjected to SIMS from the rear side of the glass substrate to examine the degree of diffusion of tungsten or titanium included in the conductive layer to the IGZO layer. SIMS results of the samples are shown in FIG. 37.

Figure 37:
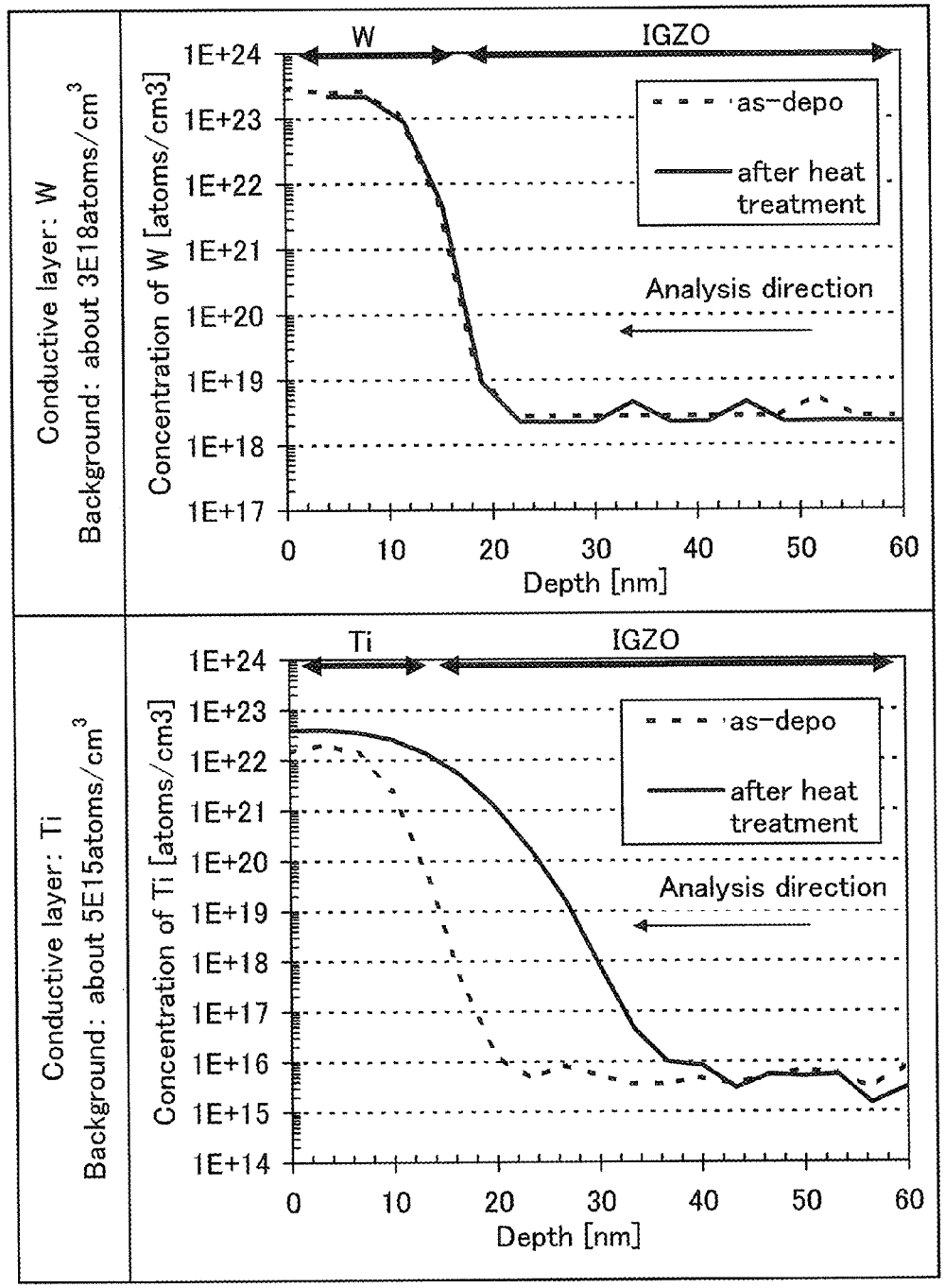
FIG. 37 shows SIMS results.

In FIG. 37, the top graph shows analysis results in the case where a tungsten layer was used as each of the conductive layers, and the bottom graph shows analysis results in the case where a titanium layer was used as each of the conductive layers. In the samples used for both analyses of FIG. 37, the IGZO layer was formed at 170° C. The depth represented by the horizontal axis indicates depths of the IGZO layer, and the tungsten layer or the titanium layer when the top surface has a depth length of 0 nm. The vertical axis represents the concentration of tungsten or titanium in the film (unit: atoms/cm$^3$). Note that the concentration of such metal is quantified by the concentration in the IGZO film.

In the case where the tungsten layer was used as each of the conductive layers, the dotted line representing the concentration profile of tungsten of the sample that is not subjected to the heat treatment and the solid line representing the concentration profile of tungsten of the other sample after the heat treatment were almost overlapped with each other. Thus, the above result shows that tungsten is hardly diffused to the IGZO layer even when heat treatment is performed at 350° C.

On the other hand, in the case where the titanium layer was used as each of the conductive layers, the solid line representing the concentration profile of titanium of the other sample after the heat treatment largely moved toward the IGZO film from the dotted line representing the concentration profile of titanium of the sample that is not subjected to the heat treatment. Thus, the above result shows that a mixed region or a compound region of titanium and IGZO was formed at the boundary between the titanium layer and the IGZO layer. Accordingly, it can be said that titanium is diffused in the IGZO layer by heat treatment performed at 350° C.

Note that in the samples in each of which the titanium layer was formed over the IGZO layer, titanium was diffused to a deeper region of the IGZO layer formed at 100° C. than the IGZO layer formed at 170° C., after the heat treatment performed at 350° C. This is because an IGZO layer becomes a sparse film when the film formation temperature of the IGZO layer is low; accordingly, titanium is likely to be diffused.

Thus, the above result shows that in the case where a titanium layer is used as each of the conductive layers, titanium is diffused to the oxide semiconductor layer by heat treatment and therefore an n$^+$ region is formed in a region of the oxide semiconductor layer to which titanium is diffused.

Example 4

In this example, evaluation results of diffusion of oxygen in a stacked-layer structure of an oxide semiconductor layer and a conductive layer will be described with reference to FIGS. 38 and 39.

In each measurement sample, a 100-nm-thick IGZO (111) layer or IGZO (132) layer was formed over a glass substrate by a sputtering method, and a 100-nm-thick conductive layer including a tungsten layer or a titanium layer was formed thereover by a sputtering method. The IGZO (111)

layer was formed under conditions where the flow rates of argon and oxygen were each 100 sccm, the pressure was 0.6 Pa, the power (AC) was 5 kW, and the substrate temperature was 170° C. The IGZO (132) layer was formed under conditions where the flow rates of argon and oxygen were each 135 sccm and 15 sccm, respectively, the pressure was 0.3 Pa, the power (AC) was 5 kW, and the substrate temperature was 100° C. Here, as oxygen described above, oxygen ($^{18}$O) which is an isotope of oxygen was used to monitor the behavior.

The tungsten layer was formed under conditions where the flow rate of argon was 100 sccm, the pressure was 2.0 Pa, the power (DC) was 60 kW, and the substrate temperature was 100° C.; and the titanium layer was formed under conditions where the flow rate of argon was 100 sccm, the pressure was 0.3 Pa, the power (DC) was 58 kW, and the substrate temperature was 100° C.

In the samples manufactured in the above manner, some samples not subjected to heat treatment and the other samples subjected to heat treatment were prepared. After the formation of the conductive layer, the heat treatment was performed at 350° C. in a mixed atmosphere of nitrogen and oxygen for one hour. The profile of oxygen ($^{18}$O) in the conductive layer of each sample was measured by SIMS.

Figure 38:
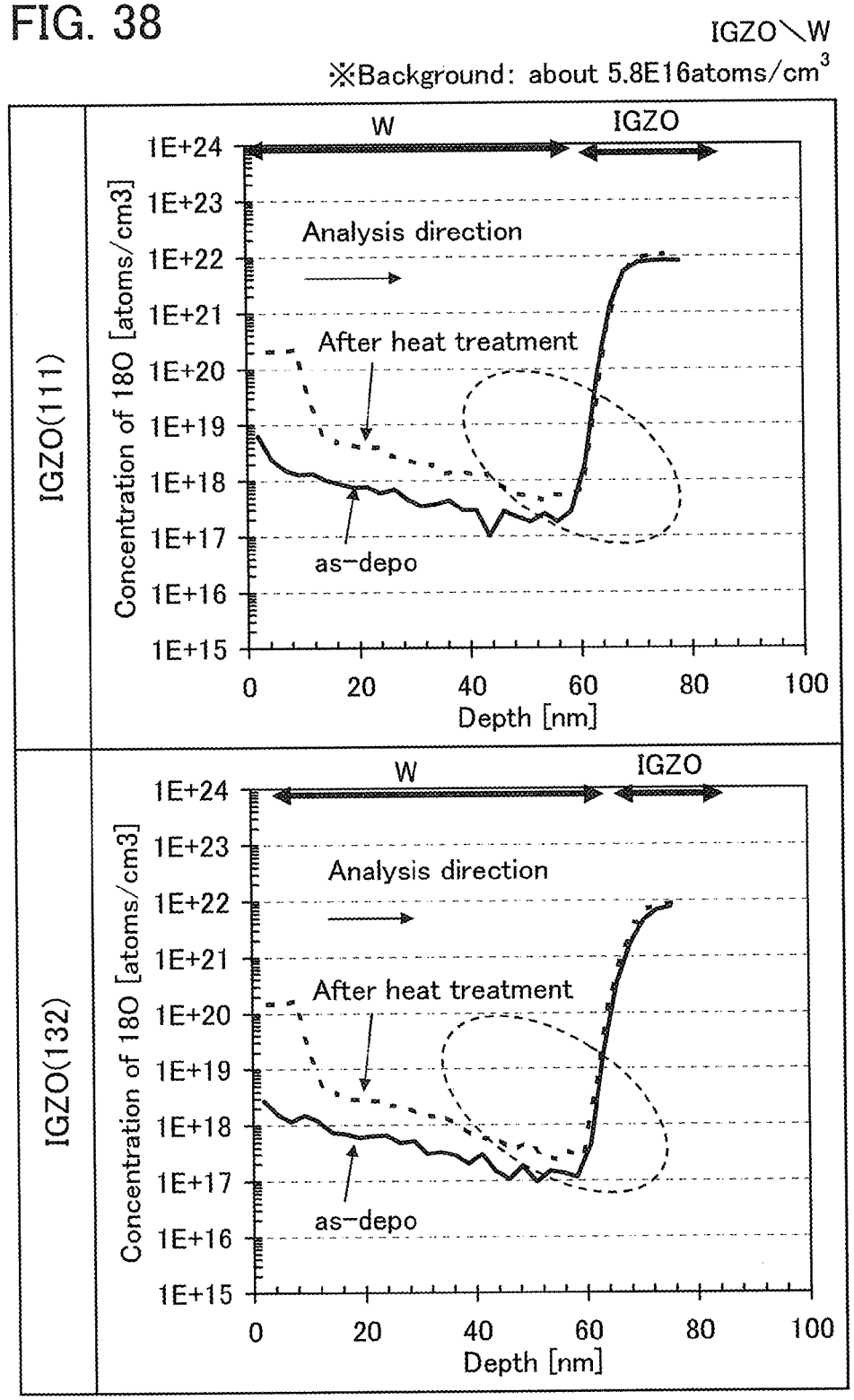
FIG. 38 shows evaluation results of oxygen diffusion.

First, FIG. 38 shows the SIMS measurement results of the samples in each of which the tungsten layer was formed as the conductive layer over the oxide semiconductor layer. In FIG. 38, the top graph shows the SIMS results in the case where the IGZO (111) layer was used as the oxide semiconductor layer, and the bottom graph shows the SIMS results in the case where the IGZO (132) layer was used as the oxide semiconductor layer.

The horizontal axis represents the depth direction (unit: nm) of a stacked film of the oxide semiconductor layer and the conductive layer, and the vertical axis represents the concentration of oxygen ($^{18}$O) (unit: atoms/cm$^3$). In the figure, the profile represented by the solid line is the profile of the sample not subjected to heat treatment after the formation of the conductive layer, and the profile represented by the dotted line is the profile of the sample subjected to the heat treatment after the formation of the conductive layer. Note that the portion surrounded with the dashed line represents the profile of oxygen derived from the outside air.

In the case where the tungsten layer was used as each of the conductive layers, as shown in FIG. 38, there was no tendency of diffusion of oxygen from the IGZO layer to the tungsten layer even in the case where the heat treatment was performed at 350° C., as well as the case where heat treatment was not performed. A similar result was obtained in the case where the oxide semiconductor layer was either the IGZO (111) layer or the IGZO (132) layer.

Figure 39:
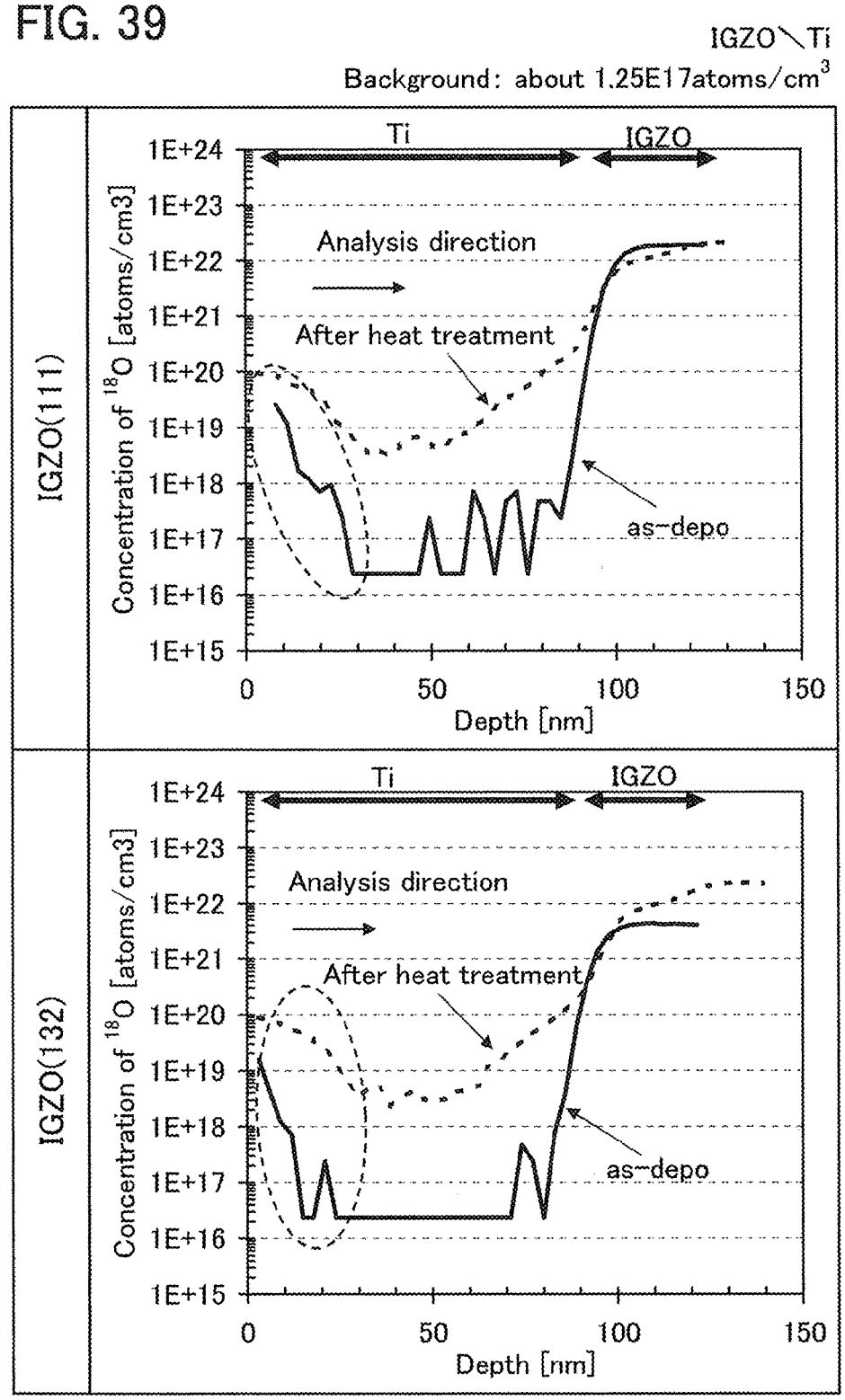
FIG. 39 shows evaluation results of oxygen diffusion.

On the other hand, in the case where the titanium layer was used as each of the conductive layers, as shown in FIG. 39, the oxygen concentration of the titanium layer was extremely increased in the case where the heat treatment was performed at 350° C., as compared to the case where heat treatment was not performed. Thus, the above result shows that oxygen ($^{18}$O) was largely diffused from the IGZO layer to the titanium layer by performing the heat treatment at 350° C.

Example 5

Figure 40A:
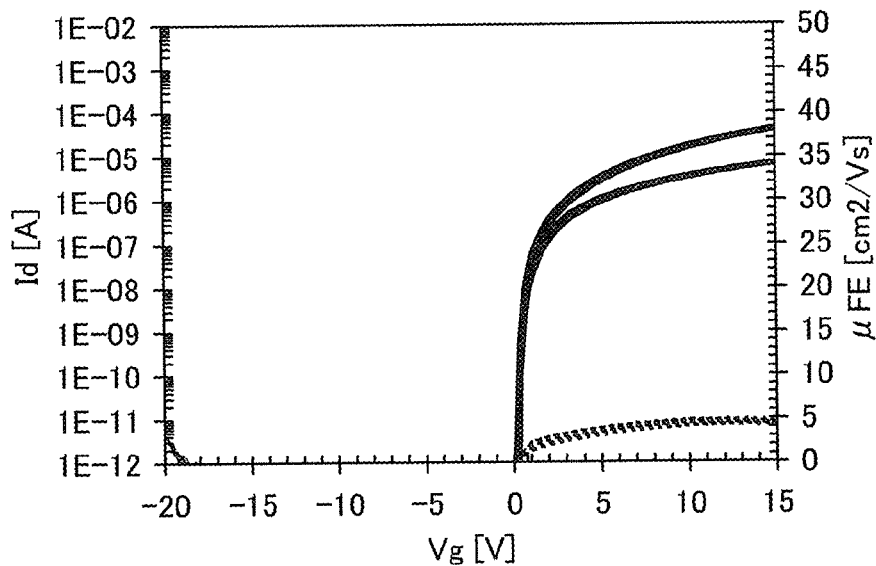
FIGS. 40A and 40B are graphs showing characteristics of transistors which are manufactured.
Figure 40B:
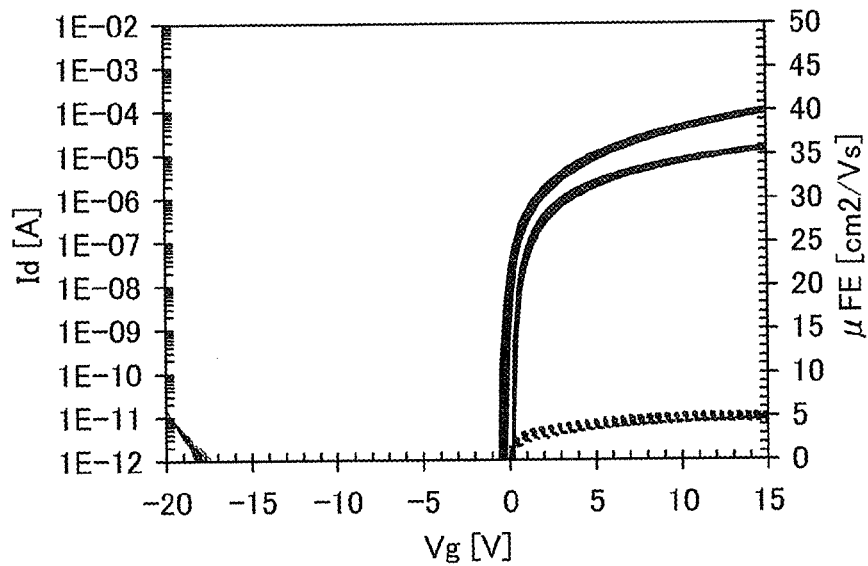

In this example, the measurement results of characteristics of a manufactured transistor will be described with reference to FIGS. 40A and 40B.

In order to evaluate characteristics, a transistor having a channel-etched and bottom-gate top-contact (BGTC) structure and a peripheral structure were manufactured by the following steps.

That is, a 200-nm-thick gate electrode was formed over a glass substrate by a sputtering method, and a gate insulating film was formed thereover by a plasma CVD method. The gate insulating film had a four-layer structure in which a silicon nitride layer, a silicon nitride layer, a silicon nitride layer, and a silicon oxynitride layer were provided in this order. The thicknesses were 50 nm, 300 nm, 50 nm, and 50 nm in this order. For the three silicon nitride layers from the bottom, the flow rate of NH$_3$ of the first silicon nitride layer was made low, the flow rate of NH$_3$ of the second silicon nitride layer was made high, and the flow rate of SiH$_4$ of the third silicon nitride layer was made high. That is, the flow rates of SiH$_4$, N$_2$, and NH$_3$ of the first silicon nitride layer were set to 200 sccm, 2000 sccm, and 100 sccm, respectively; the flow rates of SiH$_4$, N$_2$, and NH$_3$ of the second silicon nitride layer were set to 200 sccm, 2000 sccm, and 2000 sccm, respectively; the flow rates of SiH$_4$ and N$_2$ of the third silicon nitride layer were set to 200 sccm and 5000 sccm, respectively; and the pressure, the power, and the substrate temperature of each layer were set to 100 Pa, 2000 W, and 350° C., respectively.

Next, a 35-nm-thick oxide semiconductor layer was formed over the gate insulating film by a sputtering method with a target containing In, Ga, and Zn in an atomic ratio of 1:1:1, and a 20-nm-thick oxide layer was formed thereover by a sputtering method with a target containing In, Ga, and Zn in an atomic ratio of 1:3:2. The oxide semiconductor layer was formed under conditions where the pressure was 0.6 Pa, the power was 5 kW, the flow rates of argon and oxygen were each 100 sccm, and the substrate temperature was 170° C.; and the oxide layer was formed under conditions where the pressure was 0.6 Pa, the power was 5 kW, the flow rates of argon and oxygen were 135 sccm and 15 sccm, respectively, and the substrate temperature was 170° C. These films were formed successively. After that, dehydration and dehydrogenation of a stacked-layer oxide film was performed by heat treatment performed at 450° C. in a nitrogen atmosphere for one hour and further oxygen was supplied to the stacked-layer oxide film by heat treatment performed at 450° C. in a mixed atmosphere of nitrogen and oxygen for one hour.

Next, in order to form a source electrode and a drain electrode, a titanium layer, an aluminum layer, and a titanium layer were formed in this order by a sputtering method and then the stack of the titanium layer, the aluminum layer, and the titanium layer was processed into a predetermined shape by a dry etching method. After that, cleaning with a solution in which phosphoric acid whose concentration was 85 wt. % was diluted to 1/100 was performed to remove the etching residue.

Then, two silicon oxynitride layers (50 nm and 400 nm) were stacked as an oxide insulating film over the source electrode and the drain electrode, and a 100-nm-thick silicon nitride layer was formed thereover. The lower layer of the oxide insulating film was formed under conditions where the flow rates of SiH$_4$ and N$_2$O were 30 sccm and 4000 sccm, respectively, the power was 150 W, the pressure was 200 Pa, and the substrate temperature was 220° C.; and the upper layer of the oxide insulating film was formed under conditions where the flow rates of SiH$_4$ and N$_2$O were 200 sccm and 4000 sccm, respectively, the power was 1500 W, the pressure was 200 Pa, and the substrate temperature was 220° C. After the formation of the stack of the two silicon oxynitride layers, heat treatment was performed at 350° C. in a mixed atmosphere of nitrogen and oxygen for one hour and then the silicon nitride layer was formed. The silicon nitride layer was formed under conditions where the flow rates of SiH$_4$ and N$_2$O were 50 sccm and 5000 sccm, respectively, the power was 150 W, the pressure was 200 Pa, and the substrate temperature was 220° C.

Next, a 1.5-μm-thick acrylic film was formed as a planarization film over the silicon nitride layer and baked at 250° C. in a nitrogen atmosphere for one hour. Further, a 100-nm-thick transparent conductive film was formed as a pixel electrode, and heat treatment was performed at 250° C. in a nitrogen atmosphere for one hour as final heat treatment.

In the above manner, the transistor was manufactured. A sample including the transistors is referred to as a sample 1. Note that the sample 1 includes 20 transistors. FIGS. 40A and 40B show characteristics of the transistors included in the sample 1. Here, FIG. 40A shows the characteristics of the transistor with a channel length (L) and a channel width (W) of 6 μm and 50 μm, respectively; and FIG. 40B shows the characteristics of the transistor with a channel length (L) and a channel width (W) of 3 μm and 50 μm, respectively. The transistor characteristics in the case where drain voltages (V$_d$) are 1 V and 10 V are shown here. The horizontal axis represents a gate voltage (V$_g$) (unit: V), and the vertical axis (on the left) represents a drain current (unit: A) and the vertical axis (on the right) represents a field-effect mobility (unit: cm$^2$/V$_s$) of the transistors when the drain voltage (V$_d$) is 10 V. The results of the transistor characteristics show that favorable transistor characteristics can be obtained even in the case of a minute structure with a channel length of 3 μm.

Figure 41A:
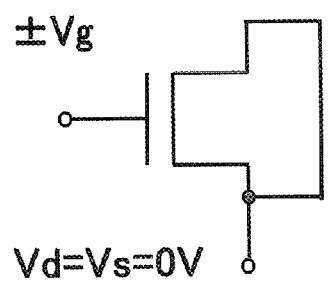
FIGS. 41A and 41B show results of a gate BT test.

Next, the results of a gate bias temperature (BT) test carried out on the transistors manufactured in the above manner are described with reference to FIGS. 41A and 41B.

The gate BT test is one kind of accelerated test and can evaluate, in a short time, a change in characteristics (i.e., a change with time) of a transistor which is caused by long-term use. The amount of change in characteristics of the transistor due to the gate BT test is an important indicator when examining the reliability of the transistor.

A specific method of the gate BT test is described. First, V$_g$-I$_d$ characteristics of a transistor are measured. Next, the temperature of a substrate over which the transistor is formed (substrate temperature) is set to a fixed temperature, a pair of electrodes serving as a source and a drain of the transistor are set to a same potential, and a potential different from that of the pair of electrodes serving as a source and a drain is applied to a gate electrode for a certain period (see FIG. 41A). The substrate temperature may be determined as appropriate in accordance with the test purpose, and here is set to 125° C. Then, the substrate temperature is set to a temperature similar to that at which the electrical characteristics have been measured, and the electrical characteristics of the transistor are measured again. As a result, a difference in threshold voltage (V$_{th}$) and a difference in shift value (Shift) between before and after the gate BT test can be obtained as the amount of change in the electrical characteristics.

Here, in this specification, the threshold voltage (V$_{th}$) is a gate voltage when a channel is formed. In a curve where the horizontal axis represents the gate voltage (V$_g$) and the vertical axis represents the square root of drain current (I$_d$) (V$_g$-√I$_d$ characteristics), the threshold voltage (V$_{th}$) was calculated as a gate voltage (V$_g$) at a point of intersection of an extrapolated tangent line having the highest inclination with the square root of drain current I$_d$ with 0 (i.e., I$_d$ of 0 A). Further, in a curve where the horizontal axis represents the gate voltage (V$_g$) and the vertical axis represents the logarithm of drain current (I$_d$), the shift value is defined as a gate voltage (V$_g$) at a point of intersection of an extrapolated tangent line of a drain voltage I$_d$ having the highest inclination with a straight line of I$_d$=1×10$^{-12}$ [A]. Note that the shift value was calculated with a drain voltage (V$_d$) of 10 V.

As specific stress conditions, the gate voltage (V$_g$) was set to +30 V and −30 V and potentials of the source and the drain were set the same (here, V$_d$=V$_s$=0 V). The stress temperature was set to 125° C. and the time period of stress application was set to one hour. Further, for the light irradiation, a white LED light was used and an illuminance of the light was set to about 10000 lx.

Figure 41B:
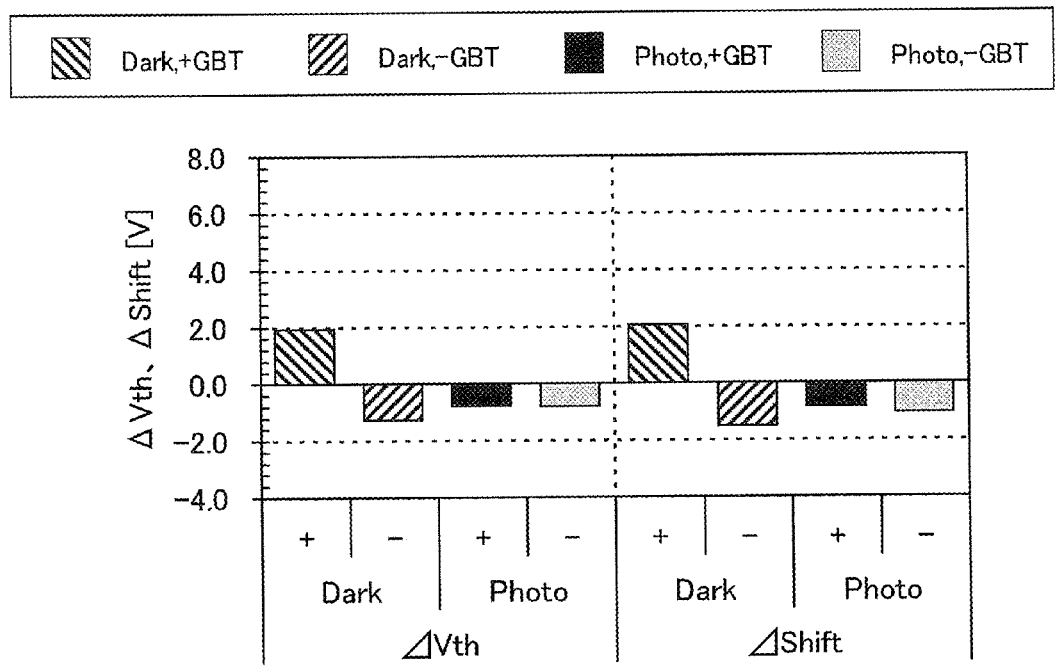

FIG. 41B shows results of the gate BT test obtained in this manner. In the environment without light irradiation (Dark), the amount of change in the threshold voltage (ΔV$_{th}$) was 1.93 V in the case of the positive gate BT (+GBT) and −1.27 V in the case of the negative gate BT (−GBT). In the environment with light irradiation (Photo), the amount of change in the threshold voltage (ΔV$_{th}$) was −0.78 V in the case of the positive gate BT (+GBT) and −0.80 V in the case of the negative gate BT (−GBT).

In the environment without light irradiation, the amount of change in the shift value (ΔShift) was 2.04 V in the case of the positive gate BT (+GBT) and −1.51 V in the case of the negative gate BT (−GBT). In the environment with light irradiation, the amount of change in the shift value (ΔShift) was −0.85 V in the case of the positive gate BT (+GBT) and −1.05 V in the case of the negative gate BT (−GBT).

The above gate BT test results show that the amounts of change in the threshold voltage and the shift value were small and therefore the transistor manufactured by the above steps had excellent reliability.

Figure 42:
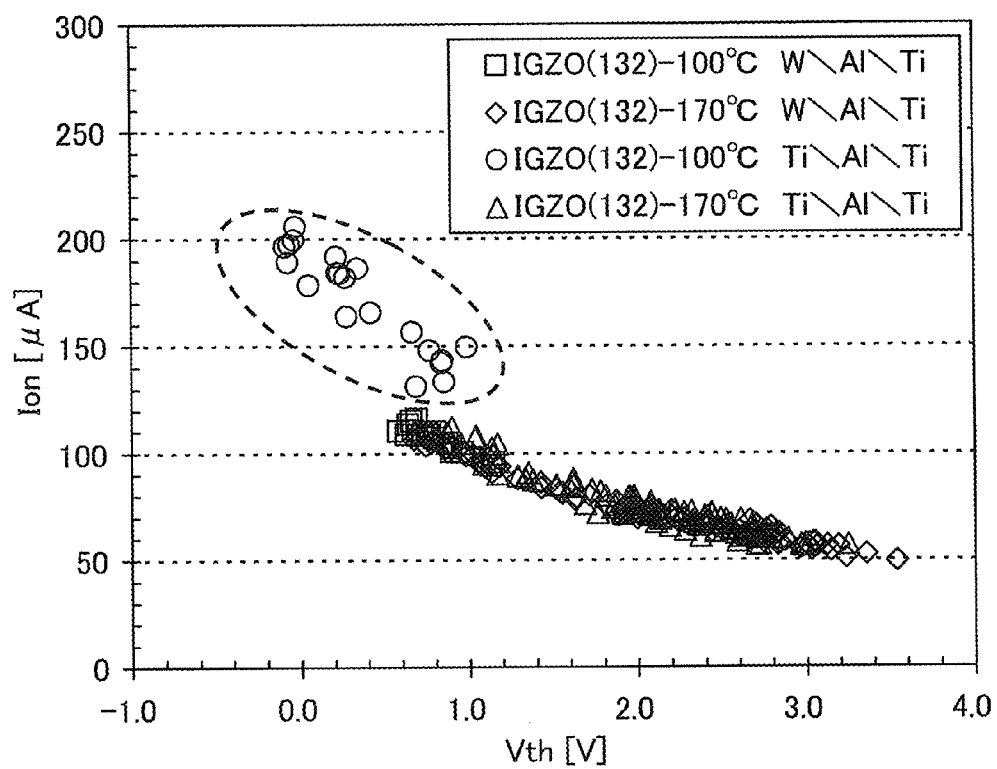
FIG. 42 is a graph showing a correlation between on-state current and threshold voltage.

Here, FIG. 42 shows a graph of transistor characteristics which plotted a correlation between an on-state current (I$_{on}$) and a threshold voltage (V$_{th}$).

A stacked-layer oxide semiconductor film used for the transistor had a stacked-layer structure of an IGZO (111) layer and an IGZO (132) layer, and measurement was performed on the IGZO (132) layer in the case where the substrate temperatures were 100° C. and 170° C. In each sample, as a conductive layer for forming the source electrode and the drain electrode, a conductive layer having a three-layer structure in which a tungsten layer, an aluminum layer, and a titanium layer were provided in this order (expressed as W\Al\Ti) and a conductive layer having a three-layer structure in which a titanium layer, an aluminum layer, and a titanium layer were provided in this order (expressed as Ti\Al\Ti) were prepared.

As shown in FIG. 42, there is a negative correlation between an on-state current (I$_{on}$) and a threshold voltage (V$_{th}$) in all of the plots. Here, only the sample in which the IGZO (132) layer was formed at a substrate temperature of 100° C. and the source electrode and the drain electrode had a three-layer structure in which a titanium layer, an aluminum layer, and a titanium layer were provided in this order showed unique distribution (a portion surrounded with the dashed line in FIG. 42). In the case of such conditions, an n-type layer is deeply formed in the IGZO layer because heat treatment is performed after the formation of the titanium layer, and this implies that the effective channel length of the transistor is shortened.

Example 6

Thus, in this example, transmission line method (TLM) analysis was performed on the above transistors.

Here, the TLM analysis is an analysis method for estimating an effective channel length ($L_{eff}$) and external resistance with an intersection coordinate obtained in such a manner that characteristics of a transistor in relation between resistance (R) and a channel length (L) are obtained for each gate voltage ($V_g$).

Figure 43A:
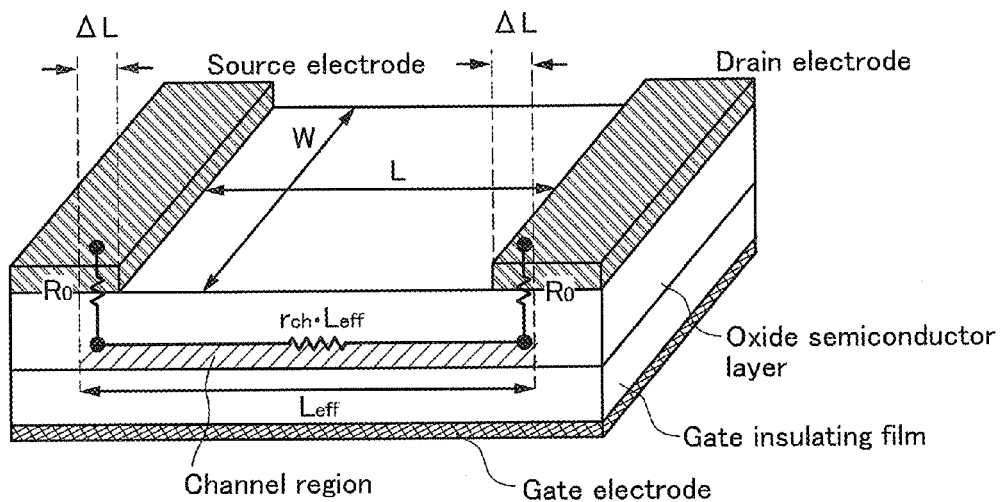
FIGS. 43A and 43B illustrate TLM analysis.

In the case of a model shown in FIG. 43A, series resistance between a source electrode and a drain electrode can be expressed by the following Formula 2 and Formula 3.

$$R_T = V_{ds}/I_d = 2R_0 + r_{ch} \cdot L_{eff}$$ (Formula 2)

$$L_{eff} = L + 2\Delta L$$ (Formula 3)

Here, $R_T$ denotes total resistance, $R_0$ denotes external resistance, $L_{eff}$ denotes an effective channel length, L denotes a designed channel length, and $\Delta L$ denotes a difference between the designed channel length and the effective channel length. Further, $r_{ch}$ is a value obtained by dividing the channel resistance by a unit length and depends on a gate voltage ($V_g$).

Figure 43B:
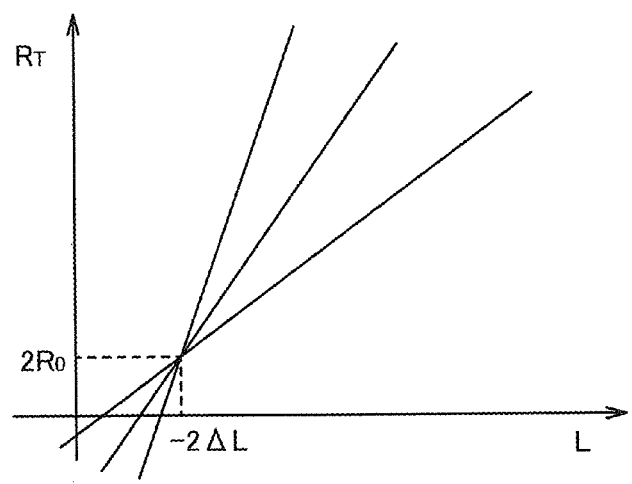

Through the TLM analysis, an intersection coordinate is obtained as shown in FIG. 43B in such a manner that characteristics of a transistor in relation between resistance (R) and a channel length (L) are obtained for each gate voltage ($V_g$) as described above. The intersection coordinate corresponds to an external resistance ($2R_0$) and a difference between the designed channel length and an effective channel length ($2\Delta L$).

Accordingly, with the use of characteristics of transistors which are measured by changing conditions for the IGZO (132) layer of the upper layer of the stacked-layer oxide film and the source electrode and the drain electrode, $2\Delta L$ and $2R_0$ of each transistor were calculated and the effective channel length and series resistance of each transistor were evaluated. The evaluation results are shown in FIGS. 44A and 44B and FIGS. 45A and 45B.

Figure 44A:
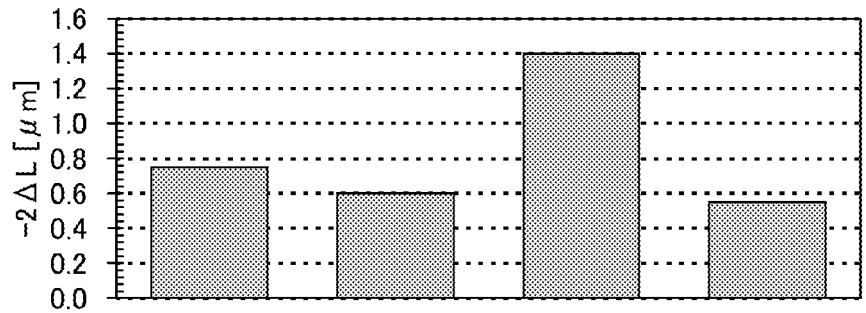
FIGS. 44A and 44B show results of TLM analysis.
Figure 44B:
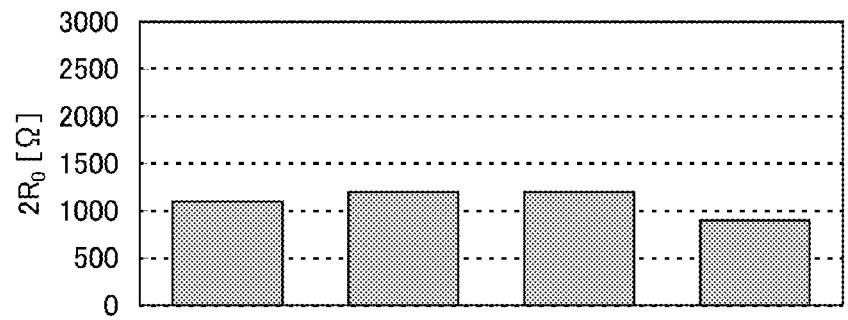

FIGS. 44A and 44B show the results of evaluation by TLM analysis performed under the conditions where the substrate temperatures at film formation of the IGZO (132) layer varied between 100° C. and 170° C.

FIG. 44A shows a difference between a designed channel length and an effective channel length ($-2\Delta L$) in each film quality of the IGZO (132) layer and each pair of a source electrode and a drain electrode. FIG. 44B shows external resistance ($2R_0$) in each film quality of the IGZO (132) layer and each pair of a source electrode and a drain electrode.

According to the TLM analysis results shown in FIG. 44A, $2\Delta L$ was the highest in the sample in which the IGZO (132) layer was formed at a substrate temperature of 100° C. and the source electrode and the drain electrode had a three-layer structure in which a titanium layer, an aluminum layer, and a titanium layer were provided in this order. This indicates that the effective channel length ($L_{eff}$) is shortened. In the case where the IGZO (132) layer was formed at a substrate temperature of 170° C., similar results of the effective channel length ($L_{eff}$) were obtained in the sample in which the source electrode and the drain electrode had a three-layer structure in which a tungsten layer, an aluminum layer, and a titanium layer were provided in this order and the sample in which the source electrode and the drain electrode had a three-layer structure in which a titanium layer, an aluminum layer, and a titanium layer were provided in this order.

Figure 45A:
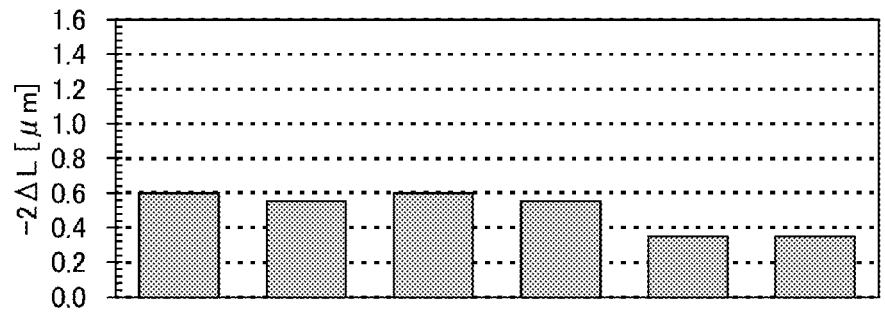
FIGS. 45A and 45B show results of TLM analysis.
Figure 45B:
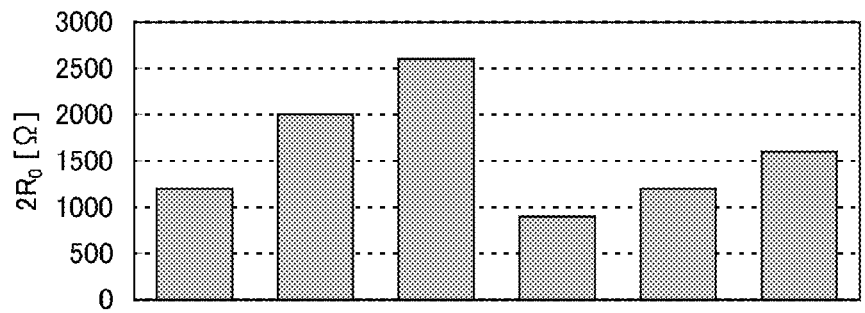

FIGS. 45A and 45B show the results of evaluation by TLM analysis under the conditions where the proportion of the oxygen flow rate (the proportion of oxygen in the total film formation gas) at the formation of the IGZO (132) layer varied from 10 wt. % to 30 wt. % and 50 wt. %.

FIG. 45A shows a difference between a designed channel length and an effective channel length ($-2\Delta L$) in each film quality of the IGZO (132) layer and each pair of a source electrode and a drain electrode. FIG. 45B shows external resistance ($2R_0$) in each film quality of the IGZO (132) layer and each pair of a source electrode and a drain electrode.

According to the TLM analysis results shown in FIG. 45A, the effective channel length ($L_{eff}$) of the sample in which the source electrode and the drain electrode had a three-layer structure in which a tungsten layer, an aluminum layer, and a titanium layer were provided in this order was not largely different from that of the sample in which the source electrode and the drain electrode had a three-layer structure in which a titanium layer, an aluminum layer, and a titanium layer were provided in this order. Further, according to the TLM analysis results shown in FIG. 45B, the external resistance tended to rise when the proportion of the oxygen flow rate was increased, and an increase in the external resistance of the sample in which the source electrode and the drain electrode had a three-layer structure in which a titanium layer, an aluminum layer, and a titanium layer were provided in this order was able to be suppressed compared to an increase in the external resistance of the sample in which the source electrode and the drain electrode had a three-layer structure in which a tungsten layer, an aluminum layer, and a titanium layer were provided in this order. This can be considered that the use of a titanium layer as the conductive layer over the stacked-layer oxide film has an effect on the stacked-layer oxide film to be changed to an n-type.

Example 7

In this example, description is made on the fact that, as the stacked-layer oxide film, the use of a CAAC-OS layer is more suitable than an amorphous (or nanocrystalline) oxide semiconductor in the case where a channel-etched transistor with a short channel length is manufactured.

FIGS. 46A and 46B and FIGS. 47A and 47B each show $V_g$-$I_d$ characteristics of transistors with channel widths (W) of 50 μm and channel lengths (L) of 2 μm or 6 μm which were manufactured using IGZO which is a CAAC-OS layer or amorphous (or nanocrystalline) IGZO. The characteristics of 20 points in a substrate sized 600 mm×720 mm were measured.

Figure 46A:
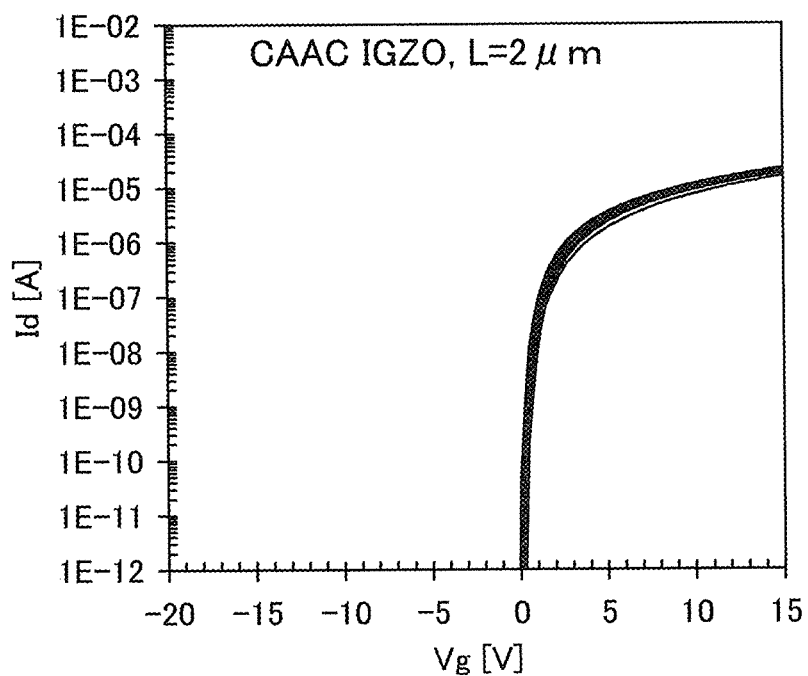
FIGS. 46A and 46B are graphs each showing characteristics of transistors including an oxide semiconductor having a CAAC structure.
Figure 46B:
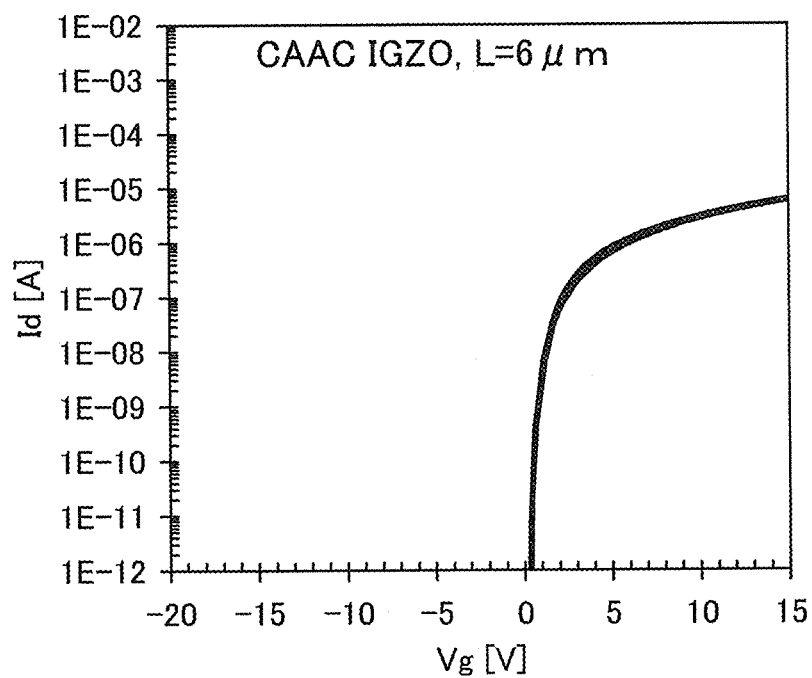

As shown in FIGS. 46A and 46B, the use of IGZO which is a CAAC-OS layer enabled uniform characteristics to be obtained even in the transistors with channel lengths of 2 μm. Thus, it was possible to manufacture a miniaturized transistor with the use of an oxide semiconductor having a CAAC structure.

Figure 47A:
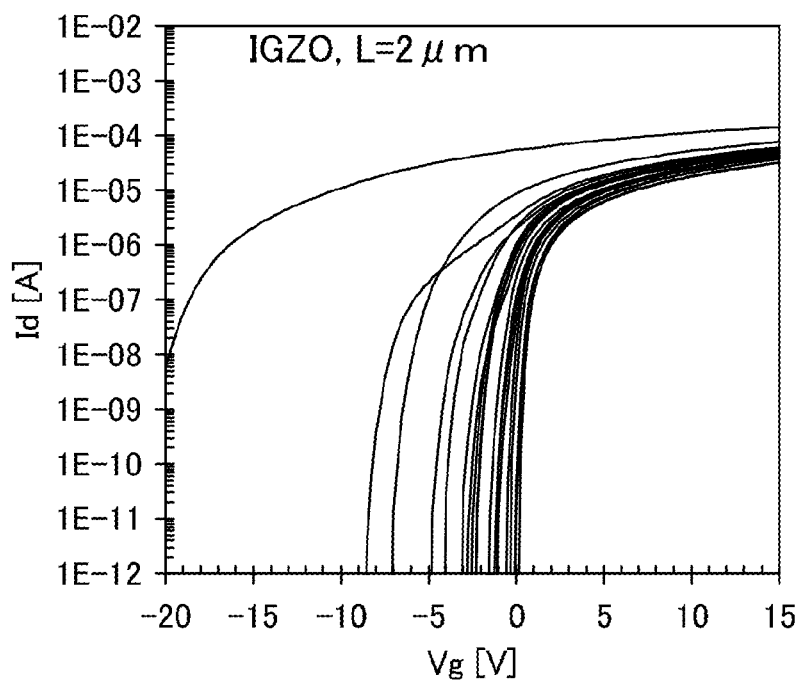
FIGS. 47A and 47B are graphs showing characteristics of transistors including an amorphous oxide semiconductor.
Figure 47B:
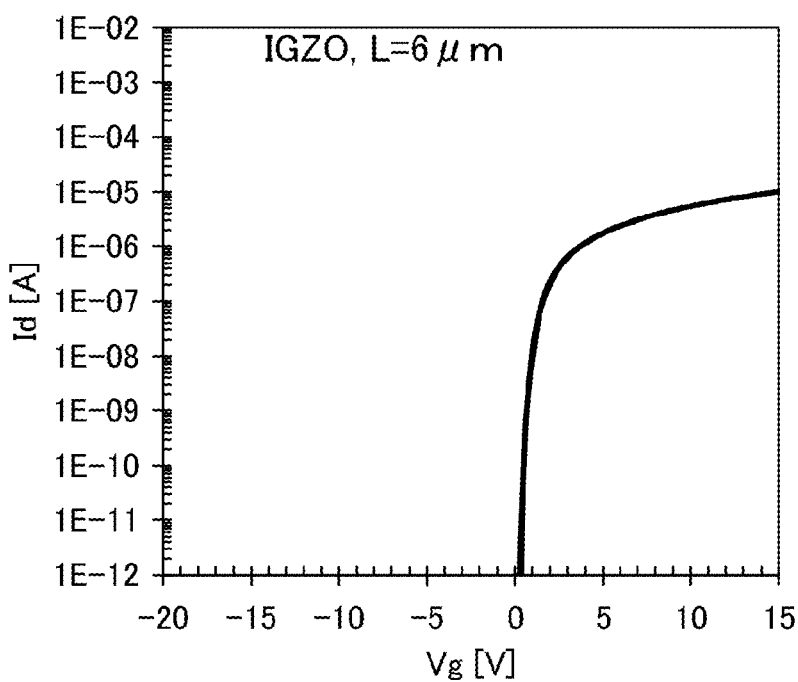

On the other hand, as shown in FIGS. 47A and 47B, in the transistors with channel lengths of 2 μm which include amorphous IGZO, the characteristics largely vary.

Accordingly, a channel-etched transistor can be manufactured more stably with the use of an oxide semiconductor having a CAAC structure than with an amorphous (or nanocrystalline) oxide semiconductor. This is probably because the oxide semiconductor having a CAAC structure is qualitatively sturdy in terms of structure than the amorphous (or nanocrystalline) oxide semiconductor, which enables more stable transistor to be manufactured.

In order to evaluate sturdiness of a film of IGZO having an amorphous structure and a film of IGZO having a crystal structure, cohesive energies of the amorphous structure and the crystal structure were calculated. A cohesive energy is defined by the following Formula 4.

$$E^{coh}(IGZO):=E(In)+E(Ga)+E(Zn)+4E(O)-E(IGZO) \quad \text{(Formula 4)}$$

Figure 48:
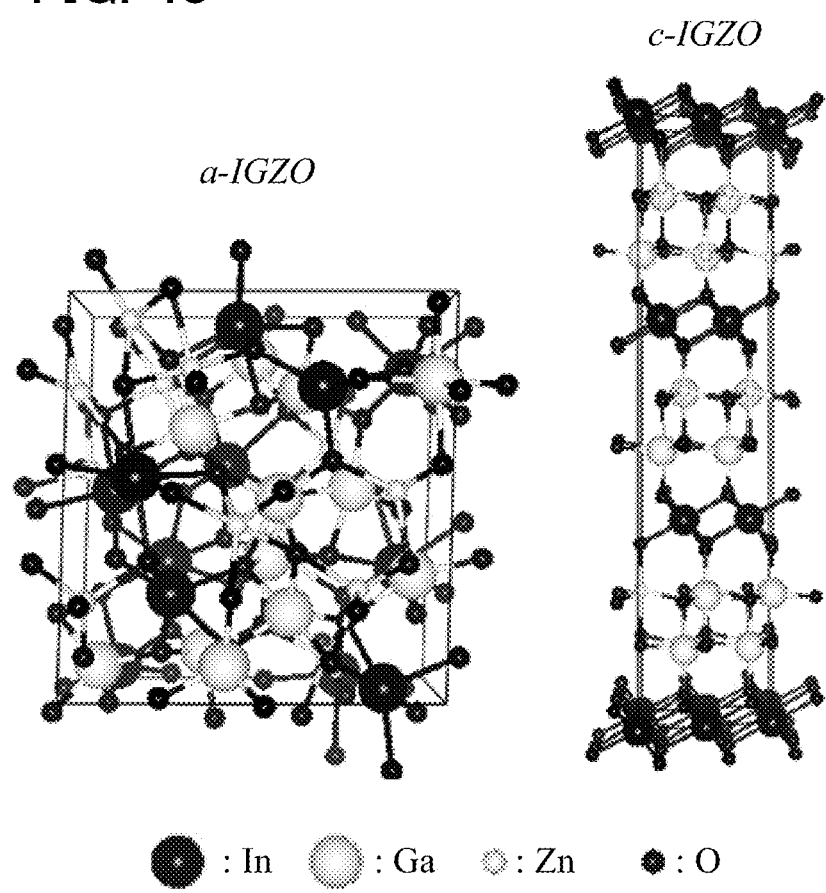
FIG. 48 shows an amorphous structure and a crystal structure obtained by calculation.

That is, the cohesive energy is energy which is emitted when a solid is formed from the state of an isolated atom. FIG. 48 shows the structures of the amorphous IGZO and the crystalline IGZO which were obtained by calculations. In each structure, the atomic ratio of In to Ga, Zn, and O are 1:1:1:4; the total number of atoms are 84; and the density of the amorphous IGZO is 5.9 g/cm$^3$, whereas the density of the crystalline IGZO is 6.1 g/cm$^3$. The density of the amorphous IGZO is lower. Note that for the calculations, first principle electronic state calculation package Vienna Ab Simulation Package (VASP) was used. Table 1 shows the calculation conditions.

TABLE 1

| Functional | GGA PBE |
|---|---|
| Cut-off energy | 800 eV |
| The number of sampling k-points | a-IGZO 2 × 2 × 2 c-IGZO 4 × 4 × 1 |

A difference between the cohesive energy of the amorphous IGZO and the cohesive energy of the crystalline IGZO which were obtained from the calculations are shown in Table 2.

TABLE 2

| Cohesive energy (eV) | a-IGZO | 28.854 |
|---|---|---|
| | c-IGZO | 30.007 |
| Cohesive energy difference (eV) | | −1.153 |

As shown in Table 2, there was a significant difference between the cohesive energy of the amorphous IGZO (28.854 eV) and the cohesive energy of the crystalline IGZO (30.007 eV) (the difference was 28.854 eV-30.007 eV=−1.153 eV). This result implies that the amorphous IGZO is more reactive.

Next, in order to understand why such a difference between the amorphous IGZO and the crystalline IGZO arises, the average bonding distance between each metal and oxygen was examined. Results are shown in Table 3. Note that the average bonding distance in the amorphous IGZO was calculated assuming that In is a hexacoordinate atom and Ga and Zn are pentacoordinate atoms.

TABLE 3

| Structure | Element | Average bonding distance (nm) |
|---|---|---|
| a-IGZO | In—O | 0.226 |
| | Ga—O | 0.2 |
| | Zn—O | 0.218 |
| c-IGZO | In—O | 0.221 |
| | Ga—O | 0.197 |
| | Zn—O | 0.208 |

According to Table 3, the average bonding distance between each metal and oxygen in the amorphous IGZO (the distances of In—O, Ga—O, and Zn—O were 0.226 nm, 0.2 nm, and 0.218 nm, respectively) was longer than the average bonding distance between each metal and oxygen in the crystalline IGZO (the distances of In—O, Ga—O, and Zn—O were 0.221 nm, 0.197 nm, and 0.208 nm, respectively). Thus, the difference in the cohesive energy shown in Table 2 can be considered mainly due to this average bonding distance.

Accordingly, it can be considered that a channel-etched transistor including an oxide semiconductor having a CAAC structure can be manufactured stably because the oxide semiconductor having a CAAC structure forms a crystalline film and its structure is sturdy. Since the crystalline IGZO has a large cohesive energy and a strong bonding force, the oxide semiconductor having a CAAC structure is suitable for the channel-etched transistor in which the oxide semiconductor having a CAAC structure on the back channel side is exposed to plasma or the like during etching.

This application is based on Japanese Patent Application serial No. 2012-263814 filed with the Japan Patent Office on Nov. 30, 2012, Japanese Patent Application serial No. 2012-273866 filed with the Japan Patent Office on Dec. 14, 2012, and Japanese Patent Application serial No. 2013-044876 filed with the Japan Patent Office on Mar. 7, 2013, the entire contents of which are hereby incorporated by reference.

What is claimed is:

1. A method for manufacturing a semiconductor device comprising the steps of:
   forming a gate insulating film over a gate electrode;
   forming an oxide semiconductor layer over the gate insulating film;
   forming an oxide layer over the oxide semiconductor layer to form a stacked-layer oxide film comprising the oxide semiconductor layer and the oxide layer;
   processing the stacked-layer oxide film into a predetermined shape;
   forming a conductive film including Ti over and in contact with the stacked-layer oxide film;
   etching the conductive film to form source and drain electrodes, and a depression portion in the oxide layer between the source and drain electrodes; and
   performing a heat treatment to form a region in the oxide layer having a lower resistivity than a channel formation region in the oxide semiconductor layer, the region being in contact with at least a part of the source and drain electrodes.

2. The method for manufacturing a semiconductor device according to claim 1,
   wherein each of the oxide semiconductor layer and the oxide layer is an oxide including In, M (one of Al, Ga, Y, La, Ce, and Nd), and Zn, and
   wherein the oxide layer has a proportion of M higher than the oxide semiconductor layer.

3. The method for manufacturing a semiconductor device according to claim 1,
   wherein the heat treatment is not performed between the step of processing the stacked-layer oxide film into the predetermined shape and the step of etching the conductive film.

4. The method for manufacturing a semiconductor device according to claim 1,
   wherein the region is formed in such a manner that oxygen in the oxide layer is extracted into the source and drain electrodes.

5. The method for manufacturing a semiconductor device according to claim 1, wherein the conductive film is a stack of a first conductive layer including Ti and a second conductive layer.

6. The method for manufacturing a semiconductor device according to claim 5, wherein the second conductive layer is any of a conductive layer including Cu or Al, and a stack of a conductive layer including Al and a conductive layer including Ti.

7. The method for manufacturing a semiconductor device according to claim 1, wherein a portion of the stacked-layer oxide film has higher resistivity as the portion is distanced from the source and drain electrodes in a film thickness direction, and the region has lowest resistivity.

8. The method for manufacturing a semiconductor device according to claim 1, further comprising the step of:
   forming an oxide insulating film over the stacked-layer oxide film, and the source, and drain electrodes,
   wherein the heat treatment is performed after the step of forming the oxide insulating film.

9. The method for manufacturing a semiconductor device according to claim 8,
   wherein the oxide insulating film includes a first film configured to permeate oxygen and a second film containing oxygen at a proportion higher than a proportion of oxygen in the stoichiometric composition over the first film, and
   wherein the oxygen is released from the second film and moves to the stacked-layer oxide film through the first film by the heat treatment.

10. The method for manufacturing a semiconductor device according to claim 1, wherein a depth of the depression portion is greater than that of the region in a film thickness direction.

11. A method for manufacturing a semiconductor device comprising the steps of:
    forming a gate insulating film over a gate electrode;
    forming an oxide semiconductor layer over the gate insulating film;
    forming an oxide layer over the oxide semiconductor layer;
    forming source and drain electrodes including Ti over and in contact with at least the oxide layer; and
    performing a heat treatment to form a region in the oxide layer having a lower resistivity than a channel formation region in the oxide semiconductor layer, the region being in contact with at least a part of the source and drain electrodes,
    wherein a depression portion is formed in the oxide layer by the step of forming the source and drain electrodes.

12. The method for manufacturing a semiconductor device according to claim 11,
    wherein each of the oxide semiconductor layer and the oxide layer is an oxide including In, M (one of Al, Ga, Y, La, Ce, and Nd), and Zn, and
    wherein the oxide layer has a proportion of M higher than the oxide semiconductor layer.

13. The method for manufacturing a semiconductor device according to claim 11, wherein the heat treatment is not performed between the step of forming the source and drain electrodes.

14. The method for manufacturing a semiconductor device according to claim 11, wherein the region is formed in such a manner that oxygen in the oxide layer is extracted into the source and drain electrodes.

15. The method for manufacturing a semiconductor device according to claim 11, wherein the source and drain electrodes are a stack of a first conductive layer including Ti and a second conductive layer.

16. The method for manufacturing a semiconductor device according to claim 15, wherein the second conductive layer is any of a conductive layer including Cu or Al, and a stack of a conductive layer including Al and a conductive layer including Ti.

17. The method for manufacturing a semiconductor device according to claim 11, wherein a portion of the oxide layer has higher resistivity as the portion is distanced from the source and drain electrodes in a film thickness direction, and the region has lowest resistivity.

18. The method for manufacturing a semiconductor device according to claim 11, further comprising the step of:
    forming an oxide insulating film over the oxide semiconductor layer, the oxide layer, and the source and drain electrodes,
    wherein the heat treatment is performed after the step of forming the oxide insulating film.

19. The method for manufacturing a semiconductor device according to claim 18,
    wherein the oxide insulating film includes a first film configured to permeate oxygen and a second film containing oxygen at a proportion higher than a proportion of oxygen in the stoichiometric composition over the first film, and
    wherein the oxygen is released from the second film and moves to the oxide layer through the first film by the heat treatment.

20. The method for manufacturing a semiconductor device according to claim 11, wherein a depth of the depression portion is greater than that of the region in a film thickness direction.

* * * * *